(12) United States Patent
Kimura

(10) Patent No.: US 11,233,132 B2
(45) Date of Patent: Jan. 25, 2022

(54) SEMICONDUCTOR DEVICE

(71) Applicant: Semiconductor Energy Laboratory Co., Ltd., Atsugi (JP)

(72) Inventor: Hajime Kimura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/822,350

(22) Filed: Mar. 18, 2020

(65) Prior Publication Data

US 2020/0219988 A1 Jul. 9, 2020

Related U.S. Application Data

(63) Continuation of application No. 12/711,667, filed on Feb. 24, 2010, now abandoned.

(30) Foreign Application Priority Data

Mar. 5, 2009 (JP) .............................. JP2009-051899

(51) Int. Cl.
*H01L 29/10* (2006.01)
*H01L 29/49* (2006.01)
(Continued)

(52) U.S. Cl.
CPC ........ *H01L 29/4908* (2013.01); *H01L 27/124* (2013.01); *H01L 27/1225* (2013.01);
(Continued)

(58) Field of Classification Search
CPC ......... H01L 21/02554; H01L 21/02565; H01L 27/1225; H01L 27/124; H01L 27/1288;
(Continued)

(56) References Cited

U.S. PATENT DOCUMENTS 5,162,901 A 11/1992 Shimada et al.
5,731,856 A 3/1998 Kim et al.
(Continued)

FOREIGN PATENT DOCUMENTS

CN 101165907 A 4/2008
EP 0810669 A 12/1997
(Continued)

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
(Continued)

*Primary Examiner* — Jay C Kim
(74) *Attorney, Agent, or Firm* — Robinson Intellectual Property Law Office; Eric J. Robinson

(57) ABSTRACT

A semiconductor device includes a semiconductor layer over a substrate; a gate insulating film covering the semiconductor layer; a gate wiring including a gate electrode, which is provided over the gate insulating film and is formed by stacking a first conductive layer and a second conductive layer; an insulating film covering the semiconductor layer and the gate wiring including the gate electrode; and a source wiring including a source electrode, which is provided over the insulating film, is electrically connected to the semiconductor layer, and is formed by stacking a third conductive layer and a fourth conductive layer. The gate electrode is formed using the first conductive layer. The gate wiring is formed using the first conductive layer and the second conductive layer. The source electrode is formed using the third conductive layer. The source wiring is formed using the third conductive layer and the fourth conductive layer.

2 Claims, 41 Drawing Sheets

(51) Int. Cl.
*H01L 27/12* (2006.01)
*H01L 29/45* (2006.01)
*H01L 29/786* (2006.01)
*H01L 21/02* (2006.01)

(52) U.S. Cl.
CPC ........ *H01L 27/1288* (2013.01); *H01L 29/458* (2013.01); *H01L 29/7869* (2013.01); *H01L 21/02554* (2013.01); *H01L 21/02565* (2013.01)

(58) Field of Classification Search
CPC ............... H01L 29/458; H01L 29/4908; H01L 29/7869
See application file for complete search history.

(56) References Cited

U.S. PATENT DOCUMENTS

| | | | |
|---|---|---|---|
| 5,744,864 A | 4/1998 | Cillessen et al. | |
| 5,818,549 A | 10/1998 | Maruyama et al. | |
| 5,847,410 A | 12/1998 | Nakajima | |
| 5,952,675 A | 9/1999 | Katoh | |
| 6,091,467 A | 7/2000 | Kubo et al. | |
| 6,160,272 A | 12/2000 | Arai et al. | |
| 6,271,543 B1 | 8/2001 | Ohtani et al. | |
| 6,294,274 B1 | 9/2001 | Kawazoe et al. | |
| 6,429,057 B1 | 8/2002 | Hong et al. | |
| 6,469,317 B1 | 10/2002 | Yamazaki et al. | |
| 6,475,845 B2 | 11/2002 | Kimura | |
| 6,480,577 B1 | 11/2002 | Izumi et al. | |
| 6,525,342 B2 | 2/2003 | Amemiya et al. | |
| 6,563,174 B2 | 5/2003 | Kawasaki et al. | |
| 6,586,346 B1 | 7/2003 | Yamazaki et al. | |
| 6,596,571 B2 | 7/2003 | Arao et al. | |
| 6,620,660 B2 | 9/2003 | Ohtani et al. | |
| 6,665,374 B2 | 12/2003 | Izumi et al. | |
| 6,690,033 B2 | 2/2004 | Yamazaki et al. | |
| 6,720,577 B2 | 4/2004 | Arao et al. | |
| 6,727,522 B1 | 4/2004 | Kawasaki et al. | |
| 6,737,306 B2 | 5/2004 | Yamazaki et al. | |
| 6,759,677 B1 * | 7/2004 | Yamazaki ......... H01L 21/02532 257/59 |
| 6,762,802 B2 | 7/2004 | Ono et al. | |
| 6,806,499 B2 | 10/2004 | Yamazaki et al. | |
| 6,816,355 B2 | 11/2004 | Watanabe | |
| 6,831,297 B2 | 12/2004 | Arao | |
| 6,836,299 B2 | 12/2004 | Chung et al. | |
| 6,864,936 B2 | 3/2005 | Izumi et al. | |
| 6,887,742 B2 | 5/2005 | Baek et al. | |
| 6,933,184 B2 | 8/2005 | Arao et al. | |
| 6,958,489 B2 | 10/2005 | Kimura | |
| 6,960,812 B2 | 11/2005 | Yamazaki et al. | |
| 6,963,084 B2 | 11/2005 | Arao et al. | |
| 6,969,889 B2 | 11/2005 | Cho et al. | |
| 7,012,290 B2 | 3/2006 | Kimura | |
| 7,038,740 B1 | 5/2006 | Katsuya | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,245,332 B2 | 7/2007 | Kim | |
| 7,247,529 B2 | 7/2007 | Shoji et al. | |
| 7,282,782 B2 | 10/2007 | Hoffman et al. | |
| 7,297,977 B2 | 11/2007 | Hoffman et al. | |
| 7,301,168 B2 | 11/2007 | Rhee et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,394,097 B2 | 7/2008 | Kobayashi et al. | |
| 7,402,506 B2 | 7/2008 | Levy et al. | |
| 7,405,132 B2 | 7/2008 | Arao et al. | |
| 7,411,209 B2 | 8/2008 | Endo et al. | |
| 7,414,266 B2 | 8/2008 | Yamazaki et al. | |
| 7,453,065 B2 | 11/2008 | Saito et al. | |
| 7,453,087 B2 | 11/2008 | Iwasaki | |
| 7,456,430 B1 | 11/2008 | Yamazaki et al. | |
| 7,462,862 B2 | 12/2008 | Hoffman et al. | |
| 7,465,957 B2 | 12/2008 | Arao | |
| 7,468,304 B2 | 12/2008 | Kaji et al. | |
| 7,468,527 B2 | 12/2008 | Ahn | |
| 7,492,427 B2 | 2/2009 | Na | |
| 7,501,293 B2 | 3/2009 | Ito et al. | |
| 7,592,652 B2 | 9/2009 | Kimura | |
| 7,601,566 B2 | 10/2009 | Sakakura et al. | |
| 7,619,254 B2 | 11/2009 | Lee et al. | |
| 7,626,203 B2 | 12/2009 | Kong et al. | |
| 7,633,090 B2 | 12/2009 | Ishii | |
| 7,674,650 B2 | 3/2010 | Akimoto et al. | |
| 7,683,977 B2 | 3/2010 | Nagata et al. | |
| 7,692,617 B2 | 4/2010 | Kim et al. | |
| 7,719,185 B2 | 5/2010 | Jin et al. | |
| 7,732,248 B2 | 6/2010 | Maekawa | |
| 7,732,819 B2 | 6/2010 | Akimoto et al. | |
| 7,741,641 B2 | 6/2010 | Bae et al. | |
| 7,781,759 B2 | 8/2010 | Song et al. | |
| 7,795,621 B2 | 9/2010 | Yamaguchi et al. | |
| 7,800,113 B2 | 9/2010 | Shoji et al. | |
| 7,808,108 B2 | 10/2010 | Cho et al. | |
| 7,906,780 B2 | 3/2011 | Iwasaki | |
| 7,939,827 B2 | 5/2011 | Arao | |
| 7,977,680 B2 | 7/2011 | Arao et al. | |
| 8,017,944 B2 | 9/2011 | Yamazaki et al. | |
| 8,044,392 B2 | 10/2011 | Song et al. | |
| 8,183,097 B2 | 5/2012 | Kwak et al. | |
| 8,183,569 B2 | 5/2012 | Arao | |
| 8,227,294 B2 | 7/2012 | Maekawa | |
| 8,237,186 B2 | 8/2012 | Kimura | |
| 8,372,701 B2 | 2/2013 | Lee et al. | |
| 8,445,901 B2 | 5/2013 | Maekawa | |
| 8,482,003 B2 | 7/2013 | Matsumura et al. | |
| 8,502,231 B2 | 8/2013 | Arao | |
| 8,541,804 B2 | 9/2013 | Kimura | |
| 8,637,869 B2 | 1/2014 | Lee et al. | |
| 8,829,668 B2 | 9/2014 | Yamazaki et al. | |
| 9,368,052 B2 * | 6/2016 | Kroll ................... G03H 1/0005 |
| 2001/0046027 A1 | 11/2001 | Tai et al. | |
| 2002/0056838 A1 | 5/2002 | Ogawa. | |
| 2002/0132454 A1 | 9/2002 | Ohtsu et al. | |
| 2003/0189401 A1 | 10/2003 | Kido et al. | |
| 2003/0201716 A1 * | 10/2003 | Yamazaki ............. H01L 27/322 313/506 |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0024550 A1 | 2/2005 | Kim | |
| 2005/0199959 A1 | 9/2005 | Chiang et al. | |
| 2005/0250308 A1 | 11/2005 | Yamaguchi et al. | |
| 2006/0027804 A1 | 2/2006 | Yamazaki et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0102907 A1 | 5/2006 | Lee et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0192204 A1 | 8/2006 | Yamaguchi et al. | |
| 2006/0197092 A1 | 9/2006 | Hoffman et al. | |
| 2006/0205125 A1 | 9/2006 | Bae et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii et al. | |
| 2006/0292777 A1 | 12/2006 | Dunbar | |
| 2007/0024187 A1 | 2/2007 | Shin et al. | |

(56) References Cited

U.S. PATENT DOCUMENTS

| | | |
|---|---|---|
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0111144 A1 | 5/2007 | Fujikawa et al. |
| 2007/0146592 A1 | 6/2007 | Kimura |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0295967 A1 | 12/2007 | Harada et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191207 A1 | 8/2008 | Nishiura |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308795 A1 | 12/2008 | Lee et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto. et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0160741 A1 | 6/2009 | Inoue et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140613 A1 | 6/2010 | Kimura |
| 2010/0224872 A1 | 9/2010 | Kimura |
| 2010/0224880 A1 | 9/2010 | Kimura |
| 2014/0167054 A1 | 6/2014 | Lee et al. |

FOREIGN PATENT DOCUMENTS

| | | |
|---|---|---|
| EP | 1128439 A | 8/2001 |
| EP | 1139454 A | 10/2001 |
| EP | 1737044 A | 12/2006 |
| EP | 1801881 A | 6/2007 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-082221 A | 3/1990 |
| JP | 02-310536 A | 12/1990 |
| JP | 03-231472 A | 10/1991 |
| JP | 05-053135 A | 3/1993 |
| JP | 05-053135 A | 3/1993 |
| JP | 05-251705 A | 9/1993 |
| JP | 06-095142 A | 4/1994 |
| JP | 06-194689 | 7/1994 |
| JP | 06-194689 A | 7/1994 |
| JP | 07-092491 A | 4/1995 |
| JP | 08-264794 A | 10/1996 |
| JP | 09-236812 A | 9/1997 |
| JP | 09-236812 A | 9/1997 |
| JP | 09-318975 A | 12/1997 |
| JP | 10-020298 A | 1/1998 |
| JP | 10-333180 A | 12/1998 |
| JP | 11-095256 A | 4/1999 |
| JP | 11-505377 | 5/1999 |
| JP | 11-249171 A | 9/1999 |
| JP | 2000-044236 A | 2/2000 |
| JP | 2000-150900 A | 5/2000 |
| JP | 2000-353808 A | 12/2000 |
| JP | 2001-312222 A | 11/2001 |
| JP | 2001-318628 A | 11/2001 |
| JP | 2001-343911 A | 12/2001 |
| JP | 2002-050761 A | 2/2002 |
| JP | 2002-076356 A | 3/2002 |
| JP | 2002-189429 A | 7/2002 |
| JP | 2002-289859 A | 10/2002 |
| JP | 2003-086000 A | 3/2003 |
| JP | 2003-086808 A | 3/2003 |
| JP | 2003-098549 A | 4/2003 |
| JP | 2003-163223 A | 6/2003 |
| JP | 2004-103957 A | 4/2004 |
| JP | 2004-273614 A | 9/2004 |
| JP | 2004-273732 A | 9/2004 |
| JP | 2006-058676 A | 3/2006 |
| JP | 2006-100807 A | 4/2006 |
| JP | 2006-242987 A | 9/2006 |
| JP | 2006-242987 A | 9/2006 |
| JP | 2006-245031 A | 9/2006 |
| JP | 2007-073703 A | 3/2007 |
| JP | 2007-081362 A | 3/2007 |
| JP | 2007-096055 A | 4/2007 |
| JP | 2007-109918 A | 4/2007 |
| JP | 2007-115807 A | 5/2007 |
| JP | 2007-123700 A | 5/2007 |
| JP | 2007-123861 A | 5/2007 |
| JP | 2007-133371 A | 5/2007 |
| JP | 2007-140527 A | 6/2007 |
| JP | 2007-140527 A | 6/2007 |
| JP | 2007-171932 A | 7/2007 |
| JP | 2007-201366 A | 8/2007 |
| JP | 2007-220817 A | 8/2007 |
| JP | 2007-250983 A | 9/2007 |
| JP | 2007-299913 A | 11/2007 |
| JP | 2008-041865 A | 2/2008 |
| JP | 2008-103609 A | 5/2008 |
| JP | 2008-176262 A | 7/2008 |
| JP | 2008-218960 A | 9/2008 |
| JP | 2008-243928 A | 10/2008 |
| JP | 2008-311677 A | 12/2008 |
| JP | 2008-311677 A | 12/2008 |
| KR | 2001-0110360 A | 12/2001 |
| TW | 200618311 | 6/2006 |
| WO | WO-2004/114391 | 12/2004 |
| WO | WO-2006/025473 | 3/2006 |
| WO | WO-2006/093028 | 9/2006 |
| WO | WO-2006/093029 | 9/2006 |
| WO | WO-2007/086291 | 8/2007 |
| WO | WO-2007/119386 | 10/2007 |
| WO | WO-2007/119727 | 10/2007 |

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.
Ito.M et al., "Application of Transparent Amorphous Oxide TFT to Electronic Paper", IDW '08 : Proceedings of the 15th International Display Workshops, Dec. 3, 2008, pp. 1617-1620.
Ikeda.N et al., "The Effect of Introducing Metal Bus Electrode into Fully Transparent TFT Array for Color Electronic Paper", IDW '08 : Proceedings of the 15th International Display Workshops, Dec. 3, 2008, pp. 231-232.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al. "P-9:Numerical Analysis on Temperature Dependence of Characteristics of Amorphous In—Ga—Zn-Oxide TFT", SID Digest '09 ; SID International Symposium Digest of Technical Papers, May 31, 2009, pp. 1110-1112.
Ohara.H et al. "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1 :Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al. "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al. "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and SC2O3—A2O3—BO

(56) References Cited

OTHER PUBLICATIONS

Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al. "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Nakamura.M, "Synthesis of Homologous Compound with New Long-Period Structure", Nirim Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al. "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al. "Electronic Transport Properties of Amorphous Indium-Gallium-Zinc Oxide Semiconductor Upon Exposure To Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al. "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al. "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Chinese Office Action (Application No. 201010134385.2) dated Oct. 31, 2013.
Taiwanese Office Action (Application No. 099105969) dated Dec. 26, 2014.
Korean Office Action (Application No. 2017-0019458) dated May 10, 2017.
Chinese Office Action (Application No. 201610403640.6) dated Jun. 4, 2018.

* cited by examiner

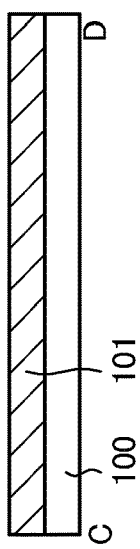
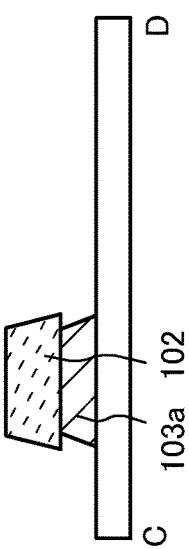
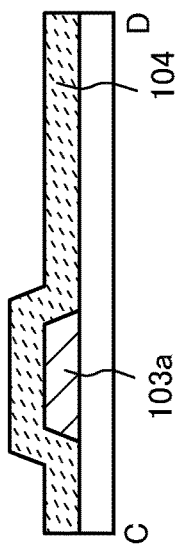
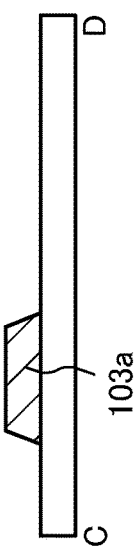
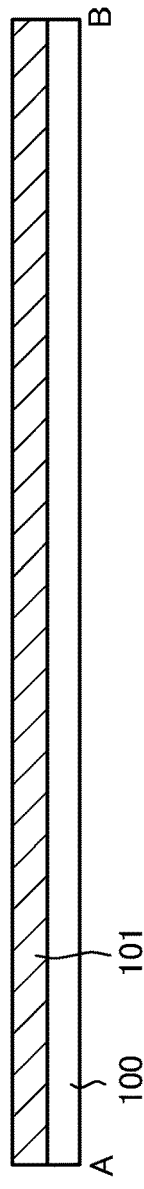
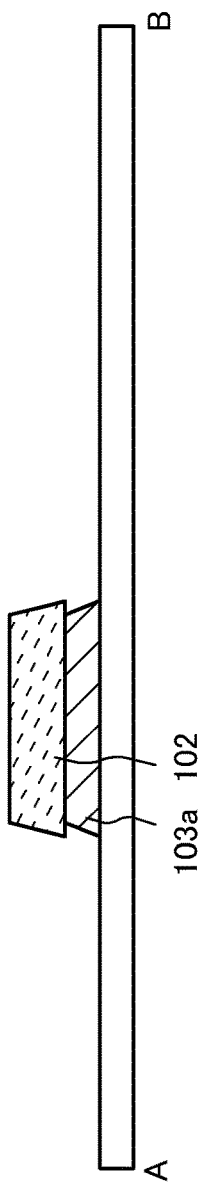
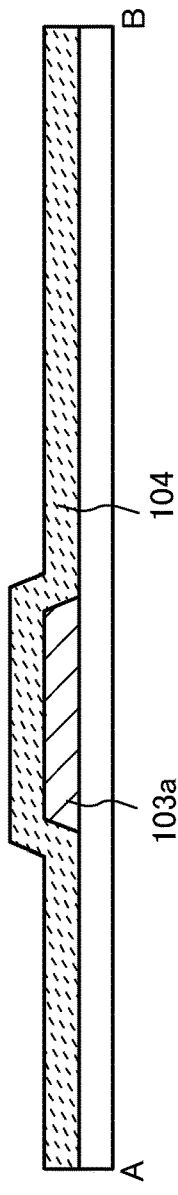
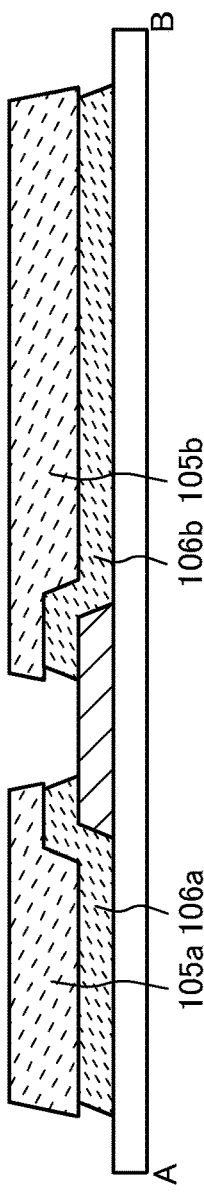

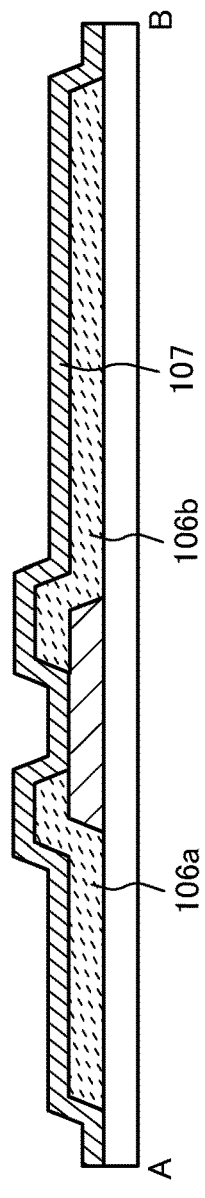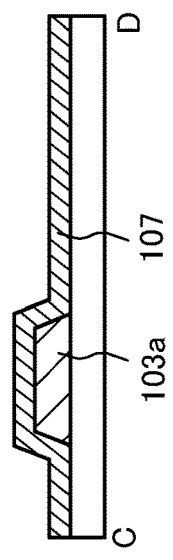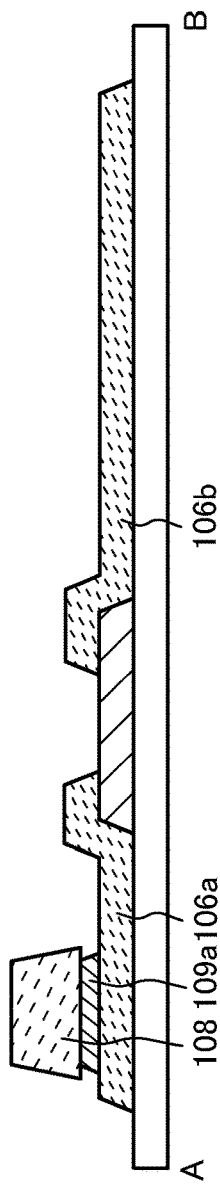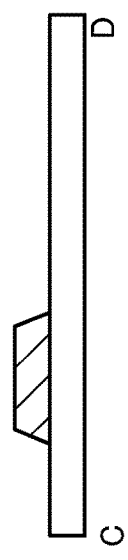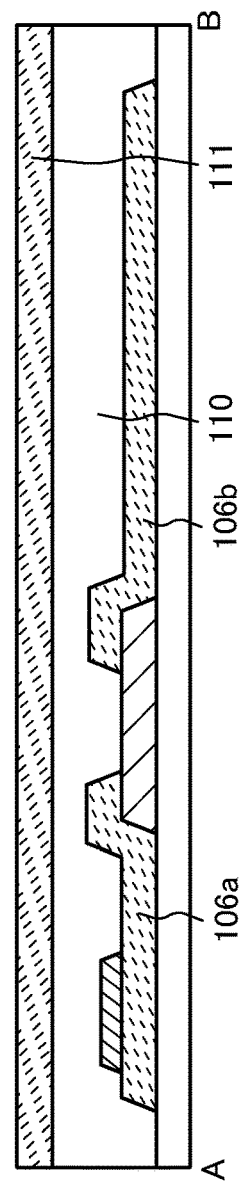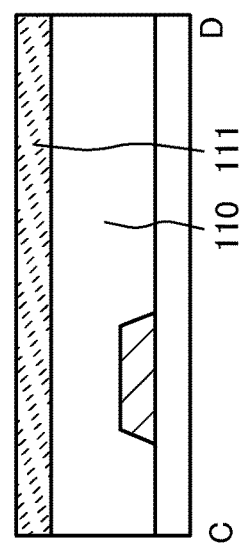

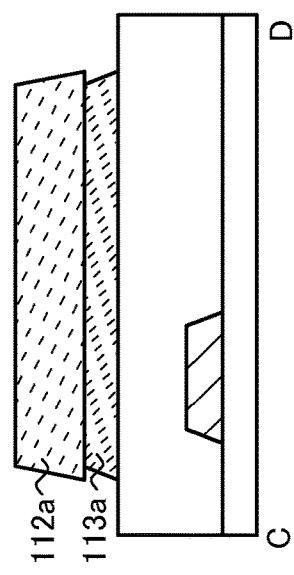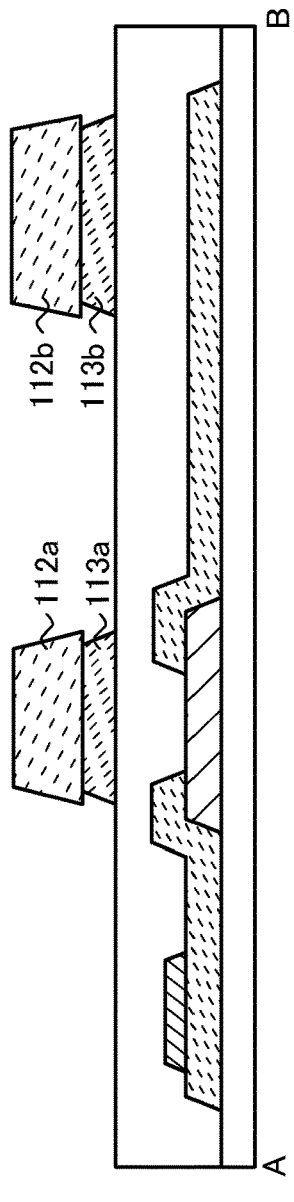
FIG. 4A / FIG. 4B
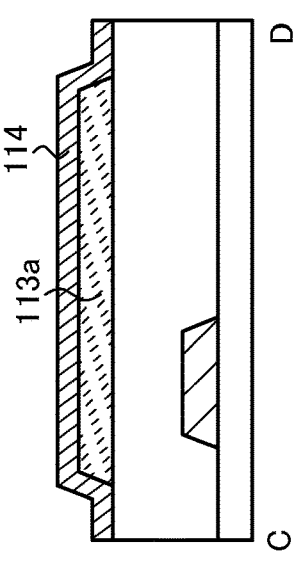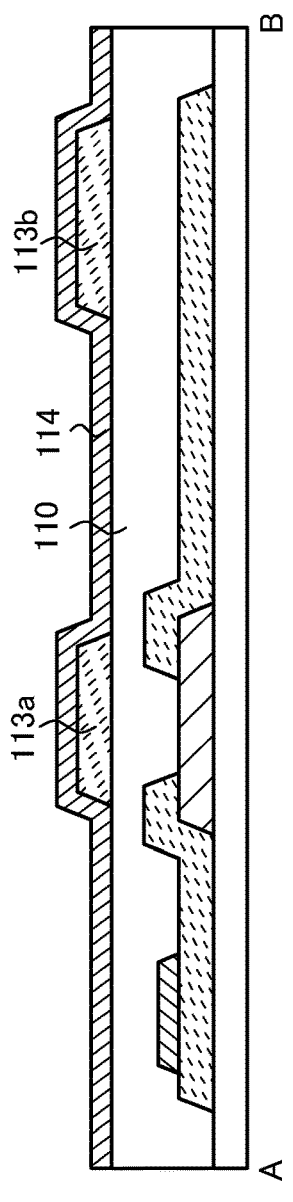
FIG. 4C / FIG. 4D
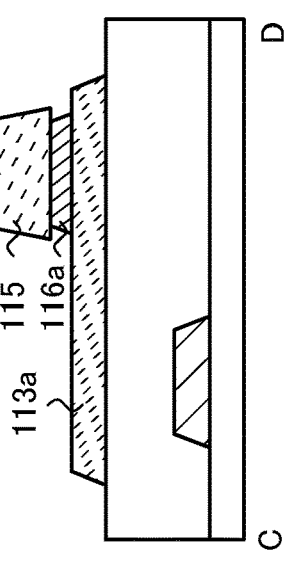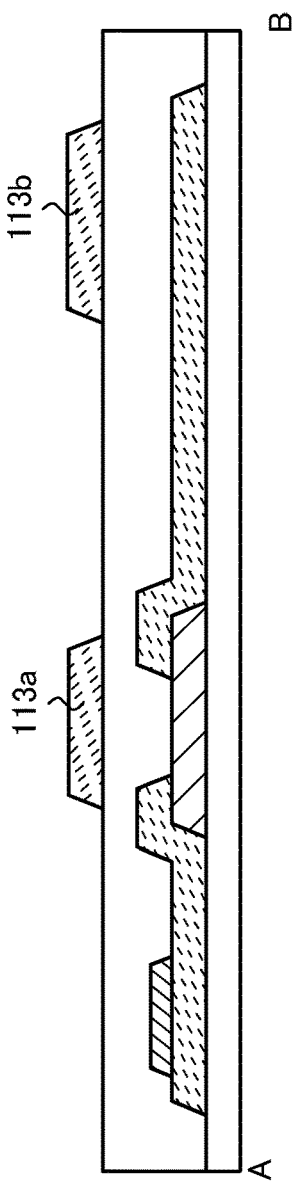
FIG. 4E / FIG. 4F

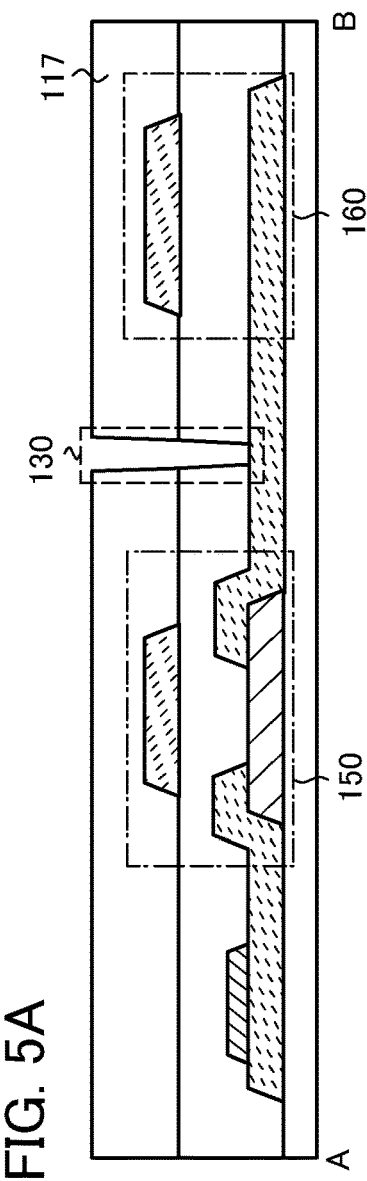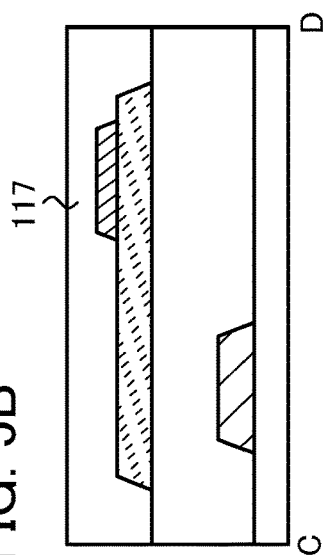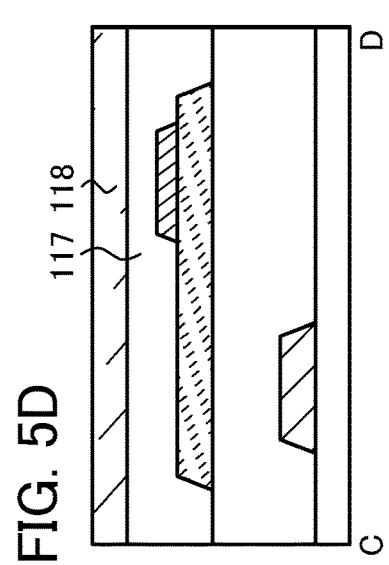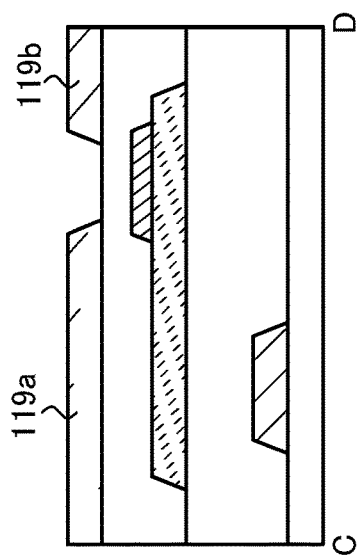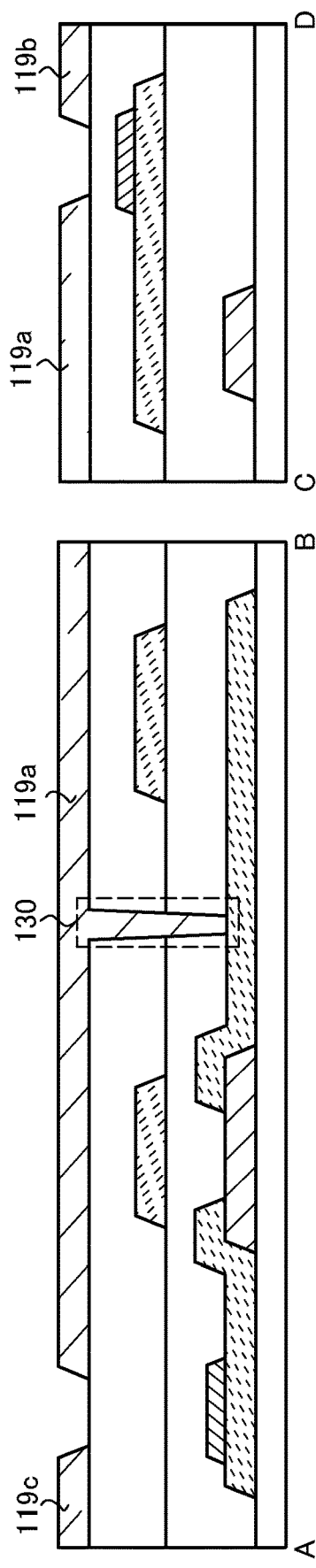

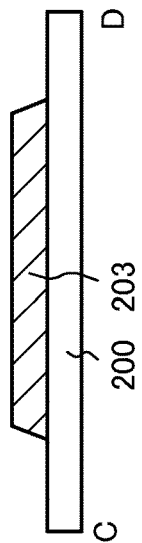
FIG. 17A
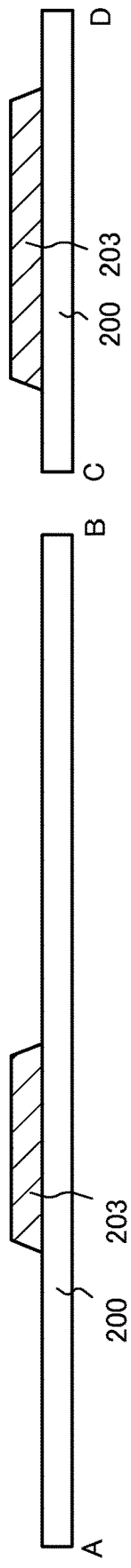
FIG. 17B
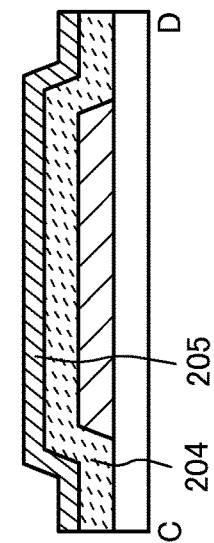
FIG. 17C
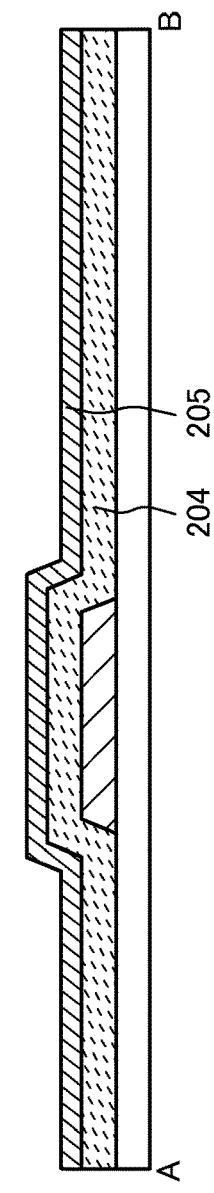
FIG. 17D
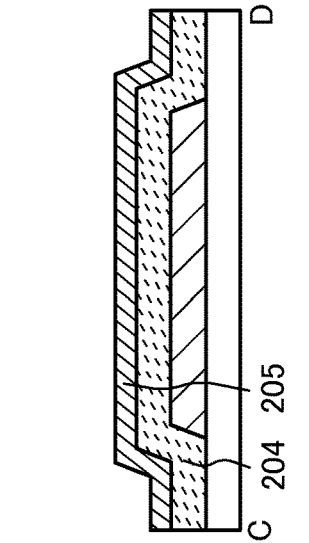
FIG. 17E
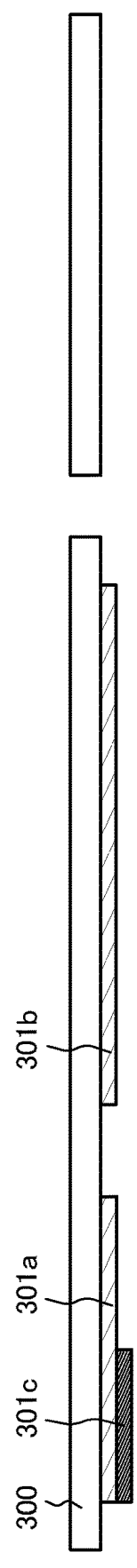
FIG. 17F
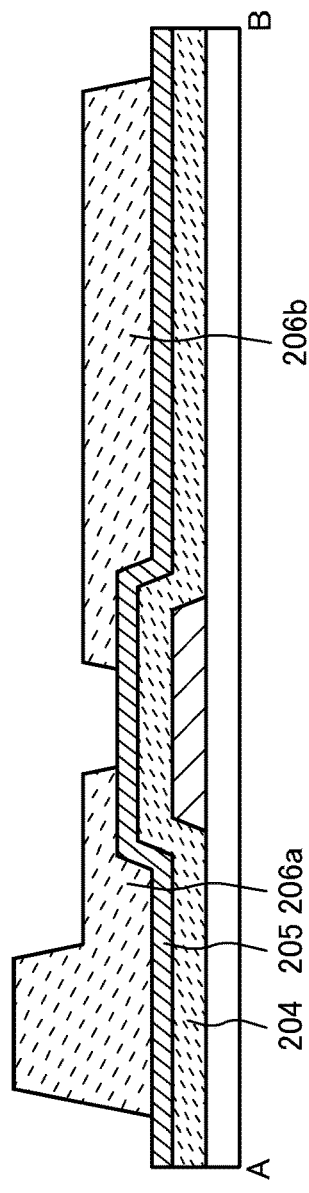

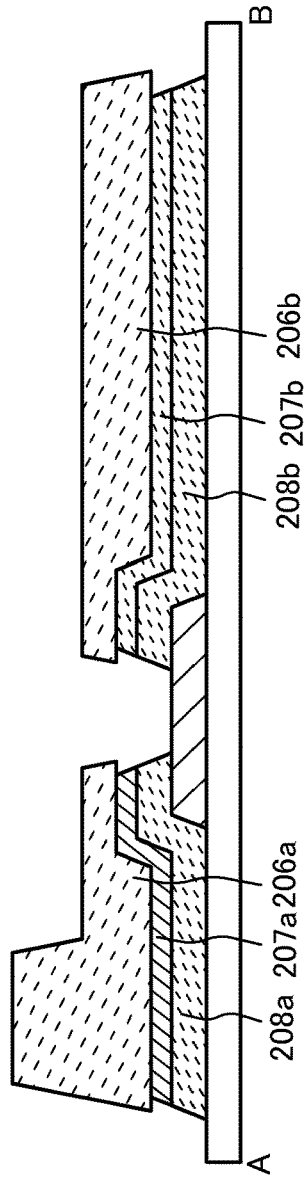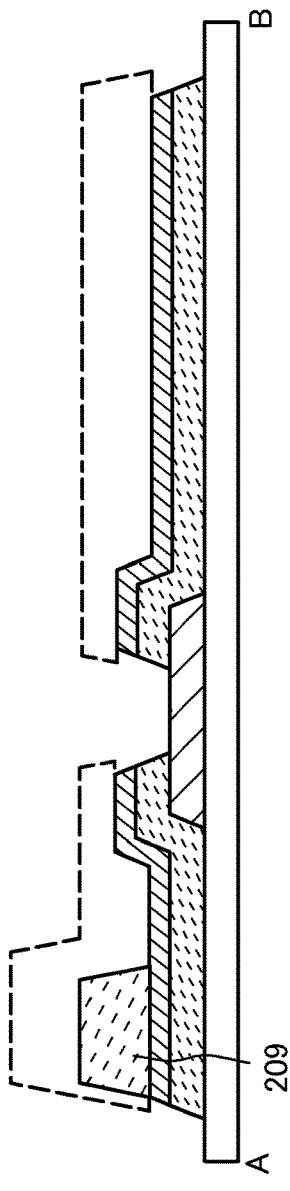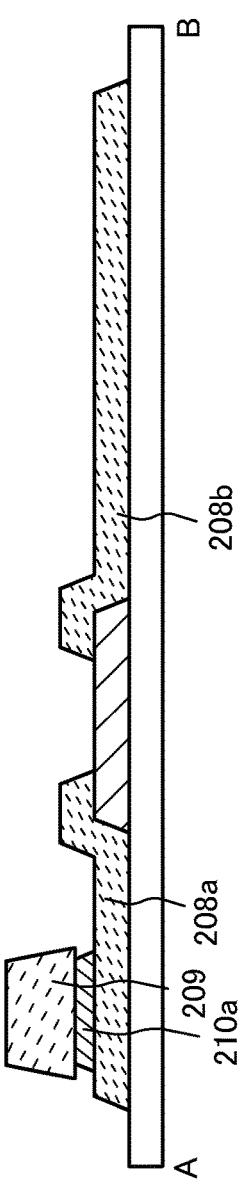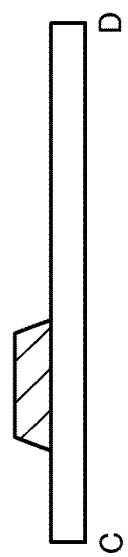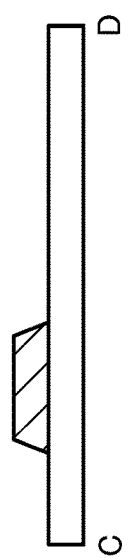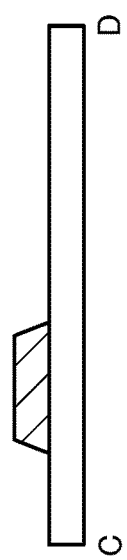

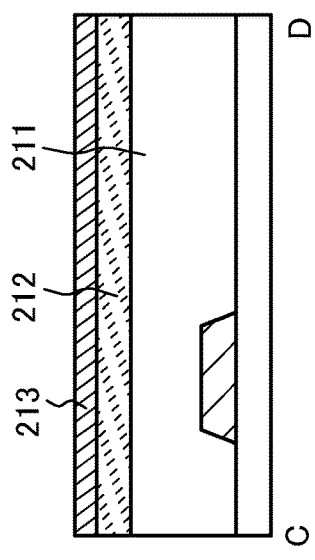
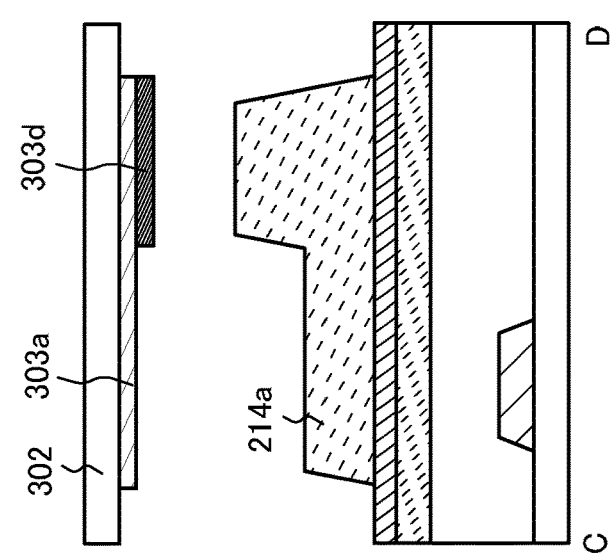
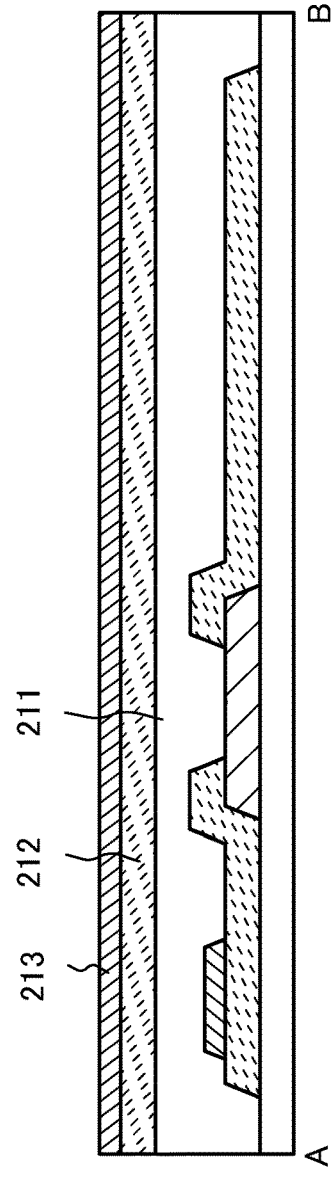
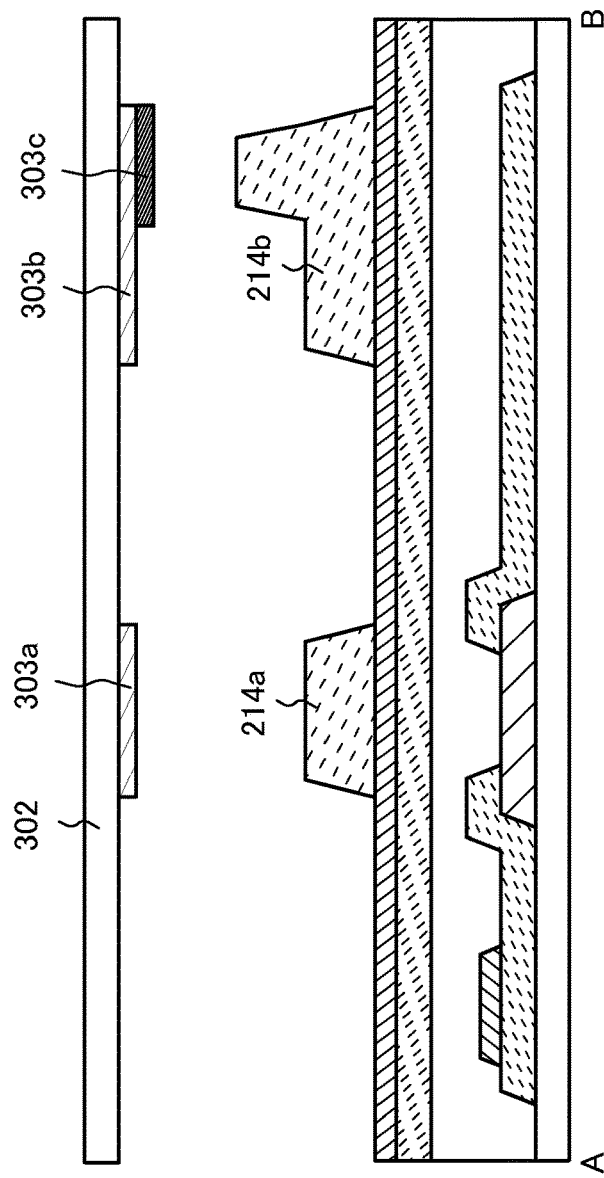

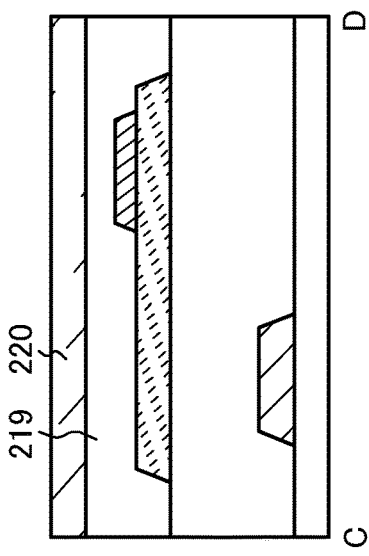
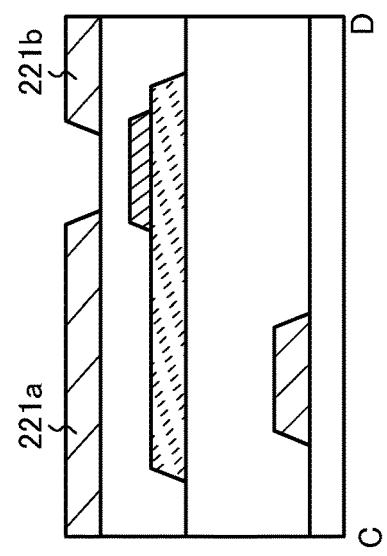
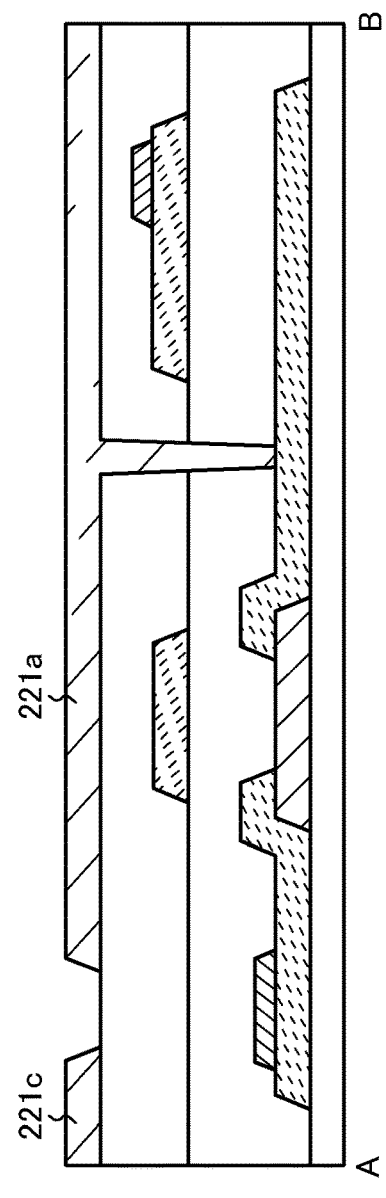
FIG. 21A  FIG. 21B  FIG. 21C  FIG. 21D pixel portion | peripheral driver circuit portion pixel portion | peripheral driver circuit portion

SEMICONDUCTOR DEVICE

BACKGROUND OF THE INVENTION

1. Field of the Invention

The present invention relates to semiconductor devices, display devices, light-emitting devices, and manufacturing methods thereof. In particular, the present invention relates to semiconductor devices including circuits having thin film transistors (hereinafter referred to as TFTs) in which oxide semiconductor films are used for channel formation regions, and manufacturing methods thereof. For example, the present invention relates to electronic devices on which electro-optic devices typified by liquid crystal display panels or light-emitting display devices including organic light-emitting elements are mounted as components.

2. Description of the Related Art

Thin film transistors (TFTs) in which silicon layers formed using amorphous silicon or the like are used as channel layers have been widely used as switching elements in display devices typified by liquid crystal display devices. Although thin film transistors formed using amorphous silicon have low field effect mobility, the thin film transistors have an advantage that larger glass substrates can be used.

Further, in recent years, attention has been drawn to a technique by which a thin film transistor is formed using a metal oxide having semiconductor properties and such a transistor is used in an electronic device or an optical device. For example, it has been known that some metal oxides such as tungsten oxide, tin oxide, indium oxide, and zinc oxide have semiconductor properties. A thin film transistor in which a transparent semiconductor layer formed using such a metal oxide is used for a channel formation region has been disclosed (Reference 1).

In addition, a technique for increasing aperture ratio by formation of a channel layer of a transistor with the use of a light-transmitting oxide semiconductor layer and formation of a gate electrode, a source electrode, and a drain electrode with the use of light-transmitting transparent conductive films has been studied (Reference 2).

When the aperture ratio is increased, light use efficiency is improved, so that power consumption and the size of display devices can be reduced. On the other hand, from the viewpoint of an increase in the size of display devices and application to mobile devices, more reduction in power consumption and an increase in aperture ratio are demanded.

Note that as a method for providing a metal auxiliary wiring for a transparent electrode of an electro-optical element, a method by which the metal auxiliary wiring is provided so as to overlap with an upper surface of the transparent electrode or a lower surface of the transparent electrode and to be electrically connected to the transparent electrode has been known (for example, see Reference 3).

Note that a structure in which an additional capacitor electrode provided for an active matrix substrate is formed using a transparent conductive film of ITO, $SnO_2$, or the like and an auxiliary wiring formed using a metal film is provided in contact with the additional capacitor electrode in order to lower the electric resistance of the additional capacitor electrode has been known (for example, see Reference 4).

Note that it has been known that, as each of a gate electrode, a source electrode, and a drain electrode of a field effect transistor formed using an amorphous oxide semiconductor film, a transparent electrode of indium tin oxide (ITO), indium zinc oxide, ZnO, $SnO_2$, or the like, a metal electrode of Al, Ag, Cr, Ni, Mo, Au, Ti, Ta, or the like, or a metal electrode of an alloy containing any of the above elements can be used; and, by staking two or more of these layers, contact resistance may be lowered or interface intensity may be improved (for example, see Reference 5).

Note that it has been known that, as a material for each of a source electrode, a drain electrode, and a gate electrode of a transistor formed using an amorphous oxide semiconductor, and an auxiliary capacitor electrode, a metal such as indium (In), aluminum (Al), gold (Au), or silver (Ag), or an oxide material such as indium oxide ($In_2O_3$), tin oxide ($SnO_2$), zinc oxide (ZnO), cadmium oxide (CdO), cadmium indium oxide ($CdIn_2O_4$), cadmium tin oxide ($Cd_2SnO_4$), or zinc tin oxide ($Zn_2SnO_4$) can be used; and the same material or different materials may be used for the gate electrode, the source electrode, and the drain electrode (for example, see References 6 and 7).

REFERENCE

Reference 1: Japanese Published Patent Application No. 2004-103957

Reference 2: Japanese Published Patent Application No. 2007-081362

Reference 3: Japanese Published Patent Application No. 2-082221

Reference 4: Japanese Published Patent Application No. 2-310536

Reference 5: Japanese Published Patent Application No. 2008-243928

Reference 6: Japanese Published Patent Application No. 2007-109918

Reference 7: Japanese Published Patent Application No. 2007-115807

SUMMARY OF THE INVENTION

It is an object of one embodiment of the present invention to provide a semiconductor device with low power consumption. Alternatively, it is an object of one embodiment of the present invention to provide a semiconductor device having low wiring resistance. Alternatively, it is an object of one embodiment of the present invention to provide a semiconductor device manufactured at low cost. Alternatively, it is an object of one embodiment of the present invention to provide a semiconductor device having high transmittance. Alternatively, it is an object of one embodiment of the present invention to provide a high-definition semiconductor device. Alternatively, it is an object of one embodiment of the present invention to provide a semiconductor device with high aperture ratio. Alternatively, it is an object of one embodiment of the present invention to provide a semiconductor device having high storage capacitance. Alternatively, it is an object of one embodiment of the present invention to provide a semiconductor device with less light leakage. Alternatively, it is an object of one embodiment of the present invention to provide a semiconductor device with low feedthrough voltage. Alternatively, it is an object of one embodiment of the present invention to provide a semiconductor device where a depletion layer is easily formed.

One embodiment of the present invention is a semiconductor device which includes a semiconductor layer provided over a substrate having an insulating surface, a first wiring which is electrically connected to the semiconductor layer and includes a first electrode, an insulating film formed so as to cover the semiconductor layer and the first electrode, and a second wiring which is provided over the semiconductor layer with the insulating film interposed therebetween and includes a second electrode. The first electrode includes a first conductive layer. The first wiring includes the first conductive layer and a second conductive layer. The second electrode includes a third conductive layer. The second wiring includes the third conductive layer and a fourth conductive layer.

One embodiment of the present invention is a semiconductor device which includes a semiconductor layer provided over a substrate having an insulating surface, a first wiring which is connected to the semiconductor layer and includes a first electrode, an insulating film formed so as to cover the semiconductor layer and the first electrode, a second wiring which is provided over the semiconductor layer with the insulating film interposed therebetween and includes a second electrode, and a third wiring. The first electrode includes a first conductive layer. The first wiring includes the first conductive layer and a second conductive layer. The second electrode includes a third conductive layer. The second wiring includes the third conductive layer and a fourth conductive layer. The third wiring includes a fifth conductive layer and a sixth conductive layer.

In the above, the first conductive layer and the third conductive layer preferably have light-transmitting properties. In addition, the electric conductivity of each of the second conductive layer and the fourth conductive layer is preferably higher than the electric conductivity of the first conductive layer, the third conductive layer, or a light-transmitting conductive layer. Further, the second conductive layer and the fourth conductive layer preferably have light-blocking properties.

Further, in the above, the semiconductor layer is preferably an oxide semiconductor layer which contains indium, gallium, or zinc.

Note that as an example of an oxide semiconductor which can be used in this specification, there is an oxide semiconductor represented by $InMO_3(ZnO)_m$ (m>0). Here, M is one or more metal elements selected from gallium (Ga), iron (Fe), nickel (Ni), manganese (Mn), or cobalt (Co). For example, the case where Ga is selected as M includes not only the case where only Ga is used but also the case where Ga and the above metal element other than Ga, such as Ni or Fe, are selected. Further, in the oxide semiconductor, in some cases, a transitional metal element such as Fe or Ni or an oxide of the transitional metal is contained as an impurity element in addition to the metal element contained as M. In this specification, among the oxide semiconductors, an oxide semiconductor containing at least gallium as M is referred to as an In—Ga—Zn—O-based oxide semiconductor, and a thin film formed using the material is referred to as an In—Ga—Zn—O-based non-single-crystal film in some cases.

As well as the above oxide semiconductors, any of the following oxide semiconductors can be used as the oxide semiconductor: an In—Sn—Zn—O-based oxide semiconductor; an In—Al—Zn—O-based oxide semiconductor; a Sn-Ga—Zn—O-based oxide semiconductor; an Al-Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. By addition of an impurity which suppresses crystallization to keep an amorphous state to these oxide semiconductors, characteristics of thin film transistors can be stabilized.

Note that a semiconductor layer used in one embodiment of the present invention may have light-transmitting properties. For example, an oxide semiconductor can be used for a light-transmitting semiconductor layer. Alternatively, as well as an oxide semiconductor, any of a crystalline semiconductor (a single crystal semiconductor or a polycrystalline semiconductor), an amorphous semiconductor, a microcrystalline semiconductor, an organic semiconductor, and the like may be used.

Further, in the above, with the use of a multi-tone mask for processing the first conductive layer, the second conductive layer, and the like, a light-transmitting region (a region with high transmittance) and a light-blocking region (a region with low transmittance) can be formed with one mask (reticle). Accordingly, the light-transmitting region (the region with high transmittance) and the light-blocking region (the region with low transmittance) can be formed without an increase in the number of masks.

Note that in this specification, a semiconductor device refers to all devices that can function by utilizing semiconductor properties, and semiconductor circuits, display devices, electro-optic devices, light-emitting display devices, and electronic devices are all semiconductor devices.

Note that in this specification, a display device refers to an image display device, a light-emitting device, or a light source (including a lighting device). Further, a module to which a connector such as a flexible printed circuit (FPC), a tape automated bonding (TAB) tape, or a tape carrier package (TCP) is attached; a module having a TAB tape or a TCP which is provided with a printed wiring board at an end thereof; and a module having an integrated circuit (IC) which is directly mounted on a display element by a chip on glass (COG) method are all display devices.

Note that a variety of switches can be used as a switch. For example, an electrical switch, a mechanical switch, or the like can be used. That is, any element can be used as long as it can control a current flow, without limitation to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), or the like can be used as a switch. Alternatively, a logic circuit in which such elements are combined can be used as a switch.

An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

In the case of using a transistor as a switch, the polarity (conductivity type) of the transistor is not particularly limited to a certain type because it operates just as a switch. However, a transistor having polarity with smaller off-state current is preferably used when the amount of off-state current is to be suppressed. Examples of a transistor with smaller off-state current are a transistor provided with an LDD region, a transistor with a multi-gate structure, and the like. Further, an n-channel transistor is preferably used when a potential of a source terminal of the transistor which is operated as a switch is close to a potential of a low-potential-side power supply (e.g., Vss, GND, or 0 V). On the other hand, a p-channel transistor is preferably used when the potential of the source terminal is close to a potential of a high-potential-side power supply (e.g., Vdd). This is because the absolute value of gate-source voltage can be increased when the potential of the source terminal of the n-channel transistor is close to a potential of a low-potential-side power supply and when the potential of the source terminal of the p-channel transistor is close to a potential of a high-potential-side power supply, so that the transistor can be more accurately operated as a switch. This is also because the transistor does not often perform source follower operation, so that reduction in output voltage does not often occur.

Note that a CMOS switch may be used as a switch by using both an n-channel transistor and a p-channel transistor. By using a CMOS switch, the switch can be more accurately operated as a switch because current can flow when either the p-channel transistor or the n-channel transistor is turned on. For example, voltage can be appropriately output regardless of whether voltage of an input signal to the switch is high or low. In addition, since the voltage amplitude value of a signal for turning on or off the switch can be made smaller, power consumption can be reduced.

Note that when a transistor is used as a switch, the switch includes an input terminal (one of a source terminal and a drain terminal), an output terminal (the other of the source terminal and the drain terminal), and a terminal for controlling conduction (a gate terminal). On the other hand, when a diode is used as a switch, the switch does not include a terminal for controlling conduction in some cases. Therefore, when a diode is used as a switch, the number of wirings for controlling terminals can be further reduced as compared to the case of using a transistor.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be interposed between elements having a connection relation illustrated in drawings and texts, without limitation to a predetermined connection relation, for example, the connection relation illustrated in the drawings and the texts.

For example, in the case where A and B are electrically connected, one or more elements which enable electrical connection between A and B (e.g., a switch, a transistor, a capacitor, an inductor, a resistor, and/or a diode) may be connected between A and B. Alternatively, in the case where A and B are functionally connected, one or more circuits which enable functional connection between A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing a potential level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) may be connected between A and B. For example, in the case where a signal output from A is transmitted to B even when another circuit is interposed between A and B, A and B are functionally connected.

Note that when it is explicitly described that "A and B are electrically connected", the case where A and B are electrically connected (i.e., the case where A and B are connected with another element or another circuit interposed therebetween), the case where A and B are functionally connected (i.e., the case where A and B are functionally connected with another circuit interposed therebetween), and the case where A and B are directly connected (i.e., the case where A and B are connected without another element or another circuit interposed therebetween) are included therein. That is, when it is explicitly described that "A and B are electrically connected", the description is the same as the case where it is explicitly only described that "A and B are connected".

Note that a display element, a display device which is a device including a display element, a light-emitting element, and a light-emitting device which is a device including a light-emitting element can employ various modes and can include various elements. For example, a display medium, whose contrast, luminance, reflectivity, transmittance, or the like changes by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube can be used as a display element, a display device, a light-emitting element, or a light-emitting device. Note that display devices having EL elements include an EL display; display devices having electron emitters include a field emission display (FED), an SED-type flat panel display (SED: surface-conduction electron-emitter display), and the like; display devices having liquid crystal elements include a liquid crystal display (e.g., a transmissive liquid crystal display, a transflective liquid crystal display, a reflective liquid crystal display, a direct-view liquid crystal display, or a projection liquid crystal display); display devices having electronic ink or electrophoretic elements include electronic paper.

Note that an EL element is an element including an anode, a cathode, and an EL layer interposed between the anode and the cathode. Note that as an EL layer, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed using an organic material, a layer formed using an inorganic material, a layer formed using an organic material and an inorganic material, a layer including a high-molecular material, a layer including a low-molecular material, a layer including a high-molecular material and a low-molecular material, or the like can be used. Note that the present invention is not limited to this, and a variety of EL elements can be used as an EL element.

Note that an electron emitter is an element in which electrons are extracted by high electric field concentration on a cathode. For example, as an electron emitter, a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a thin film type in which a metal, an insulator, a semiconductor, and a metal are stacked, a HEED type, an EL type, a porous silicon type, a surface-conduction (SCE) type, or the like can be used. Note that the present invention is not limited to this, and a variety of elements can be used as an electron emitter.

Note that a liquid crystal element is an element which controls transmission or non-transmission of light by optical modulation action of liquid crystals and includes a pair of electrodes and liquid crystals. Note that the optical modulation action of liquid crystals is controlled by an electric field applied to the liquid crystals (including a horizontal electric field, a vertical electric field, and a diagonal electric field). Note that the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a diving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, a blue phase mode, and the like. Note that the present invention is not limited to this, and a variety of liquid crystal elements and driving methods thereof can be used as a liquid crystal element and a driving method thereof.

Note that electronic paper corresponds to a device for displaying images by molecules (a device which utilizes optical anisotropy, dye molecular orientation, or the like), a device for displaying images by particles (a device which utilizes electrophoresis, particle movement, particle rotation, phase change, or the like), a device for displaying images by movement of one end of a film, a device for displaying images by using coloring properties or phase change of molecules, a device for displaying images by using optical absorption by molecules, or a device for displaying images by using self-light emission by combination of electrons and holes. For example, the following can be used for a display method of electronic paper: microcapsule electrophoresis, horizontal electrophoresis, vertical electrophoresis, a spherical twisting ball, a magnetic twisting ball, a columnar twisting ball, a charged toner, an electron powder and granular material, magnetic electrophoresis, a magnetic thermosensitive type, electro wetting, light-scattering (transparent-opaque change), a cholesteric liquid crystal and a photoconductive layer, a cholesteric liquid crystal device, a bistable nematic liquid crystal, a ferroelectric liquid crystal, a liquid crystal dispersed type with a dichroic dye, a movable film, coloring and decoloring properties of a leuco dye, photochromism, electrochromism, electrodeposition, flexible organic EL, and the like. Note that the present invention is not limited to this, and a variety of electronic paper and display methods thereof can be used as electronic paper and a driving method thereof. Here, by using microcapsule electrophoresis, defects of electrophoresis, which are aggregation and precipitation of phoresis particles, can be solved. Electron powder and granular material has advantages such as high-speed response, high reflectivity, wide viewing angle, low power consumption, and memory properties.

Note that a plasma display panel has a structure where a substrate having a surface provided with an electrode faces with a substrate having a surface provided with an electrode and a minute groove in which a phosphor layer is formed at a narrow interval and a rare gas is sealed therein. Alternatively, the plasma display panel can have a structure where a plasma tube is sandwiched between film-form electrodes from the top and the bottom. The plasma tube is formed by sealing a discharge gas, RGB fluorescent materials, and the like inside a glass tube. Note that the plasma display panel can perform display by application of voltage between the electrodes to generate an ultraviolet ray so that a phosphor emits light. Note that the plasma display panel may be a DC-type PDP or an AC-type PDP. Here, as a driving method of the plasma display panel, AWS (address while sustain) driving, ADS (address display separated) driving in which a subframe is divided into a reset period, an address period, and a sustain period, CLEAR (high-contrast and low energy address and reduction of false contour sequence) driving, ALIS (alternate lighting of surfaces) method, TERES (technology of reciprocal sustainer) driving, or the like can be used. Note that the present invention is not limited to this, and a variety of driving methods can be used as a driving method of a plasma display panel.

Note that electroluminescence, a cold cathode fluorescent lamp, a hot cathode fluorescent lamp, an LED, a laser light source, a mercury lamp, or the like can be used as a light source of a display device in which a light source is needed, such as a liquid crystal display (e.g., a transmissive liquid crystal display, a transflective liquid crystal display, a reflective liquid crystal display, a direct-view liquid crystal display, or a projection liquid crystal display), a display device including a grating light valve (GLV), or a display device including a digital micromirror device (DMD). Note that the present invention is not limited to this, and a variety of light sources can be used as a light source.

Note that a variety of transistors can be used as a transistor, without limitation to a certain type. For example, a thin film transistor (TFT) including a single crystal semiconductor film or a non-single-crystal semiconductor film typified by an amorphous silicon film, a polycrystalline silicon film, or a microcrystalline (also referred to as microcrystal, nanocrystal, or semi-amorphous) silicon film, or the like can be used. In the case of using the TFT, there are various advantages. For example, since the TFT can be formed at temperature which is lower than that of the case of using single crystal silicon, manufacturing cost can be reduced or a manufacturing apparatus can be made larger. Since the manufacturing apparatus can be made larger, the TFT can be formed using a large substrate. Therefore, many display devices can be formed at the same time at low cost. In addition, since the manufacturing temperature is low, a substrate having low heat resistance can be used. Therefore, the transistor can be formed using a light-transmitting substrate. Further, transmission of light in a display element can be controlled by using the transistor formed using the light-transmitting substrate. Alternatively, part of a film included in the transistor can transmit light because the thickness of the transistor is small. Therefore, the aperture ratio can be improved.

Note that by using a catalyst (e.g., nickel) in the case of forming polycrystalline silicon, crystallinity can be further improved and a transistor having excellent electrical characteristics can be formed. Accordingly, a gate driver circuit (e.g., a scan line driver circuit), a source driver circuit (e.g., a signal line driver circuit), and/or a signal processing circuit (e.g., a signal generation circuit, a gamma correction circuit, or a DA converter circuit) can be formed using the same substrate as a pixel portion.

Note that by using a catalyst (e.g., nickel) in the case of forming microcrystalline silicon, crystallinity can be further improved and a transistor having excellent electrical characteristics can be formed. In this case, crystallinity can be improved by just performing heat treatment without performing laser irradiation. Accordingly, a gate driver circuit (e.g., a scan line driver circuit) and part of a source driver circuit (e.g., an analog switch) can be formed using the same substrate as a pixel portion. In addition, in the case of not performing laser irradiation for crystallization, unevenness in crystallinity of silicon can be suppressed. Therefore, high-quality images can be displayed.

Note that polycrystalline silicon and microcrystalline silicon can be formed without use of a catalyst (e.g., nickel).

Note that it is preferable that crystallinity of silicon be improved to polycrystal, microcrystal, or the like in the whole panel; however, the present invention is not limited to this. Crystallinity of silicon may be improved only in part of the panel. Selective improvement in crystallinity is possible by selective laser irradiation or the like. For example, only a peripheral driver circuit region excluding pixels may be irradiated with laser light. Alternatively, only a region of a gate driver circuit, a source driver circuit, or the like may be irradiated with laser light. Alternatively, only part of a source driver circuit (e.g., an analog switch) may be irradiated with laser light. Accordingly, crystallinity of silicon can be improved only in a region in which a circuit needs to be operated at high speed. Since a pixel region is not particularly needed to be operated at high speed, even if crystallinity is not improved, the pixel circuit can be operated without problems. Since a region whose crystallinity is improved is small, manufacturing steps can be decreased, throughput can be increased, and manufacturing cost can be reduced. Since the number of necessary manufacturing apparatus is small, manufacturing cost can be reduced.

A transistor can be formed using a semiconductor substrate, an SOI substrate, or the like. Thus, a transistor with fewer variations in characteristics, sizes, shapes, or the like, with high current supply capability, and with a small size can be formed. By using such a transistor, power consumption of a circuit can be reduced or a circuit can be highly integrated.

A transistor including a compound semiconductor or an oxide semiconductor, such as ZnO, a-InGaZnO, SiGe, GaAs, IZO, ITO, SnO, TiO, or AlZnSnO (AZTO), a thin film transistor obtained by thinning such a compound semiconductor or an oxide semiconductor, or the like can be used. Thus, manufacturing temperature can be lowered and for example, such a transistor can be formed at room temperature. Accordingly, the transistor can be formed directly on a substrate having low heat resistance, such as a plastic substrate or a film substrate. Note that such a compound semiconductor or an oxide semiconductor can be used not only for a channel formation region of the transistor but also for other applications. For example, such a compound semiconductor or an oxide semiconductor can be used for a resistor, a pixel electrode, or a light-transmitting electrode. Further, since such an element can be formed at the same time as the transistor, cost can be reduced.

A transistor or the like formed by an inkjet method or a printing method can be used. Thus, a transistor can be formed at room temperature, can be formed at a low vacuum, or can be formed using a large substrate. Since the transistor can be formed without use of a mask (reticle), the layout of the transistor can be easily changed. Further, since it is not necessary to use a resist, material cost is reduced and the number of steps can be reduced. Furthermore, since a film is formed only in a necessary portion, a material is not wasted as compared to a manufacturing method by which etching is performed after the film is formed over the entire surface, so that cost can be reduced.

A transistor or the like including an organic semiconductor or a carbon nanotube can be used. Thus, such a transistor can be formed over a flexible substrate. A semiconductor device formed using such a substrate can resist shocks.

Further, transistors with a variety of structures can be used. For example, a MOS transistor, a junction transistor, a bipolar transistor, or the like can be used as a transistor. By using a MOS transistor, the size of the transistor can be reduced. Thus, a plurality of transistors can be mounted. By using a bipolar transistor, large current can flow. Thus, a circuit can be operated at high speed.

Note that a MOS transistor, a bipolar transistor, and the like may be formed over one substrate. Thus, reduction in power consumption, reduction in size, high-speed operation, and the like can be achieved.

Furthermore, a variety of transistors can be used.

Note that a transistor can be formed using a variety of substrates, without limitation to a certain type. As the substrate, a single crystal substrate (e.g., a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, or the like can be used, for example. As a glass substrate, a barium borosilicate glass substrate, an aluminoborosilicate glass substrate, or the like can be used, for example. For a flexible substrate, a flexible synthetic resin such as plastics typified by polyethylene terephthalate (PET), polyethylene naphthalate (PEN), and polyether sulfone (PES), or acrylic can be used, for example. Alternatively, an attachment film (formed using polypropylene, polyester, vinyl, polyvinyl fluoride, polyvinyl chloride, or the like), paper of a fibrous material, a base material film (formed using polyester, polyamide, polyimide, an inorganic vapor deposition film, paper, or the like), or the like can be used. Alternatively, the transistor may be formed using one substrate, and then, the transistor may be transferred to another substrate. A single crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to which the transistor is transferred. Alternatively, a skin (e.g., epidermis or corium) or hypodermal tissue of an animal such as a human being can be used as a substrate to which the transistor is transferred. Alternatively, the transistor may be formed using one substrate and the substrate may be thinned by polishing. A single crystal substrate, an SOI substrate, a glass substrate, a quartz substrate, a plastic substrate, a stainless steel substrate, a substrate including a stainless steel foil, or the like can be used as a substrate to be polished. By using such a substrate, a transistor with excellent properties or a transistor with low power consumption can be formed, a device with high durability and high heat resistance can be provided, or reduction in weight or thickness can be achieved.

Note that the structure of a transistor can be a variety of structures, without limitation to a certain structure. For example, a multi-gate structure having two or more gate electrodes can be used. By using the multi-gate structure, a structure where a plurality of transistors are connected in series is provided because channel regions are connected in series. With the multi-gate structure, the amount of off-state current can be reduced and the withstand voltage of the transistor can be increased (reliability can be improved). Further, with the multi-gate structure, drain-source current does not fluctuate very much even when drain-source voltage fluctuates when the transistor operates in a saturation region, so that a flat slope of voltage-current characteristics can be obtained. By utilizing the flat slope of the voltage-current characteristics, an ideal current source circuit or an active load having an extremely large resistance value can be realized. Accordingly, a differential circuit or a current mirror circuit having excellent properties can be realized.

As another example, a structure where gate electrodes are formed above and below a channel can be used. By using the structure where gate electrodes are formed above and below the channel, a channel region is increased, so that the amount of current can be increased. Alternatively, by using the structure where gate electrodes are formed above and below the channel, a depletion layer can be easily formed, so that subthreshold swing can be improved. Note that when the gate electrodes are formed above and below the channel, a structure where a plurality of transistors are connected in parallel is provided.

A structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be used. Alternatively, a structure where a source electrode or a drain electrode overlaps with a channel region (or part of it) can be used. By using the structure where the source electrode or the drain electrode overlaps with the channel region (or part of it), unstable operation due to accumulation of electric charge in part of the channel region can be prevented. Alternatively, a structure where an LDD region is provided can be used. By providing the LDD region, the amount of off-state current can be reduced or the withstand voltage of the transistor can be increased (reliability can be improved). Further, by providing the LDD region, drain-source current does not fluctuate very much even when drain-source voltage fluctuates when the transistor operates in the saturation region, so that a flat slope of voltage-current characteristics can be obtained.

Note that a variety of transistors can be used as a transistor, and the transistor can be formed using a variety of substrates. Accordingly, all the circuits that are necessary to realize a predetermined function can be formed using the same substrate. For example, all the circuits that are necessary to realize the predetermined function can be formed using a glass substrate, a plastic substrate, a single crystal substrate, an SOI substrate, or any other substrate. When all the circuits that are necessary to realize the predetermined function are formed using the same substrate, cost can be reduced by reduction in the number of components or reliability can be improved by reduction in the number of connections to circuit components. Alternatively, some of the circuits which are necessary to realize the predetermined function can be formed using one substrate and some of the circuits which are necessary to realize the predetermined function can be formed using another substrate. That is, not all the circuits that are necessary to realize the predetermined function are required to be formed using the same substrate. For example, some of the circuits which are necessary to realize the predetermined function can be formed by transistors using a glass substrate and some of the circuits which are necessary to realize the predetermined function can be formed using a single crystal substrate, so that an IC chip formed by a transistor using the single crystal substrate can be connected to the glass substrate by COG (chip on glass) and the IC chip may be provided over the glass substrate. Alternatively, the IC chip can be connected to the glass substrate by TAB (tape automated bonding) or a printed wiring board. When some of the circuits are formed using the same substrate in this manner, cost can be reduced by reduction in the number of components or reliability can be improved by reduction in the number of connections to circuit components. Alternatively, when circuits with high driving voltage and high driving frequency, which consume large power, are formed using a single crystal substrate instead of forming such circuits using the same substrate, and an IC chip formed by the circuits is used, for example, the increase in power consumption can be prevented.

Note that one pixel corresponds to one element whose brightness can be controlled. Therefore, for example, one pixel corresponds to one color element and brightness is expressed with the one color element. Accordingly, in that case, in the case of a color display device having color elements of R (red), G (green), and B (blue), the minimum unit of an image is formed of three pixels of an R pixel, a G pixel, and a B pixel. Note that the color elements are not limited to three colors, and color elements of more than three colors may be used or a color other than RGB may be used. For example, RGBW (W corresponds to white) can be used by adding white. Alternatively, one or more colors of yellow, cyan, magenta, emerald green, vermilion, and the like can be added to RGB. Alternatively, a color similar to at least one of R, G, and B can be added to RGB. For example, R, G, B1, and B2 may be used. Although both B1 and B2 are blue, they have slightly different frequencies. In a similar manner, R1, R2, G, and B can be used. By using such color elements, display which is closer to the real object can be performed and power consumption can be reduced. As another example, in the case of controlling brightness of one color element by using a plurality of regions, one region can correspond to one pixel. Therefore, for example, in the case of performing area ratio gray scale display or in the case of including a subpixel, a plurality of regions which control brightness are provided in each color element and gray levels are expressed with the whole regions. In this case, one region which controls brightness can correspond to one pixel. Thus, in that case, one color element includes a plurality of pixels. Alternatively, even when the plurality of regions which control brightness are provided in one color element, these regions may be collected and one color element may be referred to as one pixel. Thus, in that case, one color element includes one pixel. Alternatively, in the case where brightness is controlled in a plurality of regions in each color element, the size of regions which contribute to display is varied depending on pixels in some cases. Alternatively, in the plurality of regions which control brightness in each color element, signals supplied to each of the plurality of regions may be slightly varied so that the viewing angle is widened. That is, potentials of pixel electrodes included in the plurality of regions provided in each color element can be different from each other. Accordingly, voltage applied to liquid crystal molecules are varied depending on the pixel electrodes. Therefore, the viewing angle can be widened.

Note that explicit description "one pixel (for three colors)" corresponds to the case where three pixels of R, G, and B are considered as one pixel. Explicit description "one pixel (for one color)" corresponds to the case where the plurality of regions are provided in each color element and collectively considered as one pixel.

Note that pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. Thus, for example, in the case of performing full color display with three color elements (e.g., RGB), the following cases are included: the case where the pixels are arranged in stripes and the case where dots of the three color elements are arranged in a delta pattern. In addition, the case is also included in which dots of the three color elements are provided in Bayer arrangement. Note that the size of display regions may be different between dots of color elements. Thus, power consumption can be reduced or the life of a display element can be prolonged.

Note that an active matrix method in which an active element is included in a pixel or a passive matrix method in which an active element is not included in a pixel can be used.

In an active matrix method, as an active element (a non-linear element), not only a transistor but also a variety of active elements (non-linear elements) can be used. For example, an MIM (metal insulator metal), a TFD (thin film diode), or the like can also be used. Since such an element has a small number of manufacturing steps, manufacturing cost can be reduced or yield can be improved. Further, since the size of the element is small, the aperture ratio can be improved, so that power consumption can be reduced or higher luminance can be achieved.

Note that as a method other than the active matrix method, a passive matrix method in which an active element (a non-linear element) is not used can be used. Since an active element (a non-linear element) is not used, the number of manufacturing steps is small, so that manufacturing cost can be reduced or yield can be improved. Further, since an active element (a non-linear element) is not used, the aperture ratio can be improved, so that power consumption can be reduced or higher luminance can be achieved.

Note that a transistor is an element having at least three terminals of a gate, a drain, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Thus, a region which serves as a source and a drain is not referred to as a source or a drain in some cases. In that case, one of the source and the drain might be referred to as a first terminal and the other of the source and the drain might be referred to as a second terminal, for example. Alternatively, one of the source and the drain might be referred to as a first electrode and the other of the source and the drain might be referred to as a second electrode. Alternatively, one of the source and the drain might be referred to as a first region and the other of the source and the drain might be referred to as a second region.

Note that a transistor may be an element having at least three terminals of a base, an emitter, and a collector. In this case, in a similar manner, one of the emitter and the collector might be referred to as a first terminal and the other of the emitter and the collector might be referred to as a second terminal.

Note that a gate corresponds to all or some of a gate electrode and a gate wiring (also referred to as a gate line, a gate signal line, a scan line, a scan signal line, or the like). A gate electrode corresponds to part of a conductive film which overlaps with a semiconductor which forms a channel region with a gate insulating film interposed therebetween. Note that part of the gate electrode overlaps with an LDD (lightly doped drain) region or a source region (or a drain region) with the gate insulating film interposed therebetween in some cases. A gate wiring corresponds to a wiring for connecting gate electrodes of transistors to each other, a wiring for connecting gate electrodes of pixels to each other, or a wiring for connecting a gate electrode to another wiring.

However, there is a portion (a region, a conductive layer, a wiring, or the like) which serves as both a gate electrode and a gate wiring. Such a portion (a region, a conductive layer, a wiring, or the like) may be referred to as either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive layer, wiring, or the like) serves as both a gate wiring and a gate electrode. Thus, such a portion (a region, a conductive layer, a wiring, or the like) may be referred to as either a gate electrode or a gate wiring.

Note that a portion (a region, a conductive layer, a wiring, or the like) which is formed using the same material as a gate electrode, forms the same island as the gate electrode, and is connected to the gate electrode may be referred to as a gate electrode. In a similar manner, a portion (a region, a conductive layer, a wiring, or the like) which is formed using the same material as a gate wiring, forms the same island as the gate wiring, and is connected to the gate wiring may be referred to as a gate wiring. In a strict sense, such a portion (a region, a conductive layer, a wiring, or the like) does not overlap with a channel region or does not have a function of connecting the gate electrode to another gate electrode in some cases. However, there is a portion (a region, a conductive layer, a wiring, or the like) which is formed using the same material as a gate electrode or a gate wiring, forms the same island as the gate electrode or the gate wiring, and is connected to the gate electrode or the gate wiring because of specifications or the like in manufacturing. Thus, such a portion (a region, a conductive layer, a wiring, or the like) may be referred to as either a gate electrode or a gate wiring.

Note that in a multi-gate transistor, for example, a gate electrode is connected to another gate electrode by using a conductive layer which is formed using the same material as the gate electrode in many cases. Since such a portion (a region, a conductive layer, a wiring, or the like) is a portion (a region, a conductive layer, a wiring, or the like) for connecting the gate electrode to another gate electrode, the portion may be referred to as a gate wiring, or the portion may be referred to as a gate electrode because a multi-gate transistor can be considered as one transistor. That is, a portion (a region, a conductive layer, a wiring, or the like) which is formed using the same material as a gate electrode or a gate wiring, forms the same island as the gate electrode or the gate wiring, and is connected to the gate electrode or the gate wiring may be referred to as either a gate electrode or a gate wiring. In addition, for example, part of a conductive layer which connects the gate electrode and the gate wiring and is formed using a material which is different from that of the gate electrode or the gate wiring may be referred to as either a gate electrode or a gate wiring.

Note that a gate terminal corresponds to part of a portion (a region, a conductive layer, a wiring, or the like) of a gate electrode or part of a portion (a region, a conductive layer, a wiring, or the like) which is electrically connected to the gate electrode.

In the case where a wiring is referred to as a gate wiring, a gate line, a gate signal line, a scan line, a scan signal line, or the like, a gate of a transistor is not connected to the wiring in some cases. In this case, the gate wiring, the gate line, the gate signal line, the scan line, or the scan signal line corresponds to a wiring formed in the same layer as the gate of the transistor, a wiring formed using the same material of the gate of the transistor, or a wiring formed at the same time as the gate of the transistor in some cases. As examples, there are a wiring for a storage capacitor, a power supply line, a reference potential supply line, and the like.

Note that a source corresponds to all or some of a source region, a source electrode, and a source wiring (also referred to as a source line, a source signal line, a data line, a data signal line, or the like). A source region corresponds to a semiconductor region containing a large amount of p-type impurities (e.g., boron or gallium) or n-type impurities (e.g., phosphorus or arsenic). Therefore, a region containing a small amount of p-type impurities or n-type impurities, namely, an LDD (lightly doped drain) region is not included in the source region. A source electrode is part of a conductive layer which is formed using a material different from that of a source region and is electrically connected to the source region. However, a source electrode and a source region are collectively referred to as a source electrode in some cases. A source wiring corresponds to a wiring for connecting source electrodes of transistors to each other, a wiring for connecting source electrodes of pixels to each other, or a wiring for connecting a source electrode to another wiring.

However, there is a portion (a region, a conductive layer, a wiring, or the like) which serves as both a source electrode and a source wiring. Such a portion (a region, a conductive layer, a wiring, or the like) may be referred to as either a source electrode or a source wiring. That is, there is a region where a source electrode and a source wiring cannot be clearly distinguished from each other. For example, in the case where a source region overlaps with part of an extended source wiring, the overlapped portion (region, conductive layer, wiring, or the like) serves as both a source wiring and a source electrode. Thus, such a portion (a region, a conductive layer, a wiring, or the like) may be referred to as either a source electrode or a source wiring.

Note that a portion (a region, a conductive layer, a wiring, or the like) which is formed using the same material as a source electrode, forms the same island as the source electrode, and is connected to the source electrode, or a portion (a region, a conductive layer, a wiring, or the like) which connects a source electrode and another source electrode may be referred to as a source electrode. Further, a portion which overlaps with a source region may be referred to as a source electrode. In a similar manner, a region which is formed using the same material as a source wiring, forms the same island as the source wiring, and is connected to the source wiring may be referred to as a source wiring. In a strict sense, such a portion (a region, a conductive layer, a wiring, or the like) does not have a function of connecting the source electrode to another source electrode in some cases. However, there is a portion (a region, a conductive layer, a wiring, or the like) which is formed using the same material as a source electrode or a source wiring, forms the same island as the source electrode or the source wiring, and is connected to the source electrode or the source wiring because of specifications or the like in manufacturing. Thus, such a portion (a region, a conductive layer, a wiring, or the like) may be referred to as either a source electrode or a source wiring.

For example, part of a conductive layer which connects the source electrode and the source wiring and is formed using a material which is different from that of the source electrode or the source wiring may be referred to as either a source electrode or a source wiring.

Note that a source terminal corresponds to part of a source region, part of a source electrode, or part of a portion (a region, a conductive layer, a wiring, or the like) which is electrically connected to the source electrode.

In the case where a wiring is referred to as a source wiring, a source line, a source signal line, a data line, a data signal line, or the like, a source (a drain) of a transistor is not connected to a wiring in some cases. In this case, the source wiring, the source line, the source signal line, the data line, or the data signal line corresponds to a wiring formed in the same layer as the source (the drain) of the transistor, a wiring formed using the same material of the source (the drain) of the transistor, or a wiring formed at the same time as the source (the drain) of the transistor in some cases. As examples, there are a wiring for a storage capacitor, a power supply line, a reference potential supply line, and the like.

Note that the same can be said for a drain.

Note that a semiconductor device corresponds to a device having a circuit including a semiconductor element (e.g., a transistor, a diode, or a thyristor). The semiconductor device may also correspond to all devices that can function by utilizing semiconductor properties. In addition, the semiconductor device corresponds to a device having a semiconductor material.

Note that a display device corresponds to a device having a display element. The display device may include a plurality of pixels each having a display element. Note that that the display device may include a peripheral driver circuit for driving the plurality of pixels. The peripheral driver circuit for driving the plurality of pixels may be formed using the same substrate as the plurality of pixels. The display device may include a peripheral driver circuit provided over a substrate by wire bonding or bump bonding, namely, an IC chip connected by chip on glass (COG) or an IC chip connected by TAB or the like. The display device may include a flexible printed circuit (FPC) to which an IC chip, a resistor, a capacitor, an inductor, a transistor, or the like is attached. Note that the display device may include a printed wiring board (PWB) which is connected through a flexible printed circuit (FPC) and to which an IC chip, a resistor, a capacitor, an inductor, a transistor, or the like is attached. The display device may include an optical sheet such as a polarizing plate or a retardation plate. The display device may include a lighting device, a housing, an audio input and output device, an optical sensor, or the like.

Note that a lighting device may include a backlight unit, a light guide plate, a prism sheet, a diffusion sheet, a reflective sheet, a light source (e.g., an LED or a cold cathode fluorescent lamp), a cooling device (e.g., a water cooling device or an air cooling device), or the like.

Note that a light-emitting device corresponds to a device having a light-emitting element or the like. In the case where a light-emitting device includes a light-emitting element as a display element, the light-emitting device is one of specific examples of a display device.

Note that a reflective device corresponds to a device having a light-reflective element, a light diffraction element, light-reflective electrode, or the like.

Note that a liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like.

Note that a driving device corresponds to a device having a semiconductor element, an electric circuit, or an electronic circuit. For example, a transistor which controls input of signals from a source signal line to pixels (also referred to as a selection transistor, a switching transistor, or the like), a transistor which supplies voltage or current to a pixel electrode, a transistor which supplies voltage or current to a light-emitting element, and the like are examples of the driving device. A circuit which supplies signals to a gate signal line (also referred to as a gate driver, a gate line driver circuit, or the like), a circuit which supplies signals to a source signal line (also referred to as a source driver, a source line driver circuit, or the like), and the like are also examples of the driving device.

Note that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

Note that when it is explicitly described that "B is formed on A" or "B is formed over A", it does not necessarily mean that B is formed in direct contact with A. The description includes the case where A and B are not in direct contact with each other, i.e., the case where another object is interposed between A and B. Here, each of A and B is an object (e.g., a device, an element, a circuit, a wiring, an electrode, a terminal, a conductive film, or a layer).

Accordingly, for example, when it is explicitly described that "a layer B is formed on (or over) a layer A", it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., a layer C or a layer D) may be a single layer or a plurality of layers.

In a similar manner, when it is explicitly described that "B is formed above A", it does not necessarily mean that B is formed in direct contact with A, and another object may be interposed therebetween. Thus, for example, when it is described that "a layer B is formed above a layer A", it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., a layer C or a layer D) may be a single layer or a plurality of layers.

Note that when it is explicitly described that "B is formed on A", "B is formed over A", or "B is formed above A", it includes the case where B is formed obliquely over/above A.

Note that the same can be said when it is described that "B is formed under A" or "B is formed below A".

Note that when an object is explicitly described in a singular form, the object is preferably singular. Note that the present invention is not limited to this, and the object can be plural. In a similar manner, when an object is explicitly described in a plural form, the object is preferably plural. Note that the present invention is not limited to this, and the object can be singular.

Note that size, the thickness of layers, or regions in the drawings are exaggerated for simplicity in some cases. Thus, the embodiments of the present invention are not limited to such scales illustrated in the drawings.

Note that the drawings are perspective views of ideal examples, and shapes or values are not limited to those illustrated in the drawings. For example, the following can be included: variation in shape due to a manufacturing technique; variation in shape due to an error; variation in signal, voltage, or current due to noise; variation in signal, voltage, or current due to a difference in timing: or the like.

Note that technical terms are used in order to describe a specific embodiment, example, or the like in many cases. There are no limitations to terms.

Note that terms which are not defined (including terms used for science and technology, such as technical terms or academic parlance) can be used as terms which have meaning equal to general meaning that an ordinary person skilled in the art understands. It is preferable that terms defined by dictionaries or the like be construed as consistent meaning with the background of related art.

Note that terms such as "first", "second", "third", and the like are used for distinguishing various elements, members, regions, layers, and areas from others. Therefore, the terms such as "first", "second", "third", and the like do not limit the number of the elements, members, regions, layers, areas, or the like. Further, for example, "first" can be replaced with "second", "third", or the like.

Note that terms for describing spatial arrangement, such as "over", "above", "under", "below", "laterally", "right", "left", "obliquely", "behind", and "front" are often used for briefly showing a relationship between an element and another element or between a feature and another feature with reference to a diagram. Note that the embodiments of the present invention are not limited to this, and such terms for describing spatial arrangement can indicate not only the direction illustrated in a diagram but also another direction. For example, when it is explicitly described that "B is over A", it does not necessarily mean that B is placed over A, and can include the case where B is placed under A because a device in a diagram can be inverted or rotated by 180°. Accordingly, "over" can refer to the direction described by "under" in addition to the direction described by "over". Note that the embodiments of the present invention are not limited to this, and "over" can refer to any of the other directions described by "laterally", "right", "left", "obliquely", "behind", and "front" in addition to the directions described by "over" and "under" because the device in the diagram can be rotated in a variety of directions.

In one embodiment of the present invention, a light-transmitting transistor or a light-transmitting capacitor can be formed. Therefore, even in the case where a transistor or a capacitor is provided in a pixel, the aperture ratio can be improved because light can be transmitted also in a portion where the transistor and the capacitor are formed. Further, since a wiring for connecting the transistor and an element (e.g., a different transistor) to each other or a wiring for connecting the capacitor and an element (e.g., a different capacitor) can be formed using a material having low resistivity and high electric conductivity, waveform distortion of a signal can be suppressed and voltage drop due to wiring resistance can be reduced.

BRIEF DESCRIPTION OF THE DRAWINGS

In the accompanying drawings:

FIGS. 2A to 2H are cross-sectional views according to one embodiment of the present invention;

FIGS. 3A to 3F are cross-sectional views according to one embodiment of the present invention;

FIGS. 4A to 4F are cross-sectional views according to one embodiment of the present invention;

FIGS. 5A to 5F are cross-sectional views according to one embodiment of the present invention;

FIGS. 17A to 17F are cross-sectional views according to one embodiment of the present invention;

FIGS. 18A to 18F are cross-sectional views according to one embodiment of the present invention;

FIGS. 19A to 19D are cross-sectional views according to one embodiment of the present invention;

FIGS. 21A to 21D are cross-sectional views according to one embodiment of the present invention;

FIGS. 29A-1 to 29B are top views and a cross-sectional view according to one embodiment of the present invention;

DETAILED DESCRIPTION OF THE INVENTION

Figure 1A:
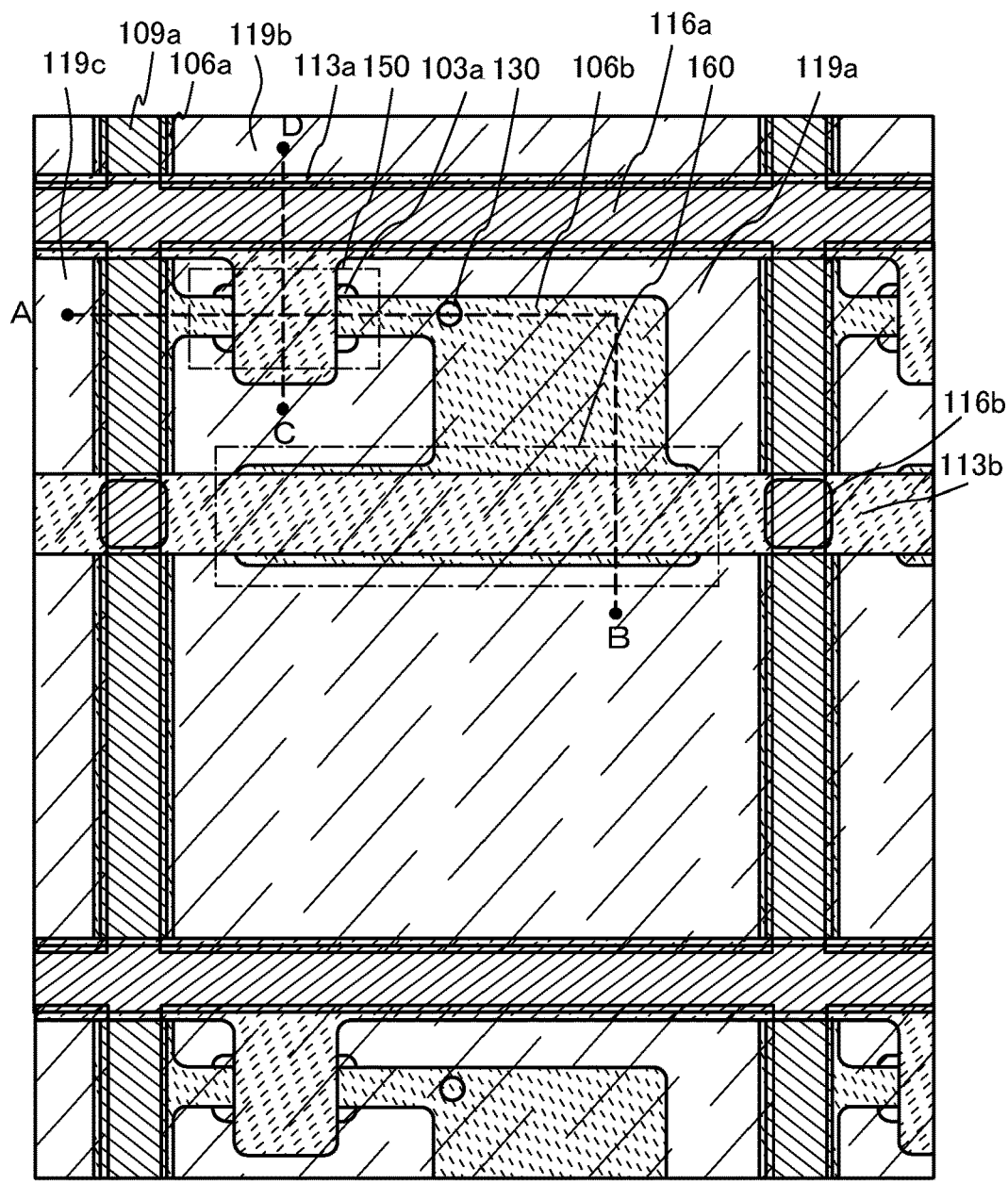
FIGS. 1A and 1B are a top view and a cross-sectional view according to one embodiment of the present invention.

Hereinafter, embodiments of the present invention will be described in detail with reference to the drawings. Note that the present invention is not limited to the following description. It will be readily appreciated by those skilled in the art that modes and details can be changed in various ways without departing from the spirit and scope of the present invention. Therefore, the present invention should not be construed as being limited to the following description of the embodiments.

In this specification, a film refers to what is formed over an entire surface and is not patterned. In addition, a layer refers to what is patterned into a desired shape with a resist mask or the like. Note that this distinction between "film" and "layer" is for convenience, and they are used without any distinction in some cases. Also as for each layer of a stacked film, a film and a layer are used without any distinction in some cases.

Note that in this specification, ordinal numbers such as "first", "second", and "third" are used for convenience in order to distinguish elements and do not limit the number, arrangement, and the order of steps.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted.

Therefore, for example, in a diagram (e.g., a cross-sectional view, a plan view, a circuit diagram, a block diagram, a flow chart, a process diagram, a perspective view, a cubic diagram, a layout diagram, a timing chart, a structure diagram, a schematic view, a graph, a list, a ray diagram, a vector diagram, a phase diagram, a waveform chart, a photograph, or a chemical formula) or a text in which one or more active elements (e.g., transistors or diodes), wirings, passive elements (e.g., capacitors or resistors), conductive layers, insulating layers, semiconductor layers, organic materials, inorganic materials, components, substrates, modules, devices, solids, liquids, gases, operating methods, manufacturing methods, or the like are described, part of the diagram or the text is taken out, and one embodiment of the invention can be constituted.

Embodiment 1

In this embodiment, semiconductor devices and manufacturing steps thereof are described with reference to FIGS. 1A and 1B, FIGS. 2A to 2H, FIGS. 3A to 3F, FIGS. 4A to 4F, FIGS. 5A to 5F, FIGS. 6A to 6C, FIGS. 7A to 7C, FIGS. 8A to 8C, FIG. 9, FIGS. 10A and 10B, FIGS. 11A and 11B, FIG. 12, FIGS. 13A and 13B, FIGS. 14A and 14B, and FIG. 15.

Figure 1B:
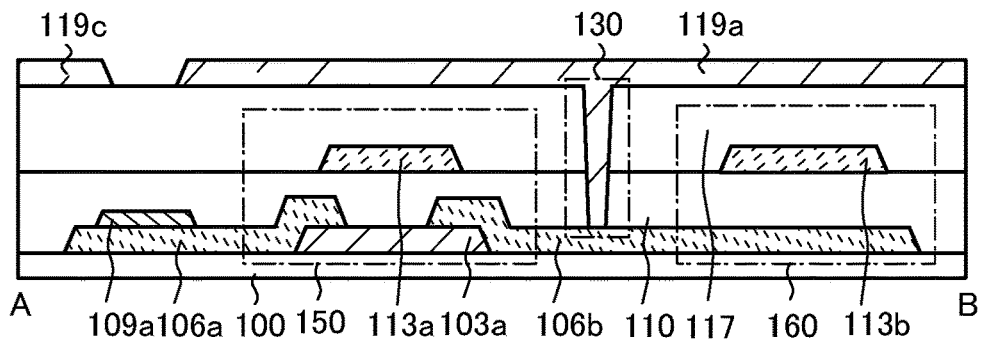

FIGS. 1A and 1B illustrate a semiconductor device in this embodiment. FIG. 1A is a top view, and FIG. 1B is a cross-sectional view taken along line A-B in FIG. 1A.

The semiconductor device illustrated in FIG. 1A includes a pixel portion which has a plurality of wirings (e.g., gate wirings and capacitor wirings) disposed in a first direction, a plurality of wirings (e.g., source wirings) disposed in a second direction, and a plurality of transistors disposed around intersections of the wirings. Note that the wirings disposed in the first direction and the wirings disposed in the second direction are preferably orthogonal to each other. Note that in this specification, a pixel portion refers to a region surrounded by a plurality of gate wirings and a plurality of source wirings.

A transistor 150 illustrated in FIGS. 1A and 1B includes a semiconductor layer 103a over a substrate 100 having an insulating surface, conductive layers 106a and 106b which are provided over the semiconductor layer 103a and function as a source electrode and a drain electrode, a gate insulating film 110 which is provided over the conductive layers 106a and 106b functioning as the source electrode and the drain electrode, and a conductive layer 113a which is provided over the gate insulating film 110 and functions as a gate electrode provided between the conductive layers 106a and 106b. Thus, the transistor 150 is a so-called top-gate transistor. However, the gate electrode may be provided below a channel (the semiconductor layer 103a). The semiconductor layer 103a preferably contains an oxide; however, this embodiment is not limited to this. It is acceptable for the semiconductor layer not to contain an oxide. For example, the semiconductor layer 103a can be formed using silicon, gallium arsenide, a compound semiconductor, an organic semiconductor, a carbon nanotube, or the like.

Further, parts or all of the semiconductor layer 103a, the conductive layer 113a functioning as the gate electrode, the conductive layer 106a and 106b functioning as the source electrode and the drain electrode, and the like which are included in the transistor 150 are formed using light-transmitting materials. By forming parts or all of the semiconductor layer, the conductive layers, and the like which are included in the transistor 150 with the use of light-transmitting materials in this manner, light can be transmitted in a portion where the transistor is formed. Thus, the aperture ration of the pixel portion can be improved.

In general, a wiring for connecting elements such as transistors to each other is formed by extending conductive layers used for a gate electrode, a source electrode, and a drain electrode, so that the wiring is formed in the same island as the conductive layers in many cases. Accordingly, a wiring for connecting a gate of a transistor to a gate of a different transistor (such a wiring is referred to as a gate wiring) is formed using the same layer structure or material as a gate electrode of the transistor in many cases; and a wiring for connecting a source of the transistor to a source of the different transistor (such a wiring is referred to as a source wiring) is formed using the same layer structure or material as a source electrode of the transistor in many cases. Therefore, in the case where the gate electrode, the source electrode, and the drain electrode are formed using light-transmitting materials, the gate wiring and the source wiring are formed using light-transmitting materials, like the gate electrode, the source electrode, and the drain electrode.

As compared to a material having light-blocking properties and reflecting properties, such as aluminum, molybdenum, titanium, tungsten, neodymium, copper, silver, or chromium, a light-transmitting material such as indium tin oxide, indium zinc oxide, or indium tin zinc oxide tends to have lower electric conductivity. Accordingly, when a wiring is formed using a light-transmitting material, wiring resistance becomes high. For example, in the case where a large display device is manufactured, wiring resistance becomes extremely high because a wiring is long. As wiring resistance increases, the waveform of a signal which is transmitted through the wiring is distorted, so that voltage which is supplied is lowered by voltage drop due to the wiring resistance. Therefore, it is difficult to supply accurate voltage and current, so that it might be difficult to perform normal display and operation.

Thus, a gate wiring which is electrically connected to the gate electrode of the transistor 150 is formed by stacking the light-transmitting conductive layer 113a and a light-blocking conductive layer 116a. In addition, a source wiring which is electrically connected to the source electrode or the drain electrode of the transistor 150 is formed by stacking the light-transmitting conductive layer 106a and a light-blocking conductive layer 109a. That is, the gate electrode of the transistor 150 is formed using part of the light-transmitting conductive layer 113a. Further, the source electrode or the drain electrode of the transistor 150 is formed using part of the light-transmitting conductive layer 106a.

It is preferable that the transmittance of the conductive layer 113a be sufficiently high. Further, the transmittance of the conductive layer 113a is preferably higher than the transmittance of the conductive layer 116a.

It is preferable that the resistivity of the conductive layer 116a be sufficiently low and the electric conductivity of the conductive layer 116a be sufficiently high. In addition, the resistivity of the conductive layer 116a is preferably lower than the resistivity of the conductive layer 113a. Note that since the conductive layer 116a functions as a conductive layer, the resistivity of the conductive layer 116a is preferably lower than the resistivity of an insulating layer.

When the gate wiring or the source wiring is formed by stacking the light-transmitting conductive layer and the light-blocking conductive layer, wiring resistance can be lowered. In addition, by lowering the wiring resistance, waveform distortion of a signal can be suppressed and voltage drop due to the wiring resistance can be reduced. Further, by reducing the voltage drop due to the wiring resistance, accurate voltage and current can be supplied. Thus, a large display device can be manufactured. Furthermore, since the gate wiring or the source wiring is formed using the light-blocking conductive layer, a space between pixels can be shielded from light. That is, with the gate wiring disposed in a row direction and the source wiring disposed in a column direction, the space between the pixels can be shielded from light without use of a black matrix. However, a black matrix can be used.

In addition, in terms of display performance, large capacitors and higher aperture ratio are demanded for pixels. Pixels each having high aperture ratio improve light use efficiency, so that power saving and miniaturization of a display device can be achieved. In recent years, the size of pixels has been made smaller and higher-definition images have been demanded. However, the decrease in the size of pixels results in a large formation area for transistors and wirings, which occupies one pixel, so that the aperture ratio of the pixel is lowered. Thus, in order to obtain high aperture ratio in each pixel in a specified size, it is necessary to lay out components needed for the circuit structure of the pixel efficiently.

A capacitor wiring according to one embodiment of the present invention is disposed in the same direction as the gate wiring and is preferably formed using a light-transmitting conductive layer 113b in the pixel region. In addition, part of the capacitor wiring, which overlaps with the source wiring, may be formed by stacking the light-transmitting conductive layer 113b and a light-blocking conductive layer 116b in order to increase electric conductivity. Further, a storage capacitor portion 160 is formed in the capacitor wiring. The storage capacitor portion 160 is connected to one of the source electrode and the drain electrode of the transistor 150 (the conductive layer 106b). The storage capacitor portion 160 includes the gate insulating film 110 as a dielectric, and the conductive layers 106b and 113b functioning as the electrodes. Note that since a capacitor is also formed between a pixel electrode and the conductive layer 113b, the capacitor also can be used as a storage capacitor.

In this embodiment, an example is described in which the width of the capacitor wiring and the width of the gate wiring are the same; however, the width of the capacitor wiring and the width of the gate wiring may be different from each other. The width of the capacitor wiring is preferably larger than the width of the gate wiring. When the width of the capacitor wiring is made larger, the area of the storage capacitor portion 160 can be increased.

By forming the storage capacitor portion 160 with the use of the light-transmitting conductive layers 106b and 113b as described above, light can be transmitted also in a portion where the storage capacitor portion 160 is formed. Thus, the aperture ratio can be improved. In addition, by forming the storage capacitor portion 160 with the use of the light-transmitting conductive layers, the storage capacitor portion 160 can be made larger without a decrease in the aperture ratio. Thus, even when the transistor is turned off, potential holding properties of the pixel electrode is improved and display quality is improved. Further, a feedthrough potential can be lowered. Alternatively, since noise immunity is improved, crosstalk can be reduced. Further, since accurate voltage can be supplied, flickers can be reduced. Efficient layout of circuit components needed for the circuit structure of the pixel is possible.

Further, the transistor 150 illustrated in FIGS. 1A and 1B can be used as a pixel transistor provided in a pixel portion of a liquid crystal display device or a light-emitting display device typified by an EL display device. Therefore, in FIGS. 1A and 1B, a contact hole 130 is provided in the gate insulating film 110 and an insulating film 117; pixel electrode layers (light-transmitting conductive layers 119a and 119c) are provided over the insulating film 117; and the pixel electrode layer (the light-transmitting conductive layer 119a) and the conductive layer 106b are connected to each other through the contact hole 130 provided in the gate insulating film 110 and the insulating film 117.

Next, an example of a manufacturing process of a semiconductor device is described with reference to FIGS. 2A to 2H, FIGS. 3A to 3F, FIGS. 4A to 4F, and FIGS. 5A to 5F.

First, an oxide semiconductor film 101 is formed over the substrate 100 having an insulating surface (see FIGS. 2A and 2B).

As the substrate 100 having an insulating surface, for example, a glass substrate which has visible-light-transmitting properties and is used in a liquid crystal display device or the like can be used. The glass substrate is preferably an alkali-free glass substrate. The non-alkali glass substrate is formed using a glass material such as aluminosilicate glass, aluminoborosilicate glass, or barium borosilicate glass, for example. Alternatively, as the substrate 100 having an insulating surface, an insulating substrate formed using an insulator, such as a ceramic substrate, a quartz substrate, or a sapphire substrate; a semiconductor substrate which is formed using a semiconductor material such as silicon and has a surface covered with an insulating material; a conductive substrate which is formed using a conductor such as metal or stainless steel and has a surface covered with an insulating material; or the like can be used. Note that a plastic substrate formed using polyethylene terephthalate (PET) or the like can be used.

An insulating film which serves as a base film may be provided over the substrate 100 having an insulating surface. The insulating film has a function of preventing diffusion of an impurity such as an alkali metal (e.g., Li, Cs, or Na), an alkaline earth metal (e.g., Ca or Mg), or a different metal element from the substrate 100. Note that the concentration of Na is $5\times10^{19}/cm^3$ or lower, preferably $1\times10^{18}/cm^3$ or lower. The insulating film can be formed to have a single-layer structure of a silicon nitride film, a silicon oxide film, a silicon nitride oxide film, a silicon oxynitride film, an aluminum oxide film, an aluminum nitride film, an aluminum oxynitride film, or an aluminum nitride oxide film; or a layered structure of any of the above films. A silicon oxide film is preferably provided over a silicon nitride film. With the silicon nitride film, diffusion of an impurity can be prevented sufficiently. Further, by providing a silicon oxide film thereover, the silicon nitride film can be prevented from being in contact with the semiconductor layer. This is because if the silicon nitride film is in contact with the semiconductor layer, the semiconductor layer might be hydrogenated. Note that this embodiment is not limited to this, and the silicon nitride film can be in contact with the semiconductor layer.

As an oxide semiconductor contained in the oxide semiconductor film 101, it is preferable to use an oxide semiconductor whose structural formula is represented by $InMO_3(ZnO)_m$ (m>0). In particular, it is preferable to use an In—Ga—Zn—O-based oxide semiconductor. Note that M is one or more metal elements selected from gallium (Ga), iron (Fe), nickel (Ni), manganese (Mn), or cobalt (Co). For example, M is Ga in some cases; meanwhile, Ga and the above metal element other than Ga, such as Ni or Fe, are contained in some cases. Further, in the oxide semiconductor, in some cases, a transitional metal element such as Fe or Ni or an oxide of the transitional metal is contained as an impurity element in addition to the metal element contained as M. In this specification, among the oxide semiconductors whose structural formulas are represented by $InMO_3(ZnO)_m$ (m>0), an oxide semiconductor whose structural formula includes at least Ga as M is referred to as an In—Ga—Zn—O-based oxide semiconductor, and a thin film containing the In—Ga—Zn—O-based oxide semiconductor is also referred to as an In—Ga—Zn—O-based non-single-crystal film.

By X-ray diffraction (XRD) spectrometry, an amorphous structure is observed as the crystal structure of the In—Ga—Zn-O based non-single-crystal film. Note that the In—Ga—Zn—O-based non-single-crystal film used as the sample in spectrometry is subjected to heat treatment at 200 to 500° C., typically 300 to 400° C., for 10 to 100 minutes after the film is formed by sputtering.

By using the In—Ga—Zn—O-based non-single-crystal film for an active layer of a thin film transistor, a thin film transistor having electrical characteristics of an on/off ratio of $10^9$ or more and a mobility of 10 cm$^2$/V·s or more at a gate voltage of ±20 V can be formed.

However, the oxide semiconductor film 101 is not limited to the oxide semiconductor film whose structural formula is represented by $InMO_3(ZnO)_m$ (m>0). For example, an oxide semiconductor film containing indium oxide ($InO_x$), zinc oxide ($ZnO_x$), tin oxide (SnO), indium zinc oxide (IZO), indium tin oxide (ITO), indium tin oxide containing silicon oxide (ITSO), zinc oxide to which gallium is added (GZO), or the like may be used.

The thickness of the oxide semiconductor film 101 is 50 nm or more, preferably 60 to 150 nm. Further, the oxide semiconductor film 101 might include a region whose thickness is smaller than those of regions where parts of the oxide semiconductor film 101 overlap with the conductive layers 106a and 106b. The region whose thickness is smaller is provided between the conductive layers 106a and 106b which are formed later and function as the source electrode and the drain electrode. This region is generated because part of the semiconductor layer 103a is etched when the conductive layers 106a and 106b are etched. Thus, when the thickness of the oxide semiconductor film 101 is 50 nm or more, a channel formation region can be prevented from being etched away.

The range of the carrier concentration of the oxide semiconductor film 101 is preferably lower than $1 \times 10^{17}/cm^3$ (more preferably $1 \times 10^{11}/cm^3$ or higher). When the carrier concentration of the oxide semiconductor film 101 exceeds the above range, the thin film transistor might be normally on.

An insulating impurity may be contained in the oxide semiconductor film 101. As the impurity, an insulating oxide typified by silicon oxide, germanium oxide, aluminum oxide, or the like; an insulating nitride typified by silicon nitride, aluminum nitride, or the like; or an insulating oxynitride such as silicon oxynitride or aluminum oxynitride is used.

The insulating oxide, the insulating nitride, or the insulating oxynitride is added to the oxide semiconductor at a concentration at which an electrical conducting property of the oxide semiconductor does not deteriorate.

When the insulating impurity is contained in the oxide semiconductor film 101, crystallization of the oxide semiconductor film 101 can be suppressed. By suppressing the crystallization of the oxide semiconductor film 101, characteristics of the thin film transistor can be stabilized.

For example, when an impurity such as silicon oxide is contained in the In—Ga—Zn—O-based oxide semiconductor, crystallization of the oxide semiconductor or generation of microcrystal grains can be prevented even when heat treatment at 300 to 600° C. is performed.

In the manufacturing process of a thin film transistor in which an In—Ga—Zn—O-based oxide semiconductor is used for its channel formation region, an S value (a subthreshold swing value) or field effect mobility can be improved by heat treatment. Even in such a case, the thin film transistor can be prevented from being normally on. Further, even in the case where heat stress or bias stress is applied to the thin film transistor, variations in the threshold voltage can be prevented.

As well as the above oxide semiconductors, any of the following oxide semiconductors can be used as the oxide semiconductor used for the oxide semiconductor film 101: an In—Sn—Zn—O-based oxide semiconductor; an In—Al—Zn—O-based oxide semiconductor; a Sn—Ga—Zn—O-based oxide semiconductor; an Al-Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. Further, by addition of an impurity which suppresses crystallization to keep an amorphous state to these oxide semiconductors, characteristics of the thin film transistor can be stabilized.

A semiconductor layer used in one embodiment of the present invention may have light-transmitting properties. As well as an oxide semiconductor, any of a crystalline semiconductor (a single crystal semiconductor or a polycrystalline semiconductor), an amorphous semiconductor, a microcrystalline semiconductor, an organic semiconductor, and the like may be used.

Note that in the case where the insulating film is formed over the substrate 100, plasma treatment may be performed on a surface of the insulating film before the oxide semiconductor film 101 is formed. By performing plasma treatment, dust (e.g., a particle) attached to the surface of the insulating film can be removed.

Note that when a pulsed direct current (DC) power source is used when the plasma treatment is performed, dust can be reduced and the thickness is made uniform, which is preferable. Further, by forming the oxide semiconductor film 101 without being exposed to the air after the plasma treatment is performed, attachment of dust or moisture to an interface between the insulating film and the oxide semiconductor film 101 can be suppressed.

Alternatively, a multi-target sputtering apparatus in which a plurality of targets formed using different materials can be set may be used as a sputtering apparatus. In a multi-target sputtering apparatus, a stack of different films can be formed in one chamber, or one film can be formed by sputtering using plural kinds of materials concurrently in one chamber. Alternatively, a method using a magnetron sputtering apparatus in which a magnetic field generating system is provided inside a chamber (magnetron sputtering), ECR sputtering in which plasma generated by using a microwave is used, or the like may be employed. Alternatively, reactive sputtering in which a target substance and a sputtering gas component chemically react with each other to form a compound thereof at the time of deposition, bias sputtering in which voltage is applied also to a substrate at the time of deposition, or the like may be employed.

Next, a resist mask 102 is formed over the oxide semiconductor film 101 and the oxide semiconductor film 101 is selectively etched using the resist mask 102, so that the island-shaped semiconductor layer 103a is formed (see FIGS. 2C and 2D). In the case of forming the resist mask by spin coating, large quantities of resist materials and a large amount of developing solutions are used in order to improve the uniformity of a resist film; thus, large quantities of surplus materials are consumed. In a deposition method using spin coating, an increase in the size of a substrate is particularly disadvantageous in mass production because a mechanism for rotating a large substrate is made larger and a loss and waste amount of a material liquid are large. Further, when a film is formed by spin-coating a rectangular substrate, circular unevenness with a rotating axis as a center is likely to appear in the film. Thus, it is preferable that a resist material film be selectively formed by a screen printing method or a droplet discharge method such as an ink jet method, and then a resist mask be formed through exposure. By forming the resist material film selectively, cost can be greatly reduced because reduction in consumption of the resist material can be achieved, and such a large substrate having a size of 1000 mm×1200 mm, 1100 mm×1250 mm, or 1150 mm×1300 mm can be used. However, this embodiment is not limited to this.

Wet etching or dry etching can be used as etching in this case. Here, an unnecessary portion of the oxide semiconductor film 101 is removed by wet etching using a mixed solution of acetic acid, nitric acid, and phosphoric acid, so that the island-shaped semiconductor layer 103a is formed. Note that after the etching, the resist mask 102 is removed. Further, an etchant used for the wet etching is not limited to the above as long as it can etch the oxide semiconductor film 101. When dry etching is performed, a gas containing chlorine or a gas containing chlorine, to which oxygen is added, is preferably used. This is because, by using a gas containing chlorine and oxygen, the etching selectivity of the oxide semiconductor film 101 to the insulating film serving as the base film is likely to be high, and the insulating film can be sufficiently prevented from being damaged.

In addition, as an etching apparatus used for the dry etching, an etching apparatus using reactive ion etching (RIE) or a dry etching apparatus using a high-density plasma source such as ECR (electron cyclotron resonance) or ICP (inductively coupled plasma) can be used. Furthermore, as a dry etching apparatus by which electric discharge is likely to be homogeneous in a large area as compared to an ICP etching apparatus, there is an ECCP (enhanced capacitively coupled plasma) mode etching apparatus in which an upper electrode is grounded, a high-frequency power source of 13.56 MHz is connected to a lower electrode, and a low-frequency power source of 3.2 MHz is connected to the lower electrode. This ECCP mode etching apparatus can be applied, for example, even when a substrate of the tenth generation with a size larger than 3 m is used.

After that, heat treatment is preferably performed at 200 to 600° C., typically 300 to 500° C. Here, heat treatment is performed at 350° C. for 1 hour in a nitrogen atmosphere. Through this heat treatment, rearrangement at the atomic level is caused in the In-Ga—Zn—O-based oxide semiconductor included in the semiconductor layer 103a. This heat treatment (including light annealing or the like) is important because the strain which inhibits the movement of carriers in the semiconductor layer 103a can be released. Note that timing at which the heat treatment is performed is not particularly limited to certain timing as long as it is after the formation of the semiconductor layer 103a.

Next, a conductive film 104 is formed over the island-shaped semiconductor layer 103a (see FIGS. 2E and 2F).

As the conductive film 104, indium tin oxide (ITO), indium tin oxide containing silicon oxide (ITSO), organoindium, organotin, zinc oxide (ZnO), titanium nitride, or the like can be used. Alternatively, indium zinc oxide (IZO) containing zinc oxide, zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used. The conductive film 104 can be formed to have a single-layer structure or a layered structure of such a material by sputtering. Note that in the case of the layered structure, the transmittance of each of a plurality of films is preferably high enough.

Next, resist masks 105a and 105b are formed over the conductive film 104 and the conductive film 104 is selectively etched using the resist masks 105a and 105b, so that the conductive layers 106a and 106b functioning as the source electrode and the drain electrode are formed (see FIGS. 2G and 2H). Note that the resist masks 105a and 105b are removed after the etching. In this case, in order to improve coverage with the gate insulating film 110 which is formed later and to prevent breakage, the etching is preferably performed so that end portions of the conductive layers 106a and 106b functioning as the source electrode and the drain electrode are tapered. Note that the source electrode or the drain electrode includes the electrode and the wiring formed using the conductive film, such as the source wiring.

Next, a conductive film 107 is formed over the island-shaped semiconductor layer 103a and the conductive layers 106a and 106b (see FIGS. 3A and 3B).

The conductive film 107 can be formed to have a single-layer structure or a layered structure of a metal material such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), chromium (Cr), antimony (Sb), niobium (Nb), or cerium (Ce); an alloy material containing any of the above metal materials as its main component; or a nitride containing any of the above metal materials as its component. The conductive film 107 is preferably formed using a low-resistant conductive material such as aluminum.

In the case where the conductive film 107 is formed over the conductive layers 106a and 106b (or the conductive film 104), both the films react with each other in some cases. For example, in the case where the conductive layers 106a and 106b are formed using ITO and the conductive film 107 is formed using aluminum, chemical reaction occurs therebetween in some cases. Accordingly, in order to avoid such chemical reaction, a high-melting point material is preferably used between the conductive layers 106a and 106b and the conductive film 107. For example, as the high-melting point material, molybdenum, titanium, tungsten, tantalum, chromium, or the like can be used. Further, it is preferable to form the conductive layers 106a and 106b as a multi-layer film by using a material having high electric conductivity over the film formed using the high-melting point material. As the material having high electric conductivity, aluminum, copper, silver, or the like can be used. For example, in the case where the conductive layers 106a and 106b are formed to have a layered structure, a stack of molybdenum as a first layer, aluminum as a second layer, and molybdenum as a third layer, or a stack of molybdenum as a first layer, aluminum containing a small amount of neodymium as a second layer, and molybdenum as a third layer can be used. With such a structure, generation of hillocks can be prevented. Note that the thickness of the light-transmitting conductive layer is preferably smaller than the thickness of the light-blocking conductive layer. However, this embodiment is not limited to this.

Next, a resist mask 108 is formed over the conductive film 107 and the conductive film 107 is selectively etched using the resist mask 108, so that the conductive layer 109a is formed (see FIGS. 3C and 3D). After the etching, the resist mask 108 is removed. Accordingly, part of the conductive film 107, over which the resist mask 108 is not formed, is removed, so that the conductive layer 106a is exposed. Thus, the surface areas of the conductive layer 109a and the conductive layer 106a are different from each other. That is, the surface area of the conductive layer 106a is larger than the surface area of the conductive layer 109a. Alternatively, as for the conductive layers 109a and 106a, there are a region where the conductive layers 109a and 106a overlap with each other and a region where the conductive layers 109a and 106a do not overlap with each other.

In the region where the conductive layers 109a and 106a overlap with each other, the conductive layers 106a and 109a function as the source wiring. In the region where the conductive layers 106a and 109a do not overlap with each other, the conductive layer 106a functions as the source electrode or the drain electrode. By forming the conductive layer 106a functioning as the source electrode or the drain electrode with the use of a light-transmitting conductive material, light can be transmitted also in a portion where the source electrode or the drain electrode is formed; therefore, the aperture ratio of a pixel can be improved. In addition, by forming the conductive layer 109a with the use of a material which has higher electric conductivity than a material used for the conductive layer 106a, wiring resistance of the source wiring can be reduced, and power consumption can be reduced. Further, since the source wiring is formed using the light-blocking conductive layer, a space between pixels can be shielded from light. Further, contrast can be improved.

Note that although the step in which the conductive layer 109a is formed after the conductive layers 106a and 106b are formed is described, the order of formation may be inverted. In other words, after the conductive layer 109a which is part of the source wiring is formed, the conductive layers 106a and 106b which function as the source electrode and the drain electrode can be formed (see FIG. 7B).

Further, the conductive layer 106b functions also as an electrode of the storage capacitor portion 160.

Next, after the gate insulating film 110 is formed so as to cover the conductive layers 106a and 106b, a conductive film 111 is formed (see FIGS. 3E and 3F).

The gate insulating film 110 can be formed to have a single layer or a stacked layer of a silicon oxide film, a silicon oxynitride film, a silicon nitride film, a silicon nitride oxide film, an aluminum oxide film, an aluminum nitride film, an aluminum oxynitride film, an aluminum nitride oxide film, or a tantalum oxide film. The gate insulating film 110 can be formed to a thickness of 50 to 250 nm by sputtering, CVD, or the like. For example, as the gate insulating film 110, a 100-nm-thick silicon oxide film can be formed by sputtering. Alternatively, a 100-nm-thick aluminum oxide film can be formed by sputtering.

By forming the gate insulating film 110 as a dense film, moisture or oxygen can be prevented from entering the semiconductor layer 103a from the substrate 100 side. In addition, an impurity included in the substrate 100, such as an alkali metal (e.g., Li, Cs, or Na), an alkaline earth metal (e.g., Ca or Mg), or a different metal element, can be prevented from entering the semiconductor layer 103a. Note that the concentration of Na is $5\times10^{19}/cm^3$ or lower, preferably $1\times10^{18}/cm^3$ or lower. Therefore, variations in semiconductor properties of the semiconductor device in which an oxide semiconductor is used can be suppressed. Further, reliability of the semiconductor device can be improved.

The gate insulating film 110 can be formed to have a single-layer structure or a layered structure of any of an insulating film containing oxygen and/or nitrogen, such as silicon oxide, silicon nitride, silicon oxynitride, or silicon nitride oxide; a film containing carbon such as DLC (diamond-like carbon); and a film formed using an organic material such as epoxy, polyimide, polyamide, polyvinyl phenol, benzocyclobutene, or acrylic, or a siloxane material such as a siloxane resin.

Note that the gate insulating film 110 preferably has light-transmitting properties.

The conductive film 111 is preferably formed using a material which is substantially the same as the material used for the conductive film 104. However, this embodiment is not limited to this. Substantially the same material is a material whose element of a main component is the same as that of the material used for the conductive film 104. In terms of impurities, the kind and the concentration of elements contained are different from each other in some cases. In the case where the conductive film 111 is formed using the material which is substantially the same as the material used for the conductive film 104 by sputtering, evaporation, or the like in this manner, there is an advantage that the material can be shared between the conductive films 111 and 104. In the case where the material is shared between the conductive films 111 and 104, the same manufacturing apparatus can be used, manufacturing steps can proceed smoothly, and throughput can be improved, which leads to reduction in cost.

Next, resist masks 112a and 112b are formed over the conductive film 111 and the conductive film 111 is selectively etched using the resist masks 112a and 112b, so that conductive layers 113a and 113b are formed (see FIGS. 4A and 4B). Note that after the etching, the resist masks 112a and 112b are removed.

Next, a conductive film 114 is formed over the conductive layers 113a and 113b and the gate insulating film 110 (see FIGS. 4C and 4D).

The conductive film 114 can be formed to have a single-layer structure or a layered structure of a metal material such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), chromium (Cr), antimony (Sb), niobium (Nb), or cerium (Ce); an alloy material containing any of the above metal materials as its main component; or a nitride containing any of the above metal materials as its component. The conductive film 114 is preferably formed using a low-resistant conductive material such as aluminum.

Further, the conductive film 114 is preferably formed using a material which is different from the material used for the conductive film 107. Alternatively, the conductive film 114 is preferably formed to have a layered structure which is different from the layered structure of the conductive film 107. This is because in manufacturing steps of the semiconductor device, temperatures of heat applied to the conductive film 114 and the conductive film 107 are different from each other in many cases. In general, the conductive film 107 tends to have higher temperature. Accordingly, the conductive film 107 is preferably formed using a material or a layered structure having higher melting point. Alternatively, the conductive film 107 is preferably formed using a material or a layered structure in which hillocks are less likely to occur. Alternatively, since the conductive film 114 is included in a signal line through which a video signal is supplied in some cases, the conductive film 114 is preferably formed using a material or a layered structure having wiring resistance lower than the conductive film 107. Note that the thickness of the light-transmitting conductive layer is preferably smaller than the thickness of the light-blocking conductive layer.

As in the case where the conductive film 107 is formed over the conductive layers 106a and 106b (or the conductive film 104), in the case where the conductive film 114 is formed over the conductive layers 113a and 113b (or the conductive film 111), both the films react with each other in some cases. Accordingly, also in the case where the conductive film 114 is formed over the conductive layers 113a and 113b, a high-melting point material is preferably used between the conductive layers 113a and 113b and the conductive film 114. For example, as the high-melting point material, molybdenum, titanium, tungsten, tantalum, chromium, or the like can be used. Further, it is preferable to form the conductive film 114 as a multi-layer film by using a material having high electric conductivity over the film formed using the high-melting point material. As the material having high electric conductivity, aluminum, copper, silver, or the like can be used.

Next, a resist mask 115 is formed over the conductive film 114 and the conductive film 114 is selectively etched using the resist mask 115, so that the conductive layer 116a is formed (see FIGS. 4E and 4F). After the etching, the resist mask 115 is removed. Accordingly, part of the conductive film 114, over which the resist mask 115 is not formed, is removed, so that the conductive layer 113a is exposed. Thus, the surface areas of the conductive layer 116a and the conductive layer 113a are different from each other. That is, the surface area of the conductive layer 113a is larger than the surface area of the conductive layer 116a. Alternatively, as for the conductive layers 116a and 113a, there are a region where the conductive layers 116a and 113a overlap with each other and a region where the conductive layers 116a and 113a do not overlap with each other.

In the region where the conductive layers 113a and 116a overlap with each other, the conductive layers 113a and 116a function as the gate wiring. In the region where the conductive layers 113a and 116a do not overlap with each other, the conductive layer 113a functions as the gate electrode. By forming the conductive layer 113a functioning as the gate electrode with the use of a light-transmitting conductive material, light can be transmitted also in a portion where the gate electrode is formed; therefore, the aperture ratio of the pixel can be improved. In addition, by forming the conductive layer 116a functioning as the gate wiring with the use of a material which has higher electric conductivity than a material used for the conductive layer 113a, wiring resistance can be reduced, and power consumption can be reduced. Further, since the source wiring is formed using the light-blocking conductive layer 116a, the space between the pixels can be shielded from light. That is, with the gate wiring disposed in the row direction and the source wiring disposed in the column direction, the space between the pixels can be shielded from light without use of a black matrix.

Note that although the step in which the conductive layer 116a is formed after the conductive layers 113a and 113b are formed is described, the order of formation may be inverted. In other words, after the conductive layer 116a functioning as the gate wiring is formed, the conductive layer 113a functioning as the gate electrode can be formed (see FIGS. 7A to 7C).

Further, the capacitor wiring is provided in the same direction as the gate wiring. In a pixel region, the capacitor wiring is preferably formed using the light-transmitting conductive layer 113b; however, in a region where part of the capacitor wiring overlaps with the source wiring, the conductive layer 113b and the conductive layer 116b may be stacked. By stacking the conductive layer 113b and the conductive layer 116b which has higher electric conductivity than the conductive layer 113b, resistance can be lowered (see FIG. 1A).

In this embodiment, an example is described in which the width of the capacitor wiring and the width of the gate wiring are the same; however, the width of the capacitor wiring and the width of the gate wiring may be different from each other. The width of the capacitor wiring is preferably larger than the width of the gate wiring. The surface area of the storage capacitor portion 160 can be increased.

By forming the storage capacitor portion 160 with the use of the light-transmitting conductive layers as described above, light can be transmitted also in a portion where the storage capacitor portion 160 is formed. Thus, the aperture ratio can be improved. In addition, by forming the storage capacitor portion 160 with the use of the light-transmitting conductive materials, the storage capacitor portion 160 can be made larger. Thus, even when the transistor is turned off, potential holding properties of the pixel electrode is improved and display quality is improved. Further, a feed-through potential can be lowered.

In this manner, the transistor 150 and the storage capacitor portion 160 can be formed. Further, the transistor 150 and the storage capacitor portion 160 can be light-transmitting elements.

Note that treatment for increasing electric conductivity in part of or whole regions of the semiconductor layer 103a may be performed after formation of the semiconductor layer 103a, after formation of the source electrode and the source wiring, after formation of the gate insulating film, or after formation of the gate electrode and the gate wiring. For example, hydrogenation treatment or the like can be used as the treatment for increasing electric conductivity. By providing silicon nitride containing hydrogen over the semiconductor layer 103a and applying heat, the semiconductor layer 103a can be hydrogenated. Alternatively, by applying heat in a hydrogen atmosphere, hydrogenation can be performed. Alternatively, as illustrated in FIG. 6A, by forming a channel protective layer 120a in a region overlapping with a channel formation region of the semiconductor layer 103a of a transistor 151, regions 121a and 121b whose electric conductivity is increased can be selectively formed in the semiconductor layer 103a.

The channel protective layer 120a is preferably formed using silicon oxide. By forming the channel protective layer 120a with the use of silicon oxide, hydrogen can be prevented from entering the channel formation portion of the semiconductor layer 103a. Note that the channel protective layer 120a may be removed after the treatment for increasing electric conductivity is performed. Alternatively, the channel protective layer 120a can be formed using a resist (see FIG. 6B). In this case, the resist is preferably removed after hydrogenation treatment. By performing treatment for increasing electric conductivity on an oxide semiconductor layer as described above, current can flow through a transistor easily, and resistance of a capacitor can be lowered.

Figure 6A:
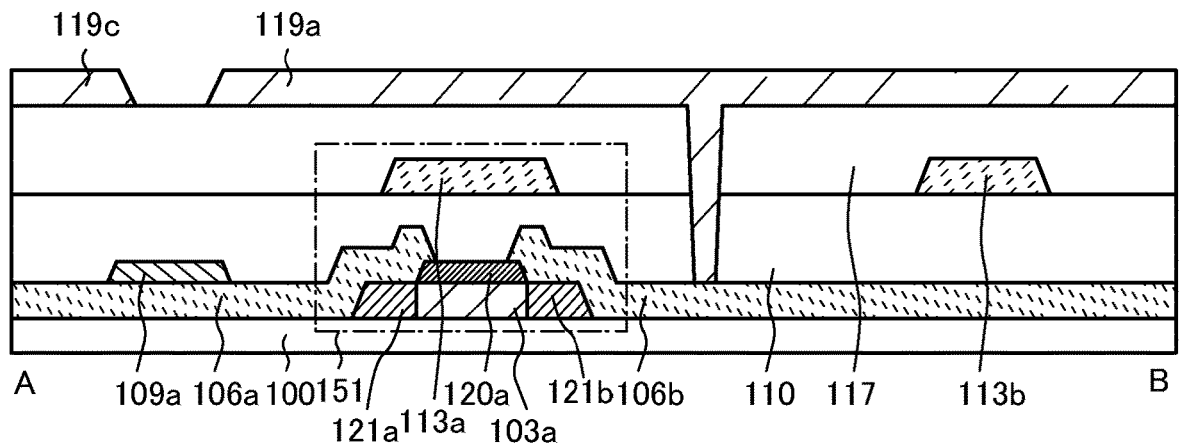
FIGS. 6A to 6C are cross-sectional views according to one embodiment of the present invention.

Although FIG. 6A illustrates an example in which the channel protective layer 120a of the transistor 151 is formed in contact with the semiconductor layer 103a, the channel protective layer 120a may be provided over the gate insulating film 110. Further, by adjusting the shapes of the channel protective layer and the conductive layer functioning as the gate electrode so that the channel protective layer is larger than the conductive layer, an offset region can be formed.

With the channel protective layer 120a, the semiconductor layer 103a can be prevented from being etched when the conductive layers 106a and 106b are etched. Thus, the thickness of the semiconductor layer 103a can be made smaller. When the semiconductor layer 103a is thin, a depletion layer is easily formed. Therefore, a subthreshold swing value can be decreased. The amount of off-state current can be made smaller.

Figure 6B:
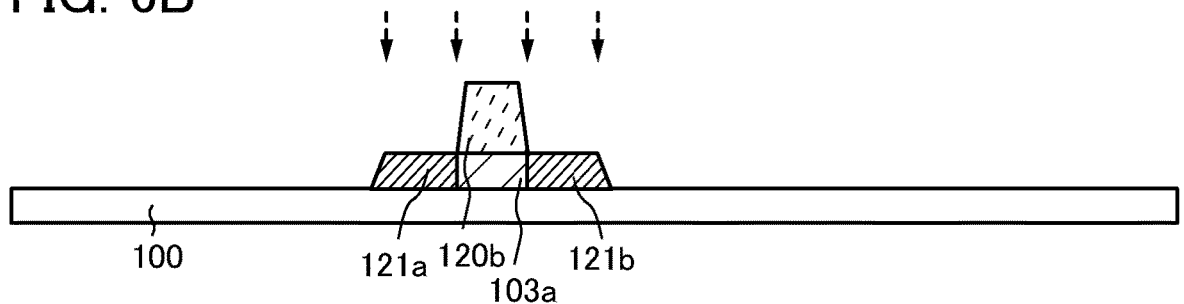
Figure 6C:
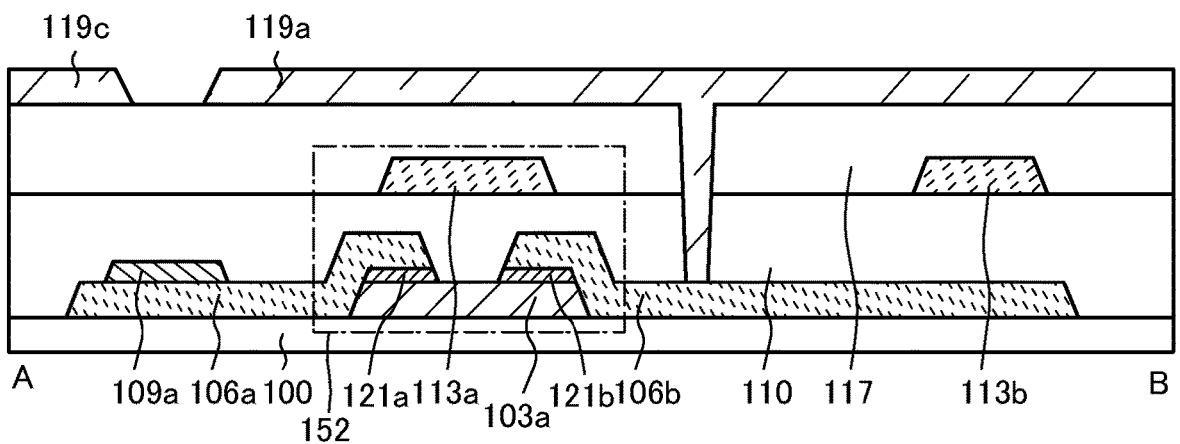

Alternatively, as illustrated in FIG. 6C, a transistor 152 having the regions 121a and 121b whose electric conductivity is made higher than that of the semiconductor layer 103a can be provided over the semiconductor layer 103a.

Next, after the insulating film 117 is formed, a resist mask (not illustrated) is formed over the insulating film 117 and the insulating film 117 is etched using the resist mask, so that the contact hole 130 is formed in the insulating film 117 (see FIGS. 5A and 5B). The insulating film 117 functions as an insulating film for flattening a surface over which the transistor 150, the storage capacitor portion 160, the wirings, and the like are formed. Since the transistor 150 and the storage capacitor portion 160 can be formed as light-transmitting elements, regions where they are provided can also be used as opening regions. Therefore, it is advantageous to relieve unevenness due to the transistor 150, the storage capacitor portion 160, the wirings, or the like, so that an upper portion over which these elements are formed is flattened.

Further, the insulating film 117 can function as an insulating film which protects the transistor 150 from impurities or the like. The insulating film 117 can be formed using, for example, a film containing silicon nitride. A film containing silicon nitride is preferable because it is highly effective in blocking impurities. Alternatively, the insulating film 117 may be formed using a film containing an organic material. As the organic material, acrylic, polyimide, polyamide, or the like is preferable. Such organic materials are preferable in terms of high functionality of flattening unevenness. Accordingly, in the case where the insulating film 117 is formed to have a layered structure of a film containing silicon nitride and a film containing an organic material, it is preferable to provide the film containing silicon nitride on the lower side and the film containing an organic material on the upper side, respectively. Note that in the case where the insulating film 117 is formed to have a layered structure, the transmittance of each of the films is preferably high enough. Alternatively, a photosensitive material can be used. In this case, it is not necessary to etch the insulating film 117 to form a contact hole.

Note that the insulating film 117 may have a function as a color filter. When a color filter is provided on the substrate 100 side, it is not necessary to provide a color filter on the counter substrate side. Therefore, a margin for adjusting the positions of the two substrates is not necessary, which can facilitate manufacture of a panel. Note that the insulating film 117 is not necessarily formed. The pixel electrode may be formed over the same layer as the gate electrode and the gate wiring.

Next, a conductive film 118 is formed over the insulating film 117 and the contact hole 130 (see FIGS. 5C and 5D). The conductive film 118 is preferably formed using a material which is substantially the same as the materials of the conductive film 104 and the conductive film 111. When the conductive film 118 is formed using the material which is substantially the same as the materials of the conductive film 104 and the conductive film 111 by sputtering or evaporation in this manner, there is an advantage that the material can be shared among the conductive films 104 and 111 and the conductive film 118. When the material can be shared, the same manufacturing apparatus can be used, manufacturing steps can proceed smoothly, and throughput can be improved, which leads to reduction in cost. Note that the conductive film 118 may be formed using a material which is different from the materials of the conductive film 104 and the conductive film 111.

Next, a resist mask (not illustrated) is formed over the conductive film 118 and the conductive film 118 is selectively etched using the resist mask, so that conductive layers 119a, 119b, and 119c are formed (see FIGS. 5E and 5F). Note that the resist mask is removed after the etching.

The conductive layers 119a, 119b, and 119c function as pixel electrodes. Further, the conductive layers 119a, 119b, and 119c can connect the source wiring, the source electrode, the gate wiring, the gate electrode, the pixel electrode, the capacitor wiring, the electrode of the storage capacitor portion, and the like to each other through the contact hole 130. Therefore, the conductive layers 119a, 119b, and 119c can function as wirings for connecting conductors. The thickness of each of the conductive layers 119a, 119b, and 119c is preferably smaller than the thickness of the light-transmitting conductive layer used for the source wiring including the source electrode or the thickness of the light-transmitting conductive layer used for the gate wiring including the gate electrode. However, one embodiment of the present invention is not limited to this. The thickness of each of the conductive layers 119a, 119b, and 119c may be larger than the thickness of the light-transmitting conductive layer used for the source wiring including the source electrode or the thickness of the light-transmitting conductive layer used for the gate wiring including the gate electrode.

Through the above steps, the semiconductor device shown in FIGS. 1A and 1B can be manufactured. By the manufacturing method described in this embodiment, the light-transmitting transistor 150 and the light-transmitting storage capacitor portion 160 can be formed. Therefore, even in the case where a transistor or a capacitor is provided in a pixel, the aperture ratio can be improved because light can also be transmitted in a portion where the transistor and the capacitor are formed. Further, since a wiring for connecting the transistor and an element (e.g., a different transistor) to each other can be formed using a material having low resistivity and high electric conductivity, waveform distortion of a signal can be suppressed and voltage drop due to wiring resistance can be reduced.

Next, a different example of a semiconductor device is described with reference to FIGS. 7A to 7C, FIGS. 8A to 8C, FIG. 9, FIGS. 10A and 10B, FIGS. 11A and 11B, FIG. 12, FIGS. 13A and 13B, FIGS. 14A and 14B, and FIG. 15. Note that many portions are common between the semiconductor device illustrated in FIGS. 7A to 7C, FIGS. 8A to 8C, FIG. 9, FIGS. 10A and 10B, FIGS. 11A and 11B, FIG. 12, FIGS. 13A and 13B, FIGS. 14A and 14B, and FIG. 15 and the semiconductor device in FIGS. 1A and 1B. Therefore, description of common portions is omitted and differences are described.

Figure 7A:
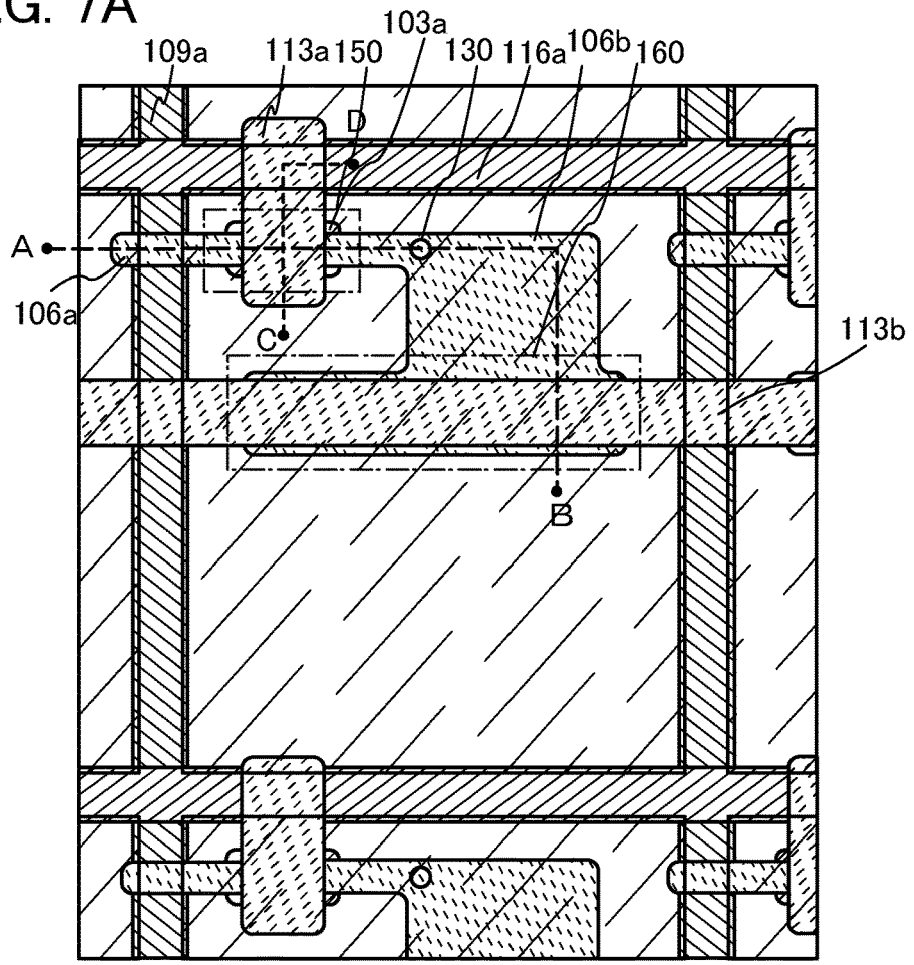
FIGS. 7A to 7C are a top view and cross-sectional views according to one embodiment of the present invention.
Figure 7B:
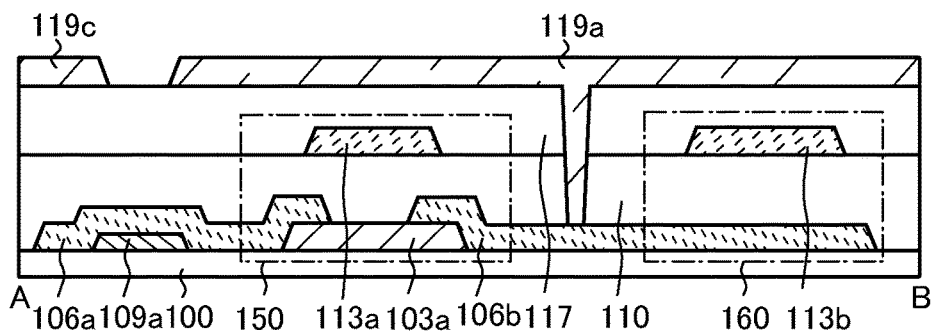
Figure 7C:
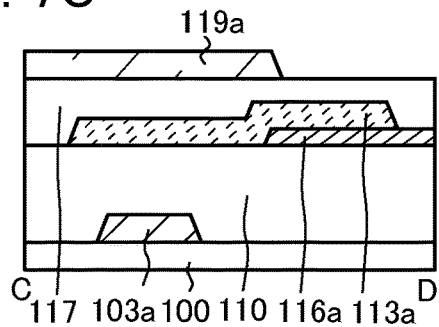

FIG. 7A is a plan view, FIG. 7B is a cross-sectional view taken along line A-B in FIG. 7A, and FIG. 7C is a cross-sectional view taken along line C-D in FIG. 7A. In FIGS. 1A and 1B, an example is described in which the gate wiring and the source wiring are each formed by stacking a light-blocking conductive layer over a light-transmitting conductive layer; however, the gate wiring and the source wiring may be each formed by stacking a light-blocking conductive layer and a light-transmitting conductive layer in that order (see FIGS. 7A to 7C). The light-transmitting conductive layer 113a functioning as the gate electrode may be connected to the light-blocking conductive layer 116a functioning as the gate wiring. Further, the light-transmitting conductive layer 106a functioning as the source electrode or the drain electrode may be connected to the light-blocking conductive layer 109a functioning as the source wiring.

Figure 8A:
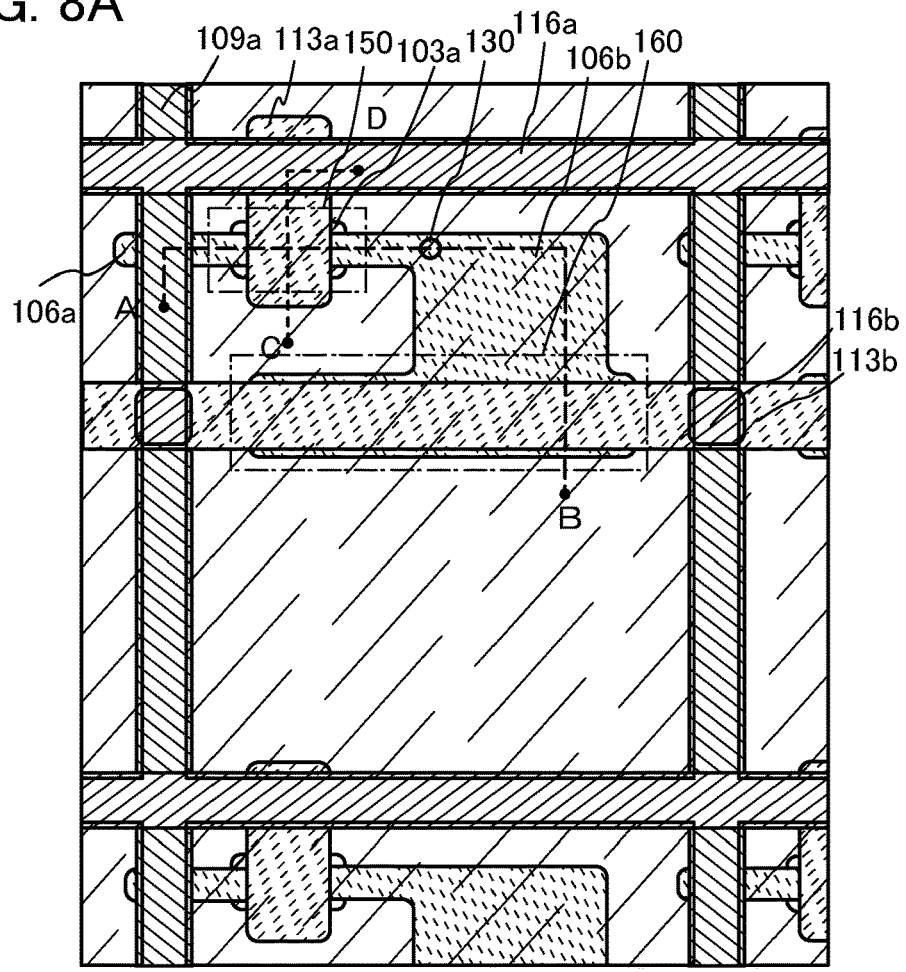
FIGS. 8A to 8C are a top view and cross-sectional views according to one embodiment of the present invention.
Figure 8B:
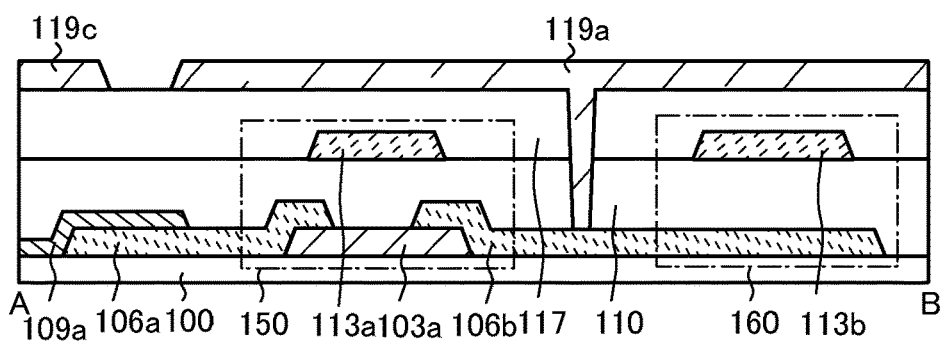
Figure 8C:
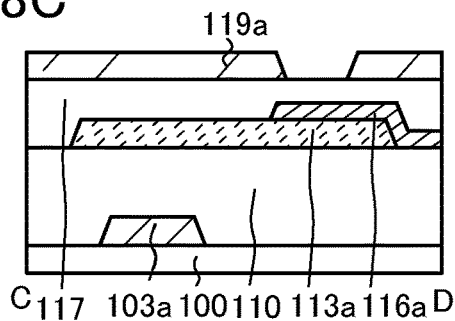

FIG. 8A is a plan view, FIG. 8B is a cross-sectional view taken along line A-B in FIG. 8A, and FIG. 8C is a cross-sectional view taken along line C-D in FIG. 8A. In FIGS. 1A and 1B, an example is described in which the gate wiring and the source wiring are each formed by stacking a light-transmitting conductive layer and a light-blocking conductive layer in that order; however, the gate wiring and the source wiring may be each formed using a light-blocking conductive layer (see FIGS. 8A to 8C). The light-transmitting conductive layer 113a functioning as the gate electrode may be connected to the light-blocking conductive layer 116a functioning as the gate wiring. Further, the light-transmitting conductive layer 106a functioning as the source electrode or the drain electrode may be connected to the light-blocking conductive layer 109a functioning as the source wiring. FIGS. 7A to 7C illustrate an example in which a light-blocking conductive layer and a light-transmitting conductive layer are stacked in that order, and FIGS. 8A to 8C illustrate an example in which the gate wiring and the source wiring are each formed using a light-blocking conductive layer; however, a light-transmitting conductive layer and a light-blocking conductive layer can be stacked in that order.

Figure 9:
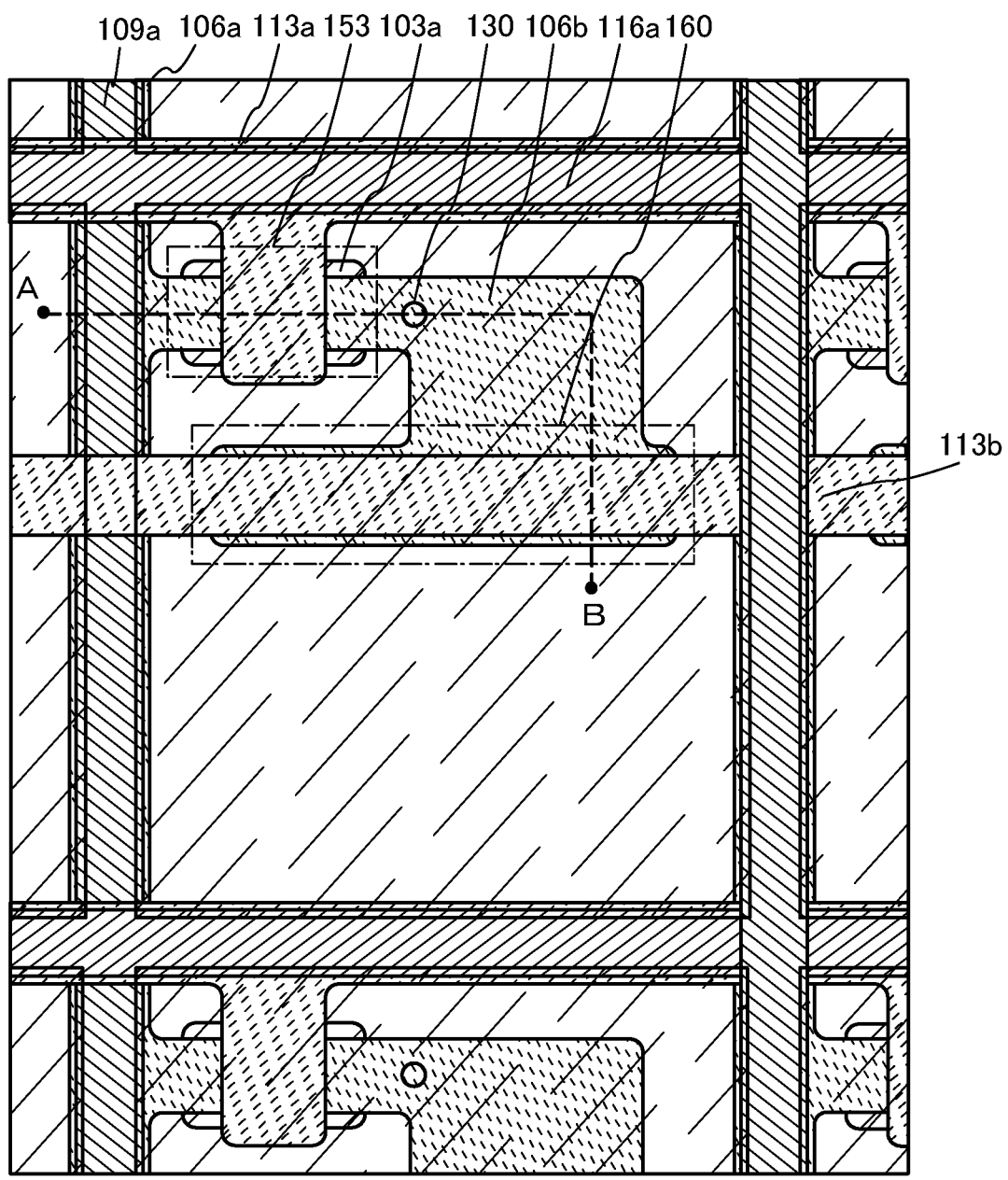
FIG. 9 is a top view according to one embodiment of the present invention.

In addition, in this embodiment, since the transistor can be formed in a pixel, the size of the transistor can be made larger. For example, as illustrated in FIG. 9, a transistor whose channel width W or channel length L is larger than the width of the gate wiring can be formed. By making a transistor larger, its current supply capability can be sufficiently high, and a writing time of a signal to the pixel can be shortened. Alternatively, the amount of off-state current can be reduced and flickers or the like can be reduced. Thus, a high-definition display device can be provided.

Note that it is not necessary that light be transmitted through a transistor portion in a protection circuit or a peripheral driver circuit portion such as a gate driver or a source driver. Thus, a transistor and a capacitor in a pixel portion may be formed using light-transmitting materials and a transistor in the peripheral driver circuit portion may be formed using a light-blocking material (see FIG. 25A).

Figure 10A:
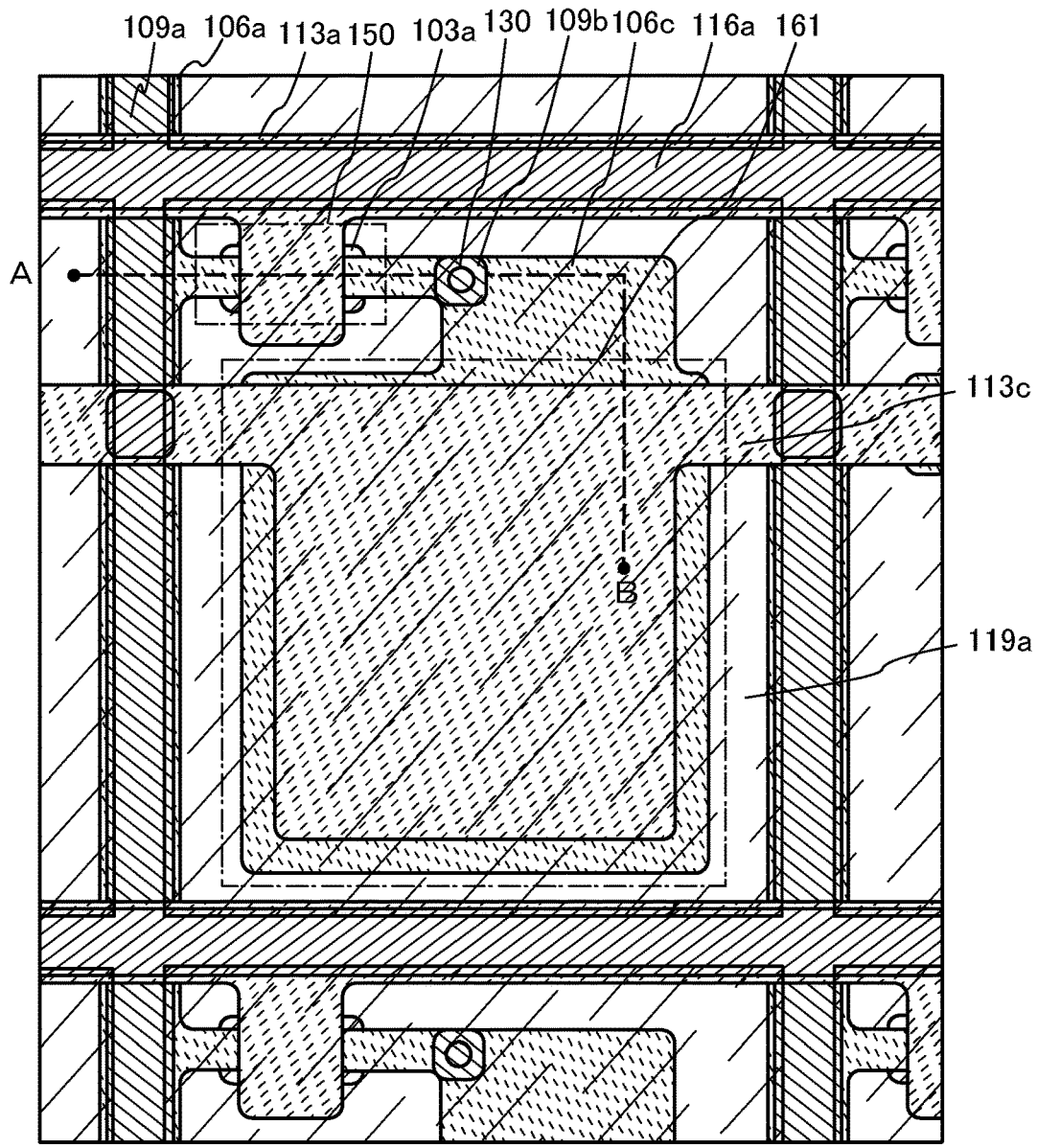
FIGS. 10A and 10B are a top view and a cross-sectional view according to one embodiment of the present invention.
Figure 10B:
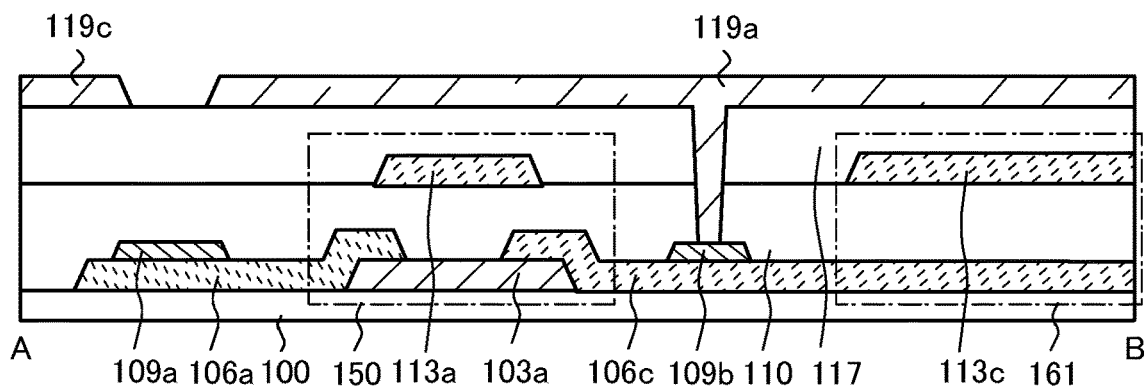

FIG. 10A is a plan view, and FIG. 10B is a cross-sectional view taken along line A-B in FIG. 10A. FIGS. 10A and 10B differ from FIGS. 1A and 1B in that the surface areas of conductive layers 106c and 113c are larger than the surface areas of the conductive layer 106b and 113b. The size of a storage capacitor portion 161 is preferably larger than the pixel pitch by 70% or more, or 80% or more. Further, the storage capacitor portion 161 is in contact with the pixel electrode over a conductive layer 109b provided over the conductive layer 106c. Since the structure is similar to the structure in FIGS. 1A and 1B, detailed description thereof is omitted.

With such a structure, the large storage capacitor portion 161 with high transmittance can be formed. By forming the large storage capacitor portion 161, even when the transistor is turned off, potential holding properties of the pixel electrode is improved and display quality is improved. Further, a feedthrough potential can be lowered. Furthermore, even in the case where the large storage capacitor portion 161 is formed, light can be transmitted also in a portion where the storage capacitor portion 161 is formed. Therefore, the aperture ratio can be improved and power consumption can be reduced. Moreover, even when misalignment of liquid crystals is caused by unevenness due to the contact hole in the pixel electrode, light leakage can be prevented by the light-blocking conductive layer 109b.

Figure 11A:
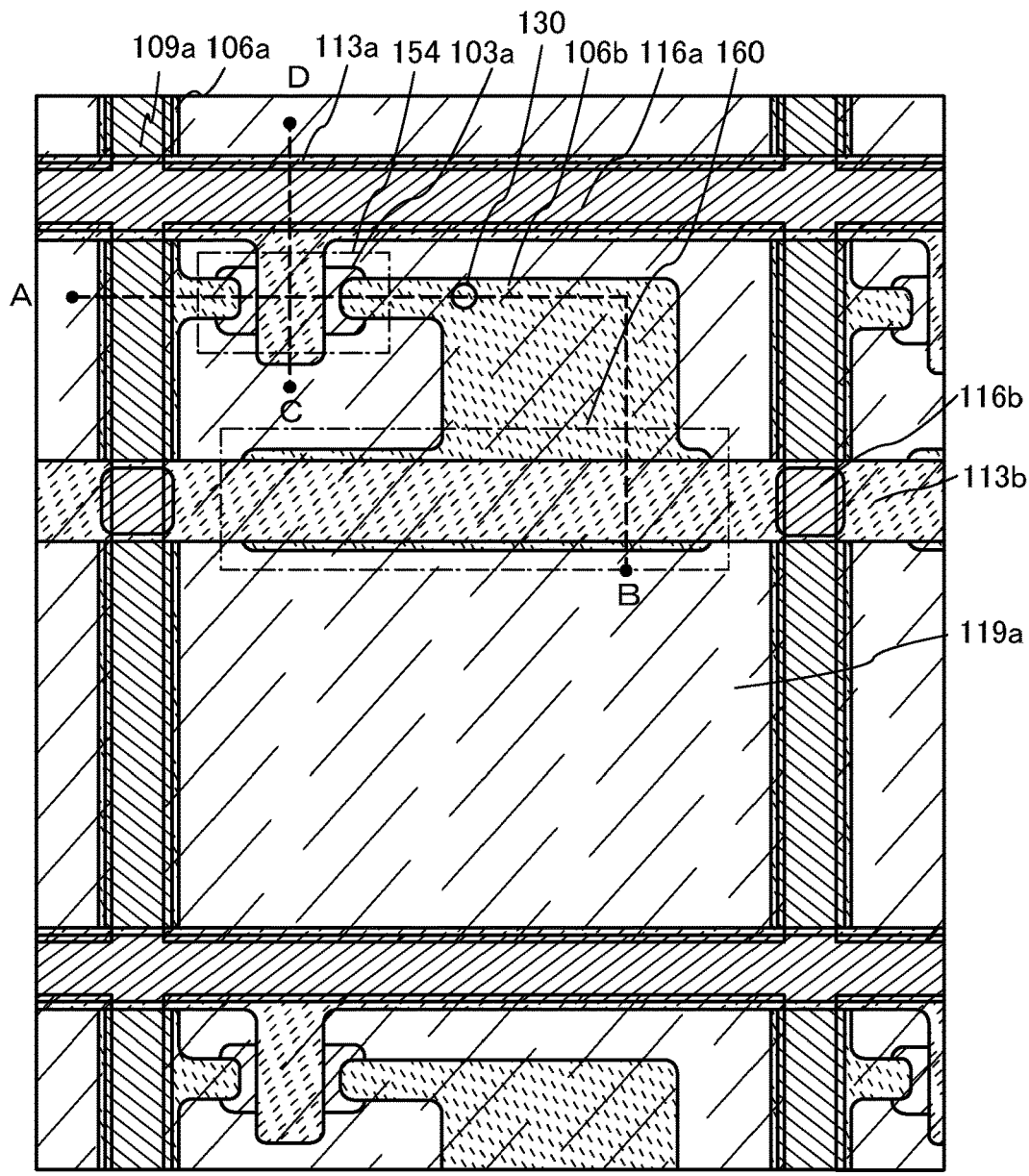
FIGS. 11A and 11B are a top view and a cross-sectional view according to one embodiment of the present invention.
Figure 11B:
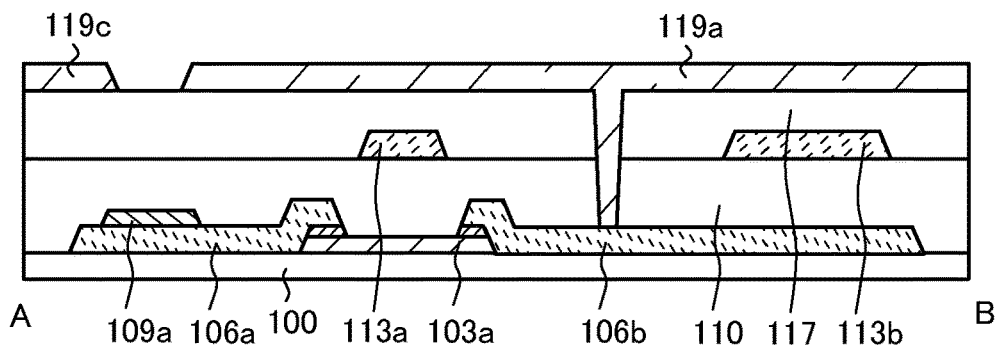

FIG. 11A is a plan view, and FIG. 11B is a cross-sectional view taken along line A-B in FIG. 11A.

In a semiconductor device illustrated in FIGS. 11A and 11B, a region with high electric conductivity (also referred to as an n$^+$ region) is provided in part of the semiconductor layer 103a, and the conductive layers 106a and 106b functioning as the source electrode and the drain electrode are provided so as not to overlap with the gate electrode. In the semiconductor layer 103a, the region with high electric conductivity can be provided in a region which is connected to the conductive layers 106a and 106b. Note that the region with high electric conductivity may be provided so as to overlap with the gate electrode (the conductive layer 113a) or so as not to overlap with the gate electrode (the conductive layer 113a).

The region with high electric conductivity can be formed by selective addition of hydrogen to the semiconductor layer 103a, as illustrated in FIG. 6B. Hydrogen may be added to a portion of the semiconductor layer 103a, whose electric conductivity is to be made higher.

Further, when the source electrode and the drain electrode are provided so as not to overlap with the gate electrode, parasitic capacitance generated between the source electrode and the drain electrode, and the gate electrode can be reduced. Therefore, feedthrough can be reduced.

In FIGS. 11A and 11B, the electric conductivity of part of the semiconductor layer 103a is made higher. With such a structure, in a transistor 154, it not necessary to overlap the gate electrode with the source electrode or the drain electrode.

Figure 12:
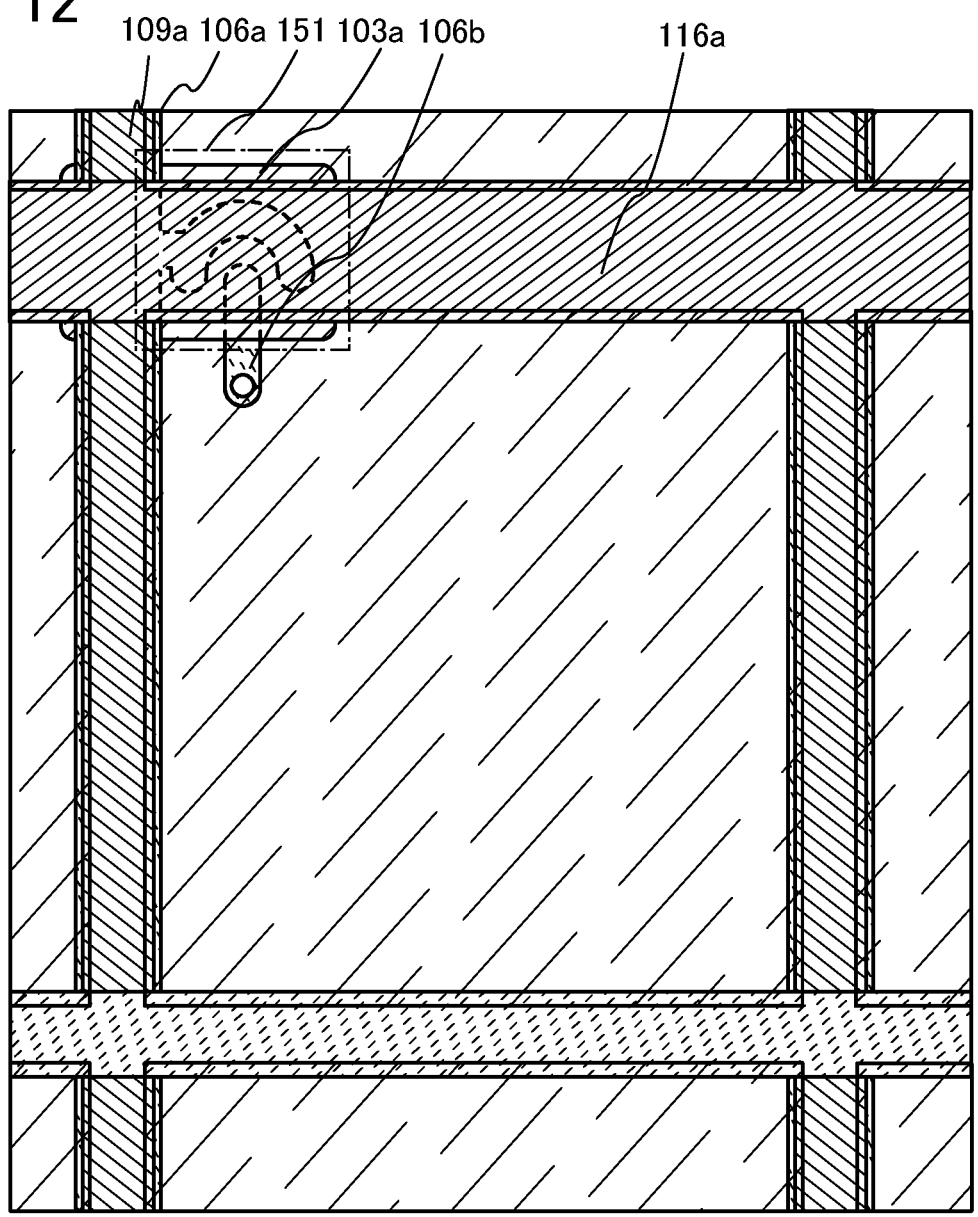
FIG. 12 is a top view according to one embodiment of the present invention.

Note that although each of the source wiring and the gate wiring has a stack of a light-blocking conductive layer and a light-transmitting conductive layer, this embodiment is not limited to this. Each of the source wiring and the gate wiring may be formed using only a light-blocking conductive layer or a light-transmitting conductive layer. For example, FIG. 12 illustrates the case where the gate wiring is formed using only a light-blocking conductive layer, the source wiring is formed using only a light-blocking conductive layer, and the drain electrode is formed using a light-transmitting conductive layer. The source wiring is formed using only a light-blocking conductive layer, and the gate wiring is formed using only a light-blocking conductive layer. The capacitor wiring may be formed using either a light-blocking conductive layer or a light-transmitting layer. Note that in a region where the light-transmitting conductive layer used for the source electrode and the gate wiring overlap with each other, a light-blocking conductive layer may be formed.

Figure 13A:
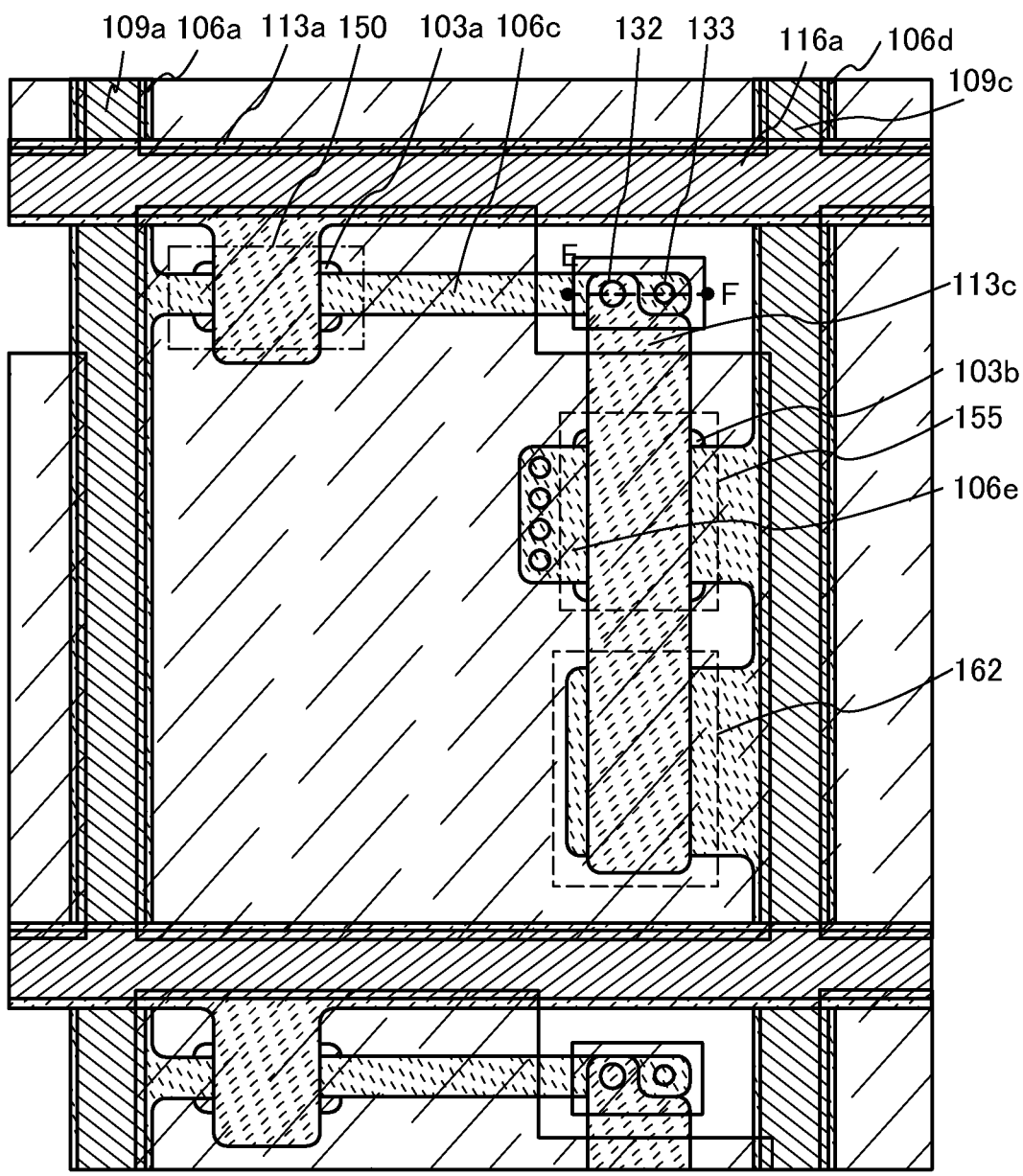
FIGS. 13A and 13B are a top view and a cross-sectional view according to one embodiment of the present invention.
Figure 14A:
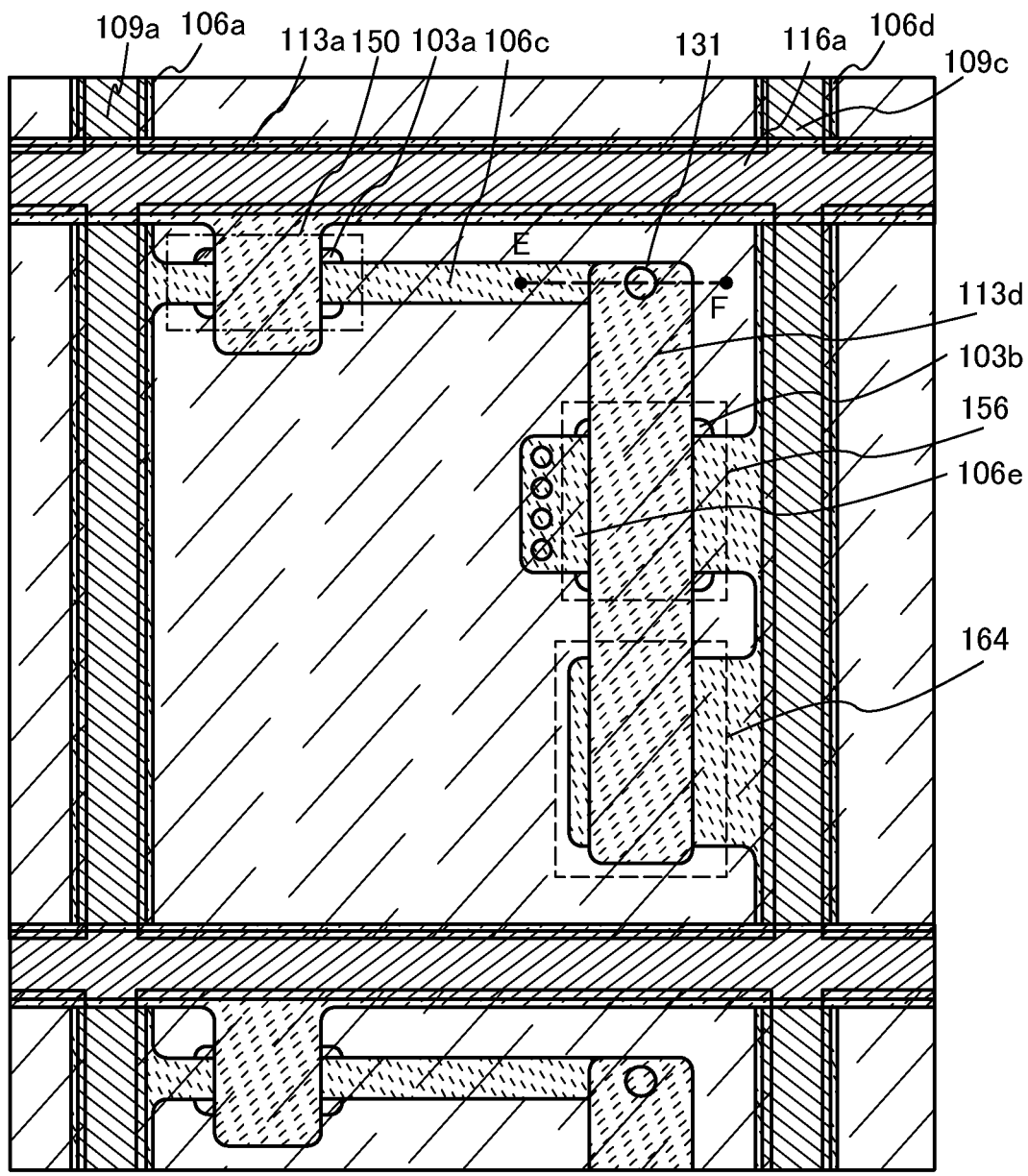
FIGS. 14A and 14B are a top view and a cross-sectional view according to one embodiment of the present invention.

In FIG. 13A and FIG. 14A, pixel structures of light-emitting display devices are described as examples of pixel structures. A pixel illustrated in FIG. 13A includes a gate wiring formed by stacking the conductive layer 106a and the conductive layer 109a in that order, a source wiring formed by stacking the conductive layer 119a and the conductive layer 116a in that order, the switching transistor 150, a driving transistor 155, a storage capacitor portion 162, and a power supply line formed by stacking a conductive layer 106d and a conductive layer 109c in that order. Further, a pixel illustrated in FIG. 14A includes a gate wiring formed by stacking the conductive layer 106a and the conductive layer 109a in that order, a source wiring formed by stacking the conductive layer 113a and the conductive layer 116a in that order, the switching transistor 150, a driving transistor 156, a storage capacitor portion 164, and a power supply line formed by stacking the conductive layer 106d and the conductive layer 109c in that order.

The transistor 150 illustrated in FIGS. 13A and 14A includes the semiconductor layer 103a over the substrate 100 having an insulating surface, the conductive layers 106a and 106c which are provided over the semiconductor layer 103a and function as the source electrode and the drain electrode, the gate insulating film 110 which is provided over the conductive layers 106a and 106c, and the conductive layer 113a which is provided over the gate insulating film 110 and functions as the gate electrode provided between the conductive layers 106a and 106c. In addition, each of the driving transistors 155 and 156 includes a semiconductor layer 103b over the substrate 100 having an insulating surface, the conductive layer 106d and a conductive layer 106e which are provided over the semiconductor layer 103b and function as a source electrode and a drain electrode, the gate insulating film 110 which is provided over the conductive layers 106d and 106e, and the conductive layer 113c or a conductive layer 113d which is provided over the gate insulating film 110 and functions as a gate electrode provided between the conductive layers 106d and 106e. Further, the storage capacitor portion 162 includes the conductive layer 106e and the conductive layer 113c in FIGS. 13A and 13B, and the storage capacitor portion 164 includes the conductive layer 106e and the conductive layer 113d in FIGS. 14A and 14B.

Figure 13B:
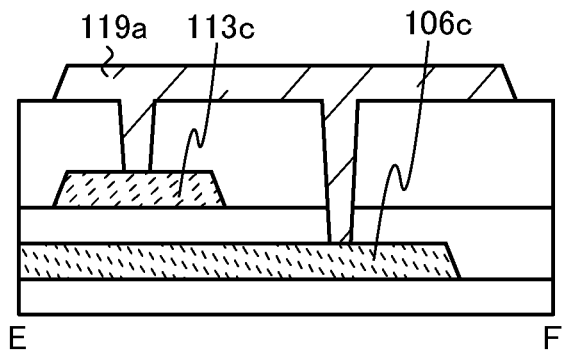
Figure 14B:
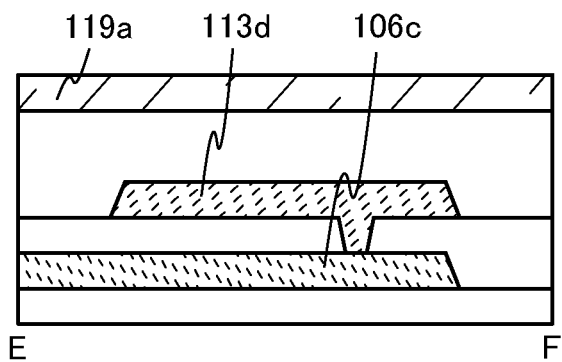

Note that in the case where a gate and a drain are connected to each other as illustrated in FIG. 13B, the gate and the drain are connected to each other through contact holes 132 and 133 via ITO which is provided at the top; however, the gate and the drain may be directly connected through a contact hole 131 as illustrated in FIG. 14B. In this case, the area of a pixel electrode can be increased, so that the aperture ratio can be improved. Further, a resistance value can be decreased.

Although the semiconductor device illustrated in FIGS. 13A and 13B and FIGS. 14A and 14B includes two transistors: the switching transistor 150 and the driving transistor 155 or 156, three or more transistors may be provided in one pixel.

In one embodiment of the present invention, even in the case where two or more transistors are provided in one pixel as described above, light can be transmitted also in portions where the transistors are formed. Therefore, the aperture ratio can be improved.

Figure 15:
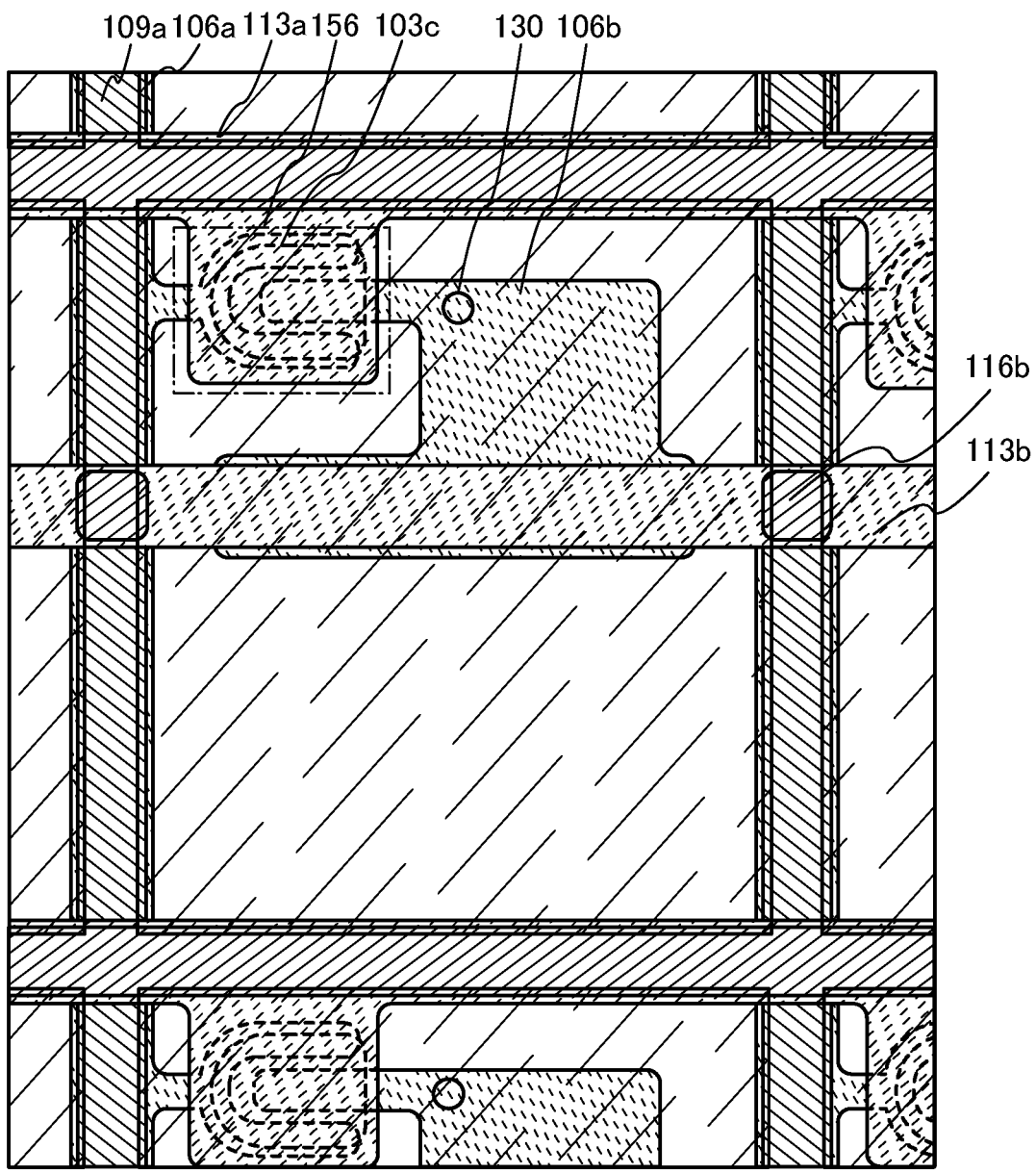
FIG. 15 is a top view according to one embodiment of the present invention.

FIG. 15 is a plan view in the case where the shape of the transistor is a shape in which the conductive layer 106a surrounds the conductive layer 106b (for example, a U-shape or a C-shape).

The transistor 156 illustrated in FIG. 15 includes a semiconductor layer 103c over the substrate 100 having an insulating surface, the conductive layers 106a and 106b which are provided over the semiconductor layer 103c and function as the source electrode and the drain electrode, the gate insulating film 110 which is provided over the conductive layers 106a and 106b, and the conductive layer 113a which is provided over the gate insulating film 110 and functions as a gate electrode. In the case where one of the source electrode and the drain electrode surrounds the other of the source electrode and the drain electrode (for example, the former electrode is in a U-shape or a C-shape) in this manner, a distance between the source electrode and the drain electrode is kept substantially constant.

When the transistor 156 has the above shape, the channel width of the transistor can be increased and the area of a region through which carriers transfer can be increased. Thus, the amount of current can be increased and the area of the transistor can be decreased. In addition, variations in electrical characteristics can be suppressed.

Figure 36:
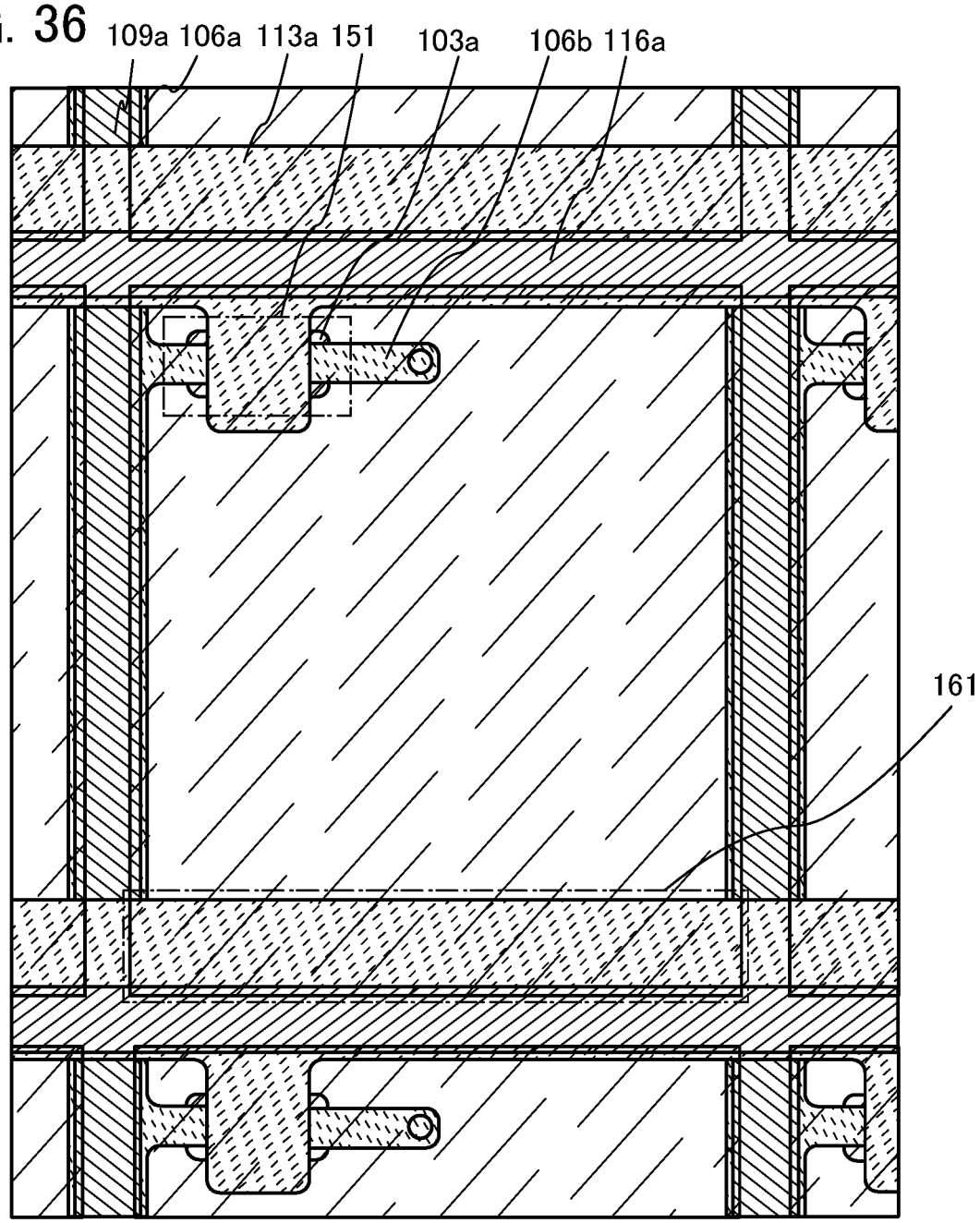
FIG. 36 is a top view according to one embodiment of the present invention.

Note that although a structure where a capacitor wiring is provided is described in this embodiment, a storage capacitor can be provided without provision of a capacitor wiring by overlapping a pixel electrode with a gate wiring provided adjacent to the pixel electrode with an insulating film interposed therebetween (see FIG. 36).

This embodiment can be combined with any of the other embodiments as appropriate.

Embodiment 2

In this embodiment, an example of a manufacturing process of a semiconductor device is described with reference to FIGS. 16A and 16B, FIGS. 17A to 17F, FIGS. 18A to 18F, FIGS. 19A to 19D, FIGS. 20A to 20F, FIGS. 21A to 21D, FIGS. 22A-1 to 22B-2, and FIGS. 23A and 23C. Note that many portions of the semiconductor device and the manufacturing process thereof in this embodiment are the same as those in Embodiment 1. Therefore, description of the same portions is omitted and different portions are described below in detail.

Figure 16A:
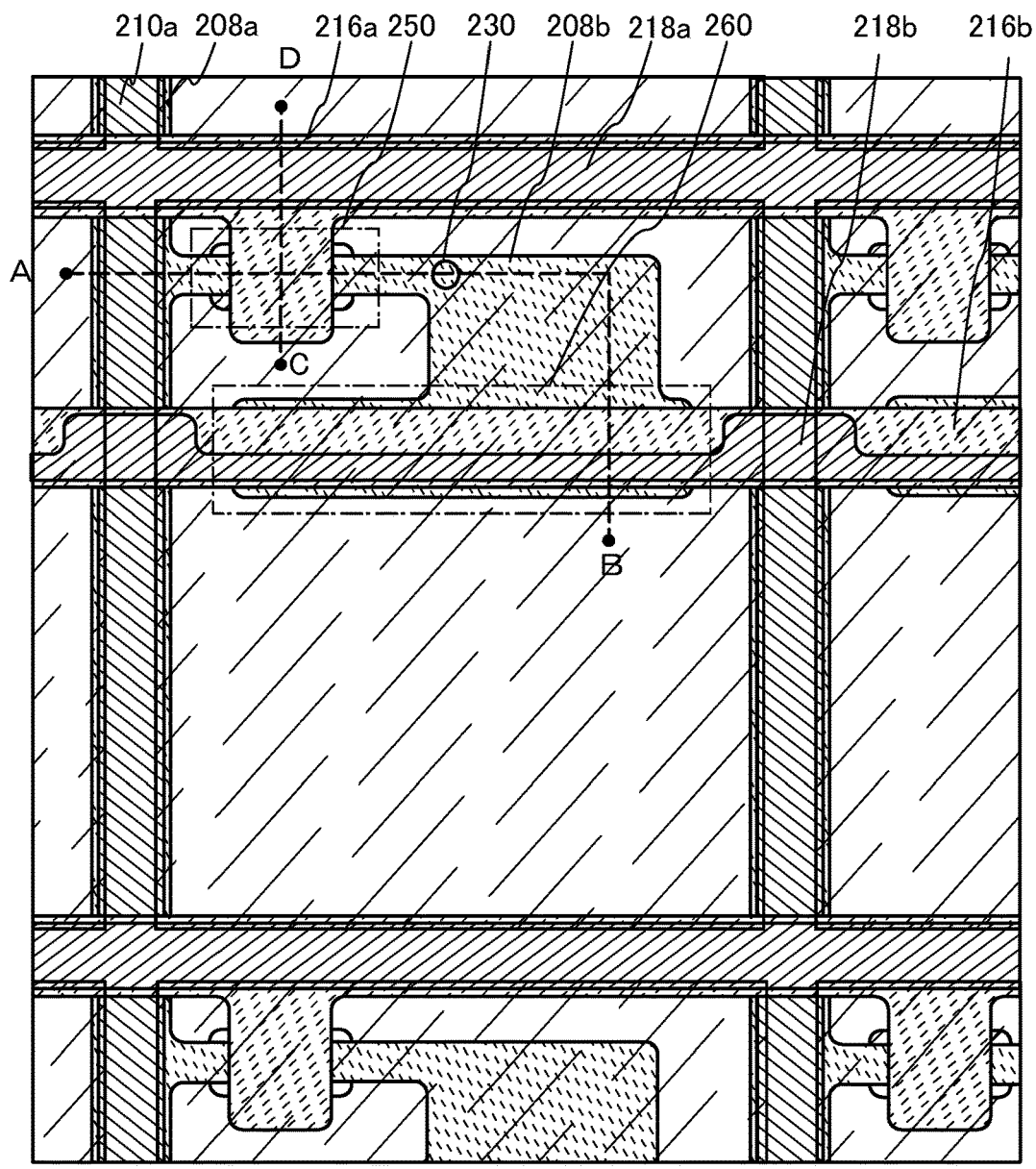
FIGS. 16A and 16B are a top view and a cross-sectional view according to one embodiment of the present invention.
Figure 16B:
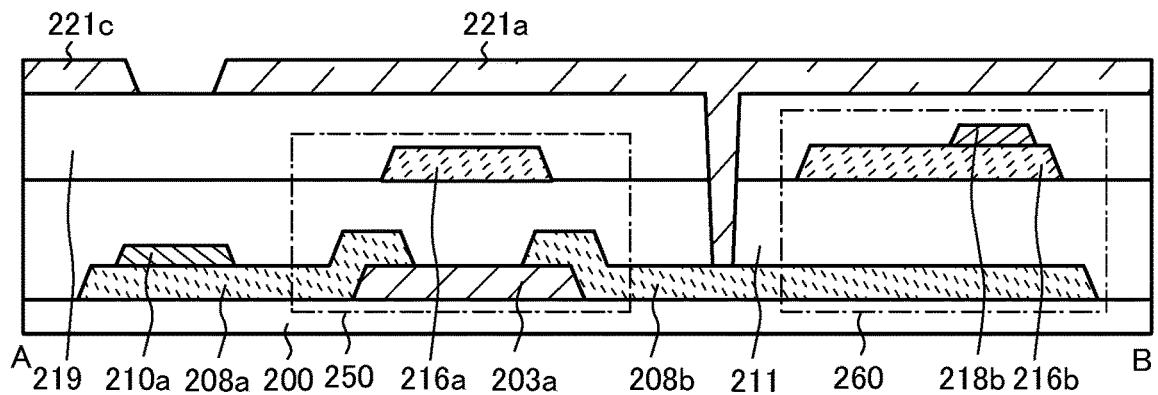

FIGS. 16A and 16B illustrate the semiconductor device of this embodiment. FIG. 16A is a plan view, and FIG. 16B is a cross-sectional view taken along line A-B in FIG. 16A.

Next, an example of a manufacturing process of the semiconductor device illustrated in FIGS. 16A and 16B is described with reference to FIGS. 17A to 17F, FIGS. 18A to 18F, FIGS. 19A to 19D, FIGS. 20A to 20F, FIGS. 21A to 21D, and FIGS. 22A-1 to 22B-2. Further, in this embodiment, the case in which a semiconductor device is formed using a multi-tone mask is described.

First, a semiconductor layer 203 is formed over a substrate 200 having an insulating surface (see FIGS. 17A and 17B).

As for the material of the substrate 200 and the material and manufacturing method of the semiconductor layer 203, those of the substrate 100 and the semiconductor layer 103a described in Embodiment 1 can be referred to. In addition, an insulating film functioning as a base film may be formed over the substrate 200 having an insulating surface.

Next, a conductive film 204 and a conductive film 205 are formed over the semiconductor layer 203 (see FIGS. 17C and 17D). As for the materials and manufacturing methods of the conductive film 204 and the conductive film 205, those of the conductive film 104 and the conductive film 107 described in Embodiment 1 can be referred to.

Next, resist masks 206a and 206b are formed over the conductive film 205. The resist masks 206a and 206b can be formed to have regions with different thicknesses by using a multi-tone mask. By using the multi-tone mask, the number of photomasks used and the number of manufacturing steps can be reduced, which is preferable. In this embodiment, the multi-tone mask can be used in a step of forming the patterns of the conductive film 204 and the conductive film 205 and a step of forming the patterns of the conductive films 212 and 213 (see FIGS. 19C and 19D).

A multi-tone mask is a mask capable of light exposure with multi-level light intensity, typically, with three levels of light intensity so that an exposed region, a semi-exposed region, and an unexposed region are formed. With the use of the multi-tone mask, a resist mask with plural thicknesses (typically two kinds of thicknesses) can be formed by one-time exposure and development process. Therefore, with the use of the multi-tone mask, the number of photomasks can be reduced.

Figures 1, 22A:
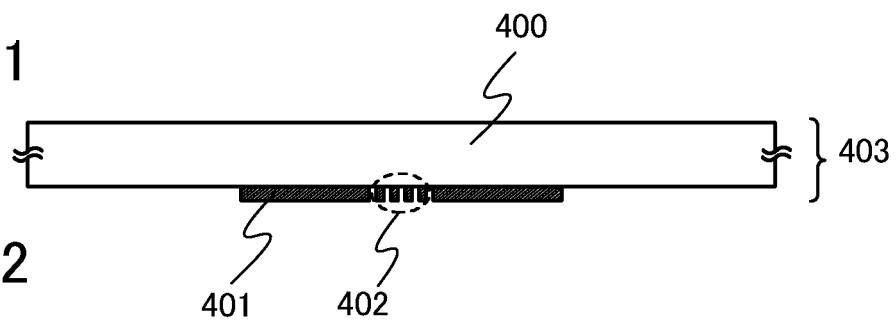
FIGS. 22A-1 to 22B-2 illustrate multi-tone masks.
Figures 2, 22A:
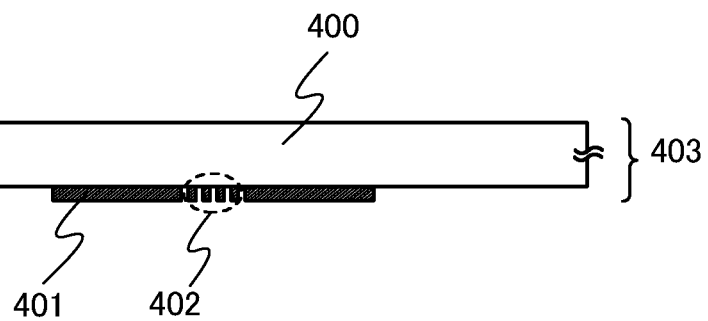
Figures 1, 22B:
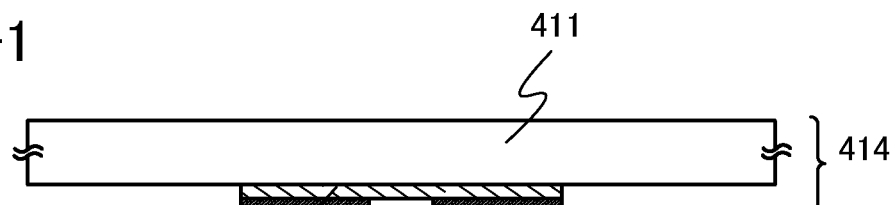
Figures 2, 22B:
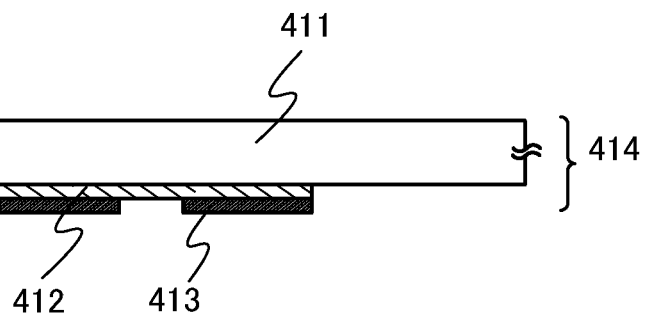

FIGS. 22A-1 and 22B-1 illustrate cross sections of typical multi-tone masks. FIG. 22A-1 illustrates a gray-tone mask 403, and FIG. 22B-1 illustrates a half-tone mask 414.

The gray-tone mask 403 illustrated in FIG. 22A-1 includes a light-blocking portion 401 formed using a light-blocking layer on a light-transmitting substrate 400, and a diffraction grating portion 402 provided with a pattern of the light-blocking layer.

The diffraction grating portion 402 has slits, dots, meshes, or the like provided at intervals which are less than or equal to the resolution limit of light used for exposure, so that light transmittance is controlled. Note that the slits, dots, or meshes provided at the diffraction grating portion 402 may be provided periodically or non-periodically.

For the light-transmitting substrate 400, quartz or the like can be used. The light-blocking layer included in the light-blocking portion 401 and the diffraction grating portion 402 may be formed using a metal film, and is preferably formed using chromium, chromium oxide, or the like.

In the case where the gray-tone mask 403 is irradiated with light for exposure, as illustrated in FIG. 22A-2, transmittance in a region overlapping with the light-blocking portion 401 is 0%, and transmittance in a region where neither the light-blocking portion 401 nor the diffraction grating portion 402 is provided is 100%. Further, transmittance at the diffraction grating portion 402 is approximately in the range of 10 to 70%, which can be adjusted by the interval of slits, dots, or meshes of the diffraction grating, or the like.

The half-tone mask 414 illustrated in FIG. 22B-1 includes a semi-light-transmitting portion 412 formed using a semi-light-transmitting layer on a light-transmitting substrate 411, and a light-blocking portion 413 formed using a light-blocking layer.

The semi-light-transmitting portion 412 can be formed using a layer of MoSiN, MoSi, MoSiO, MoSiON, CrSi, or the like. The light-blocking portion 413 may be formed using a metal film which is similar to that of the light-blocking layer of the gray-tone mask, and is preferably formed using chromium, chromium oxide, or the like.

In the case where the half-tone mask 414 is irradiated with light for exposure, as illustrated in FIG. 22B-2, transmittance in a region overlapping with the light-blocking portion 413 is 0%, and transmittance in a region where neither the light-blocking portion 413 nor the semi-light-transmitting portion 412 is provided is 100%. Further, transmittance at the semi-light-transmitting portion 412 is approximately in the range of 10 to 70%, which can be adjusted by the kind, thickness, or the like of a material to be used.

Since a multi-tone photomask can achieve three levels of exposure to obtain an exposed portion, a half-exposed portion, and an unexposed portion, a resist mask with regions of a plurality of thicknesses (typically two kinds of thicknesses) can be formed by one-time exposure and development process. Thus, with the use of the multi-tone mask, the number of photomasks can be reduced.

A half-tone mask illustrated in FIGS. 17E and 17F includes semi-light-transmitting layers 301a and 301b and a light-blocking layer 301c on a light-transmitting substrate 300. Therefore, a resist mask provided in a portion serving as a source wiring later is formed thick and a resist mask provided in a portion serving as a source electrode or a drain electrode later is formed thin over the conductive film 205 (see FIGS. 17E and 17F).

Unnecessary portions of the conductive films 204 and 205 are selectively etched away with the use of the resist masks 206a and 206b, so that conductive layers 207a and 208a and the conductive layers 207b and 208b are formed (see FIGS. 18A and 18B).

Next, ashing by oxygen plasma is performed on the resist masks 206a and 206b. By performing ashing by oxygen plasma on the resist masks 206a and 206b, the resist mask 206b is removed and the conductive layer 207b is exposed. In addition, the resist mask 206a is reduced in size and remains as a resist mask 209 (see FIGS. 18C and 18D). By using the resist mask formed using the multi-tone mask in this manner, a resist mask is not additionally used, so that steps can be simplified.

Next, the conductive layers 207a and 207b are etched using the resist mask 209, so that a conductive layer 210a is formed (see FIGS. 18E and 18F). After the etching, the resist mask 209 is removed. Accordingly, the conductive layer 207b is removed and the conductive layer 208b is exposed. Further, part of the conductive layer 207a, over which the resist mask 209 is not formed, is removed, so that the conductive layer 208a is exposed. The surface areas of the conductive layer 210a which is formed by the etching and the conductive layer 208a are greatly different from each other. That is, the surface area of the conductive layer 208a is larger than the surface area of the conductive layer 210a. Alternatively, as for the conductive layers 210a and 208a, there are a region where the conductive layers 210a and 208a overlap with each other and a region where the conductive layers 210a and 208a do not overlap with each other.

In the region where the conductive layers 208a and 210a overlap with each other, the conductive layers 208a and 210a function as the source wiring. In the region where the conductive layers 208a and 210a do not overlap with each other, the conductive layer 208a functions as the source electrode or the drain electrode. By forming the conductive layer 208a functioning as the source electrode or the drain electrode with the use of a light-transmitting conductive material, the aperture ratio of the pixel can be improved. In addition, by forming the conductive layer functioning as the source wiring by a stack of the conductive layer 208a and the conductive layer 210a which has higher electric conductivity than the conductive layer 208a, wiring resistance can be reduced, and power consumption can be reduced. Further, since the source wiring is formed using the light-blocking conductive layer 210a, a space between pixels can be shielded from light.

By using a multi-tone mask as described above, a light-transmitting region (a region with high transmittance) and a light-blocking region (a region with low transmittance) can be formed with one mask. Accordingly, the light-transmitting region (the region with high transmittance) and the light-blocking region (the region with low transmittance) can be formed without an increase in the number of masks.

Next, after a gate insulating film 211 is formed over the conductive layers 208a and 208b, conductive films 212 and 213 are formed over the gate insulating film 211 (see FIGS. 19A and 19B). As for the materials and manufacturing methods of the conductive films 212 and 213, those of the gate insulating film 110, the conductive film 111, and the conductive film 114 described in Embodiment 1 can be referred to.

Next, resist masks 214a and 214b are formed over the conductive film 213 with the use of a half-tone mask. The half-tone mask includes semi-light-transmitting layers 303a and 303b and light-blocking layers 303c and 303d on the light-transmitting substrate 302. Therefore, a resist mask provided in a portion serving as a gate wiring later is formed thick and a resist mask provided in a portion serving as a gate electrode later is formed thin over the conductive film 213 (see FIGS. 19C and 19D).

Figure 20A:
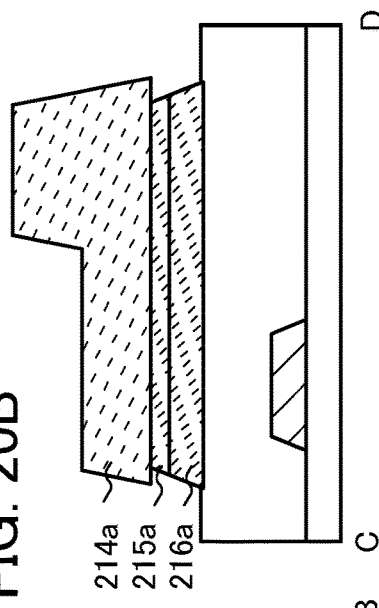
FIGS. 20A to 20F are cross-sectional views according to one embodiment of the present invention.
Figure 20B:
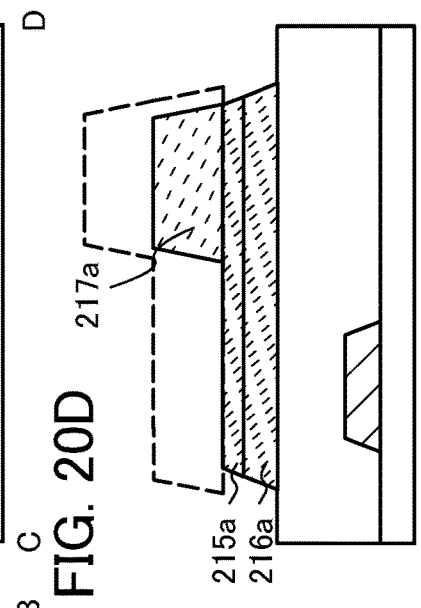
Figure 20C:
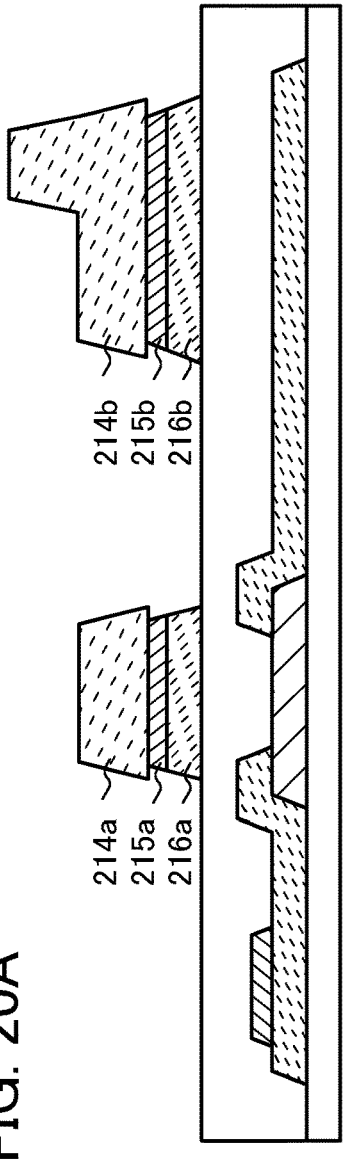
Figure 20D:
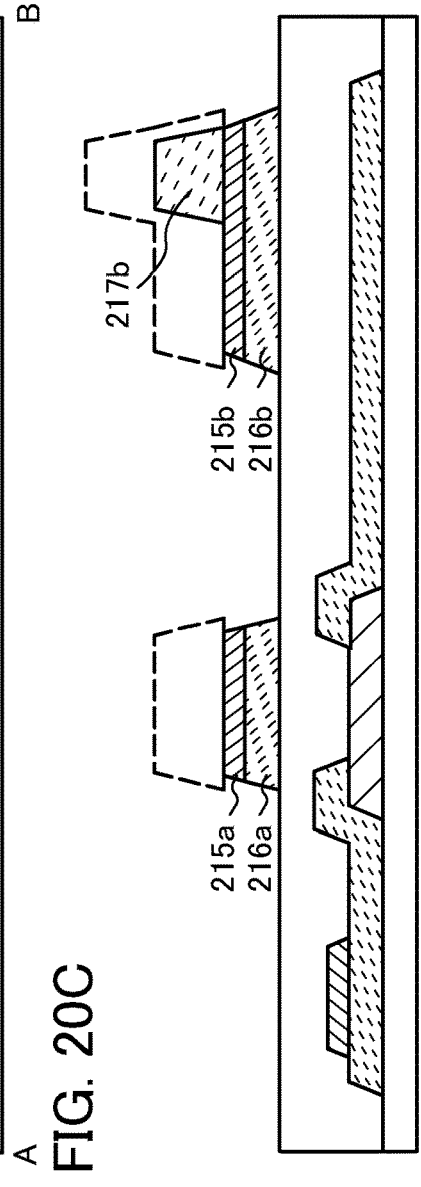

Unnecessary portions of the conductive films 212 and 213 are selectively etched away with the use of the resist masks 214a and 214b, so that conductive layers 215a and 216a and conductive layers 215b and 216b are formed (see FIGS. 20A and 20B).

Next, ashing by oxygen plasma is performed on the resist masks 214a and 214b. By performing ashing by oxygen plasma on the resist masks 214a and 214b, the resist masks 214a and 214b are reduced in size and remain as resist masks 217a and 217b (see FIGS. 20C and 20D). By using the resist mask formed using the multi-tone mask in this manner, a resist mask is not additionally used, so that steps can be simplified.

Figure 20E:
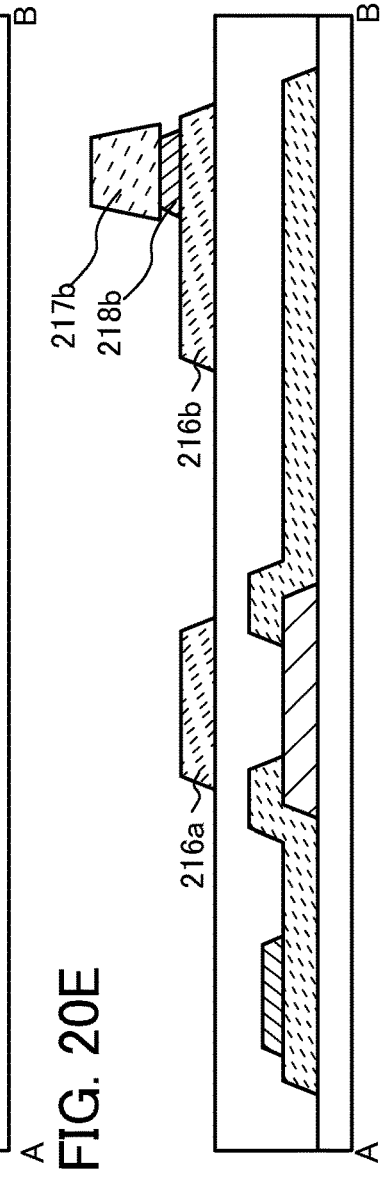
Figure 20F:
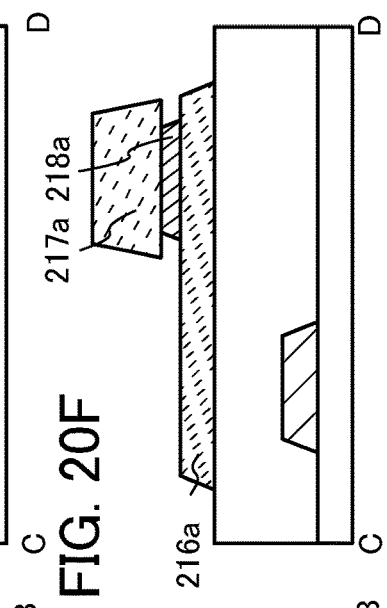

Next, the conductive layers 215a and 215b are etched using the resist masks 217a and 217b (see FIGS. 20E and 20F). Accordingly, parts of the conductive layers 215a and 215b, over which the resist masks 217a and 217b are not formed, are removed, so that the conductive layers 216a and 216b are exposed. The surface areas of conductive layers 218a and 218 formed through the above step and the surface areas of the conductive layers 216a and 216b are greatly different from each other. That is, the surface areas of the conductive layers 216a and 216b are larger than the surface areas of the conductive layers 218a and 218b. Alternatively, as for the conductive layers 216a and 218a, there are a region where the conductive layers 216a and 218a overlap with each other and a region where the conductive layers 216a and 218a do not overlap with each other. Note that after the etching, the resist masks 217a and 217b are removed.

A region including at least the conductive layer 218a functions as the gate wiring, and a region including the conductive layer 216a functions as the gate electrode. By forming the conductive layer 216a functioning as the gate electrode with the use of a light-transmitting conductive layer, the aperture ratio of the pixel can be improved. In addition, by forming the conductive layer 216a functioning as the gate wiring and the conductive layer 218a by a stack of the conductive layer 216a and the conductive layer 218a which has higher electric conductivity than the conductive layer 216a, wiring resistance can be reduced, and power consumption can be reduced. Further, since the gate wiring is formed using the light-blocking conductive layer 218a, the space between the pixels can be shielded from light. That is, with the gate wiring disposed in a row direction and the source wiring disposed in a column direction, the space between the pixels can be shielded from light without use of a black matrix.

Further, a capacitor wiring is provided in the same direction as the gate wiring. The capacitor wiring is formed using the conductive layer 216b and the conductive layer 218b which has higher electric conductivity than the conductive layer 216b. By forming the capacitor wiring in this manner, wiring resistance can be lowered and power consumption can be reduced. Further, the conductive layer 216b functions also as an electrode of a storage capacitor portion 260. In the storage capacitor, the storage capacitor portion 260 includes the gate insulating film 211 as a dielectric, and the conductive layers 208b and 216b functioning as the electrodes.

By forming the storage capacitor portion 260 with the use of the light-transmitting conductive layers as described above, light can be transmitted also in a portion where the storage capacitor portion 260 is formed. Thus, the aperture ratio can be improved. In addition, by forming the storage capacitor portion 260 with the use of the light-transmitting conductive materials, the storage capacitor portion 260 can be made larger. Thus, even when a transistor is turned off, potential holding properties of a pixel electrode is improved and display quality is improved. Further, a feedthrough potential can be lowered.

In this manner, a transistor 250 and the storage capacitor portion 260 illustrated in FIGS. 16A and 16B can be formed.

Next, after an insulating film 219 is formed, a resist mask (not illustrated) is formed over the insulating film 219 and the insulating film 219 is etched using the resist mask, so that a contact hole is formed in the insulating film 219 (see FIGS. 21A and 21B). Then, a conductive film 220 is formed over the insulating film 219 and the contact hole. As for the materials and manufacturing methods of the insulating film 219 and the conductive film 220, those of the insulating film 117 and the conductive film 118 in Embodiment 1 can be referred to. Note that the insulating film 219 is not necessarily formed. The pixel electrode may be formed over the same layer as the gate electrode and the gate wiring.

Next, a resist mask (not illustrated) is formed over the conductive film 220 and the conductive film 220 is selectively etched using the resist mask, so that conductive layers 221a, 221b, and 221c are formed (see FIGS. 21C and 21D). The conductive layers 221a, 221b, and 221c function as pixel electrodes. Note that the resist mask is removed after the etching.

As described above, a semiconductor device can be manufactured. Since a multi-tone photomask can achieve three levels of exposure to obtain an exposed portion, a half-exposed portion, and an unexposed portion, a resist mask with regions of a plurality of thicknesses (typically two kinds of thicknesses) can be formed by one-time exposure and development process. Thus, with the use of the multi-tone mask, the number of photomasks can be reduced. By the manufacturing method described in this embodiment, the light-transmitting transistor 250 and the light-transmitting storage capacitor portion 260 can be formed. Therefore, since a wiring for connecting the transistor and an element (e.g., a different transistor) to each other can be formed using a material having low resistivity and high electric conductivity in a pixel, waveform distortion of a signal can be suppressed and voltage drop due to wiring resistance can be reduced.

Note that it is not necessary that light be transmitted through a transistor portion in a protection circuit or a peripheral driver circuit portion such as a gate driver or a source driver. Thus, a transistor and a capacitor in a pixel portion may be formed using light-transmitting materials and a transistor in the peripheral driver circuit portion may be formed using a light-blocking material (see FIG. 25B).

Figure 23A:
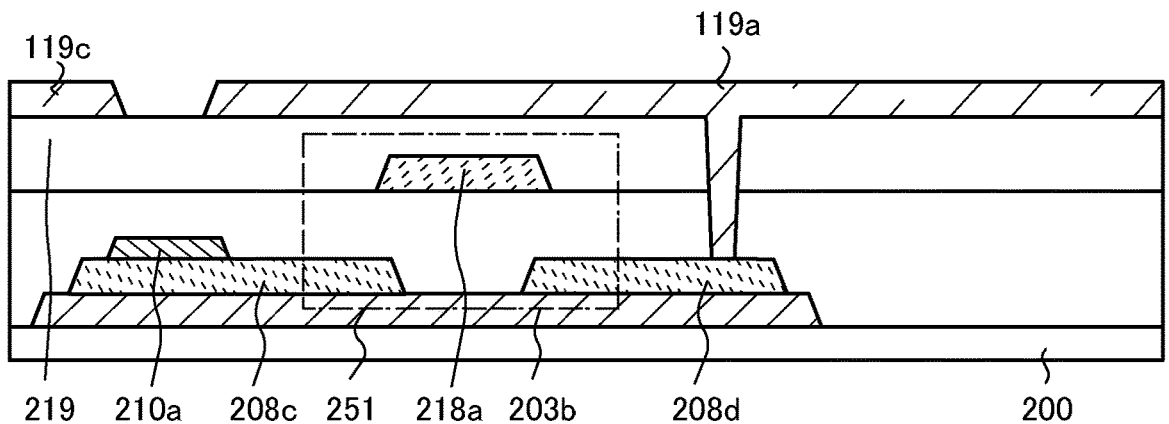
FIGS. 23A to 23C are cross-sectional views according to one embodiment of the present invention.

Although the case where a multi-tone mask is used for forming a source wiring, a source electrode, a gate wiring, and a gate electrode is described in this embodiment, one embodiment of the present invention is not limited to this. For example, a multi-tone mask can also be used for forming a semiconductor film, a source wiring, and a source electrode. Note that although the case where a multi-tone mask is used in both the step of forming a gate wiring and the step of forming a source wiring is described in this embodiment, the multi-tone mask may be used in either the step of forming the gate wiring or the step of forming the source wiring. Further, the multi-tone mask can be used in the step of forming a semiconductor layer and the source wiring. FIG. 23A illustrates the case where the semiconductor layer, the source wiring, and the source electrode are formed using a multi-tone mask.

Figure 23B:
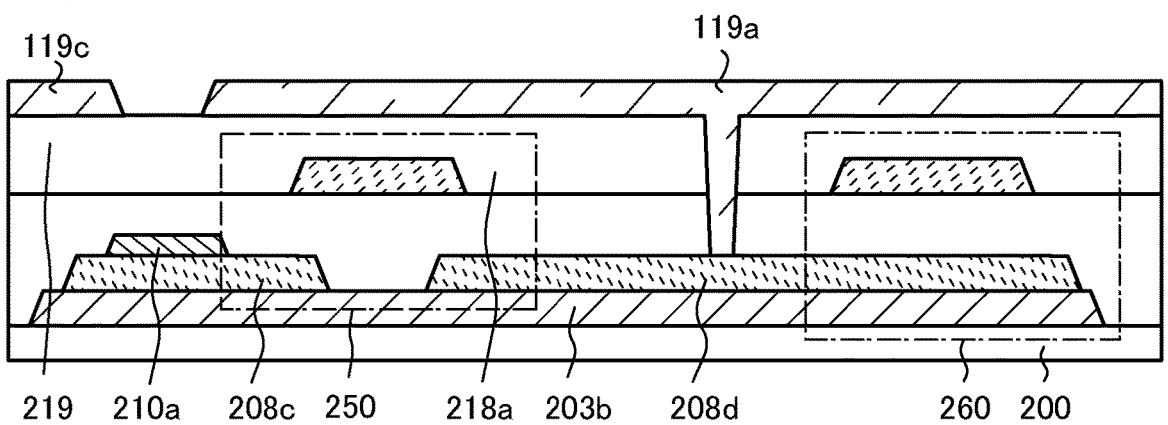
Figure 23C:
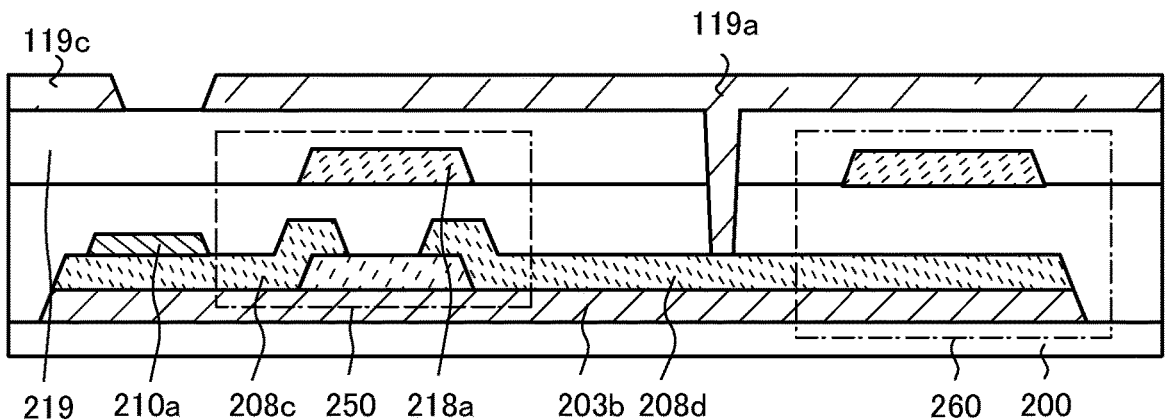

FIG. 23B illustrates the case where the semiconductor layer, the source wiring, and the source electrode are formed using a multi-tone mask and a storage capacitor portion is formed. In addition, a multi-tone mask can also be used in the case where a channel protective film is formed over a channel formation region of a semiconductor film (see FIG. 23C). Since a semiconductor layer of the transistor 250 and an oxide semiconductor layer of the storage capacitor portion 260 are formed in one island in FIGS. 23B and 23C, layout for forming the oxide semiconductor layer can be facilitated. Further, since the number of contact holes can be reduced, contact resistance can be lowered. Further, contact defects can be reduced.

Figure 35A:
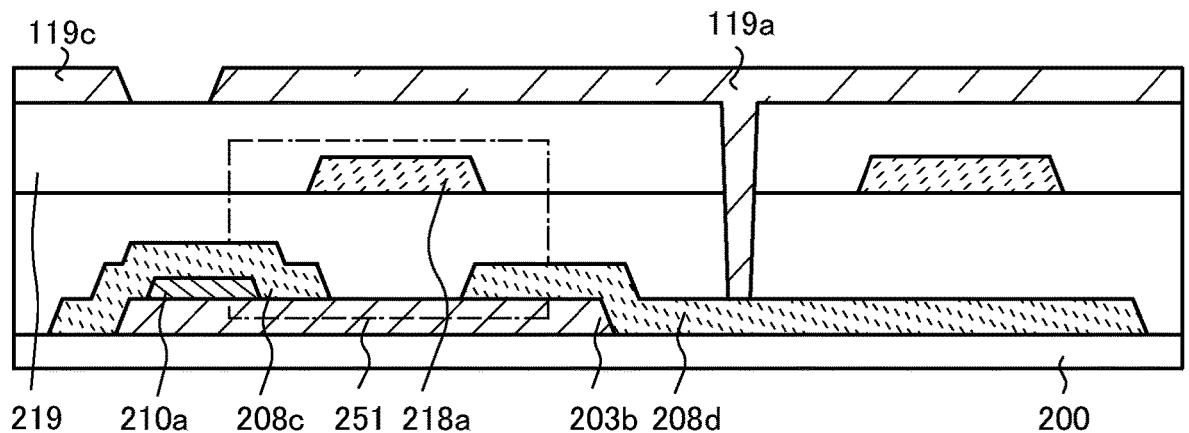
FIGS. 35A and 35B are cross-sectional views according to one embodiment of the present invention.
Figure 35B:
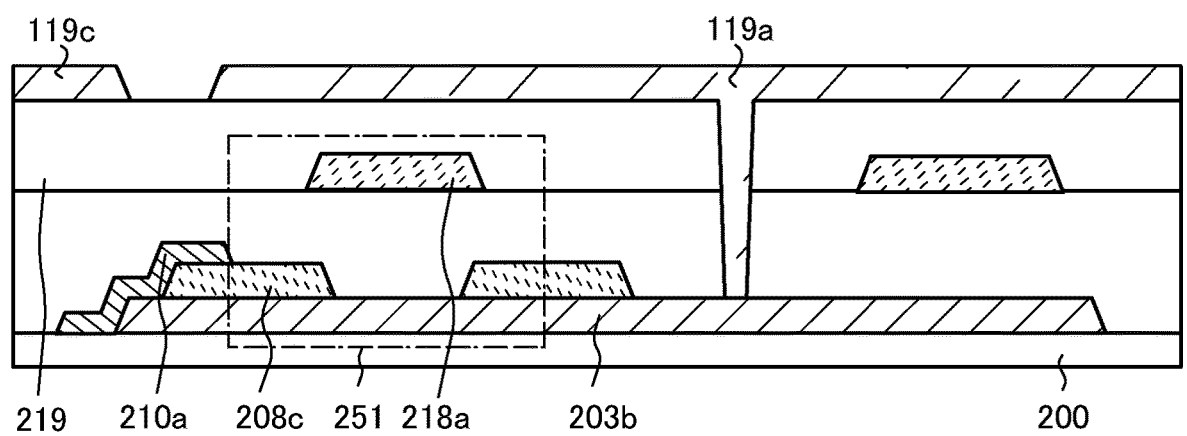

Next, FIG. 35A illustrates the case where a semiconductor layer 203b and a conductive layer 210a functioning as a source wiring are formed using a multi-tone mask. Further, FIG. 35B illustrates the case where the semiconductor layer 203b and conductive layers 208c and 208d functioning as a source electrode and a drain electrode are formed using a multi-tone mask.

This embodiment can be combined with any of the other embodiments as appropriate.

Embodiment 3

In this embodiment, an example in which at least part of a driver circuit and a thin film transistor provided in a pixel portion are formed over the same substrate in a display device is described.

Figure 24A:
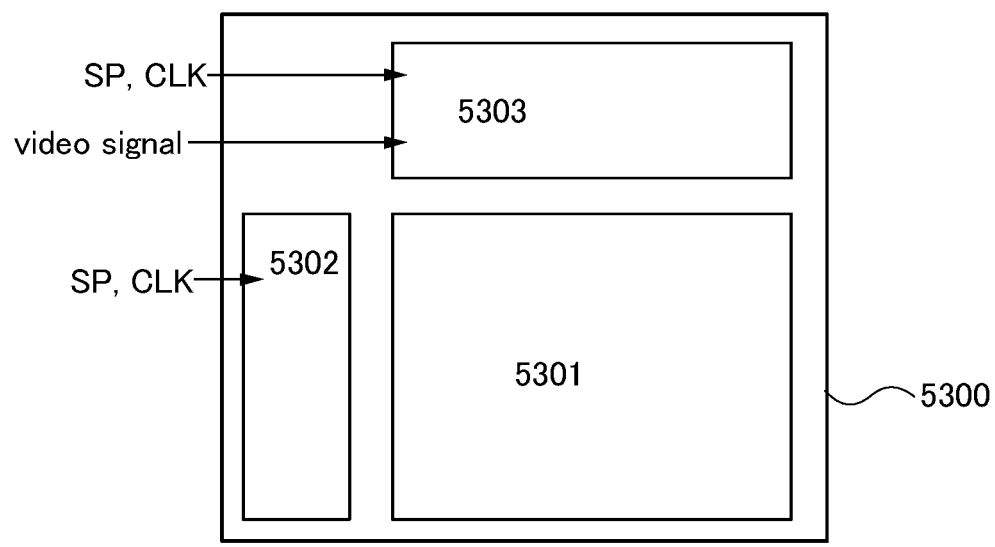
FIGS. 24A and 24B are block diagrams according to one embodiment of the present invention.

FIG. 24A is an example of a block diagram of an active matrix liquid crystal display device which is an example of a display device. The display device illustrated in FIG. 24A includes, over a substrate 5300, a pixel portion 5301 including a plurality of pixels each having a display element; a scan line driver circuit 5302 for selecting a pixel; and a signal line driver circuit 5303 for controlling a video signal which is input to the selected pixel.

Figure 24B:
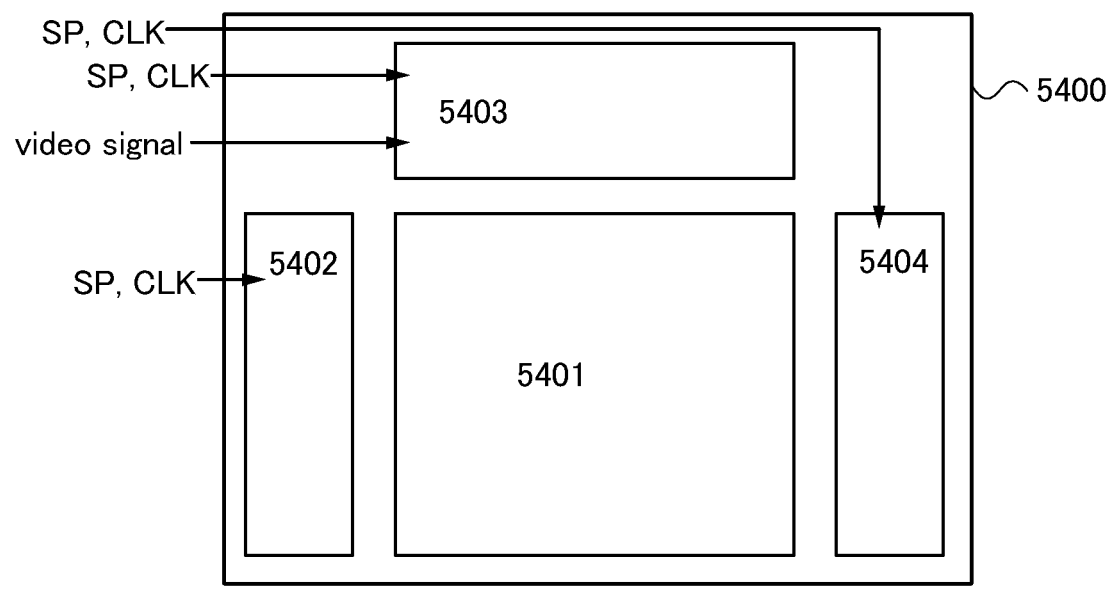

A light-emitting display device illustrated in FIG. 24B includes, over a substrate 5400, a pixel portion 5401 including a plurality of pixels each having a display element; a first scan line driver circuit 5402 and a second scan line driver circuit 5404 for selecting a pixel; and a signal line driver circuit 5403 for controlling a video signal which is input to the selected pixel.

In the case where a video signal which is input to a pixel of the light-emitting display device illustrated in FIG. 24B is a digital signal, the pixel is in a light-emitting state or in a non-light-emitting state by switching of on/off of a transistor. Thus, gray levels can be displayed using an area ratio gray scale method or a time ratio gray scale method. An area ratio gray scale method refers to a driving method by which one pixel is divided into a plurality of subpixels and the subpixels are driven separately on the basis of video signals so that gray levels are displayed. Further, a time ratio gray scale method refers to a driving method by which a period during which light emitted in a pixel is controlled so that gray levels are displayed.

Since the response time of a light-emitting element is shorter than the response time of a liquid crystal element or the like, the light-emitting element is more suitable for a time ratio gray scale method than the liquid crystal element. In the case of performing display by a time ratio gray scale method, one frame period is divided into a plurality of subframe periods. Then, in accordance with video signals, the light-emitting element in the pixel is set to be in a light-emitting state or a non-light-emitting state in each subframe period. By dividing one frame period into a plurality of subframes periods, the total length of time during which light is emitted in pixels in one frame period can be controlled with video signals, so that gray levels can be displayed.

Note that in the light-emitting display device illustrated in FIG. 24B, in the case where two switching TFTs are provided in one pixel, the first scan line driver circuit 5402 generates a signal which is input to a first scan line serving as a gate wiring of one of the switching TFTs, and the second scan line driver circuit 5404 generates a signal which is input to a second scan line serving as a gate wiring of the other of the switching TFTs; however, one scan line driver circuit may generate both the signal which is input to the first scan line and the signal which is input to the second scan line. In addition, for example, there is a possibility that a plurality of scan lines used for controlling the operation of the switching element are provided in each pixel, depending on the number of the switching TFTs included in one pixel. In such a case, one scan line driver circuit may generate all signals that are input to the plurality of scan lines, or a plurality of scan line driver circuits may generate all the signals that are input to the plurality of scan lines.

The thin film transistor to be provided in the pixel portion of the liquid crystal display device is formed as in Embodiment 1 or 2. Further, since the thin film transistors described in Embodiments 1 and 2 are n-channel TFTs, part of a driver circuit which can be formed using an n-channel TFT among driver circuits is formed over the same substrate as the thin film transistor in the pixel portion.

Also in the light-emitting display device, part of a driver circuit which can be formed using an n-channel TFT among driver circuits can be formed over the same substrate as the thin film transistor in the pixel portion. Alternatively, the signal line driver circuit and the scan line driver circuit can be formed using only the n-channel TFTs described in Embodiments 1 and 2.

Note that it is not necessary that light be transmitted through a transistor in a protection circuit or a peripheral driver circuit portion such as a gate driver or a source driver. Thus, light is transmitted through a transistor and a capacitor in a pixel portion, and light is not necessarily transmitted through a transistor in the peripheral driver circuit portion.

Figure 25A:
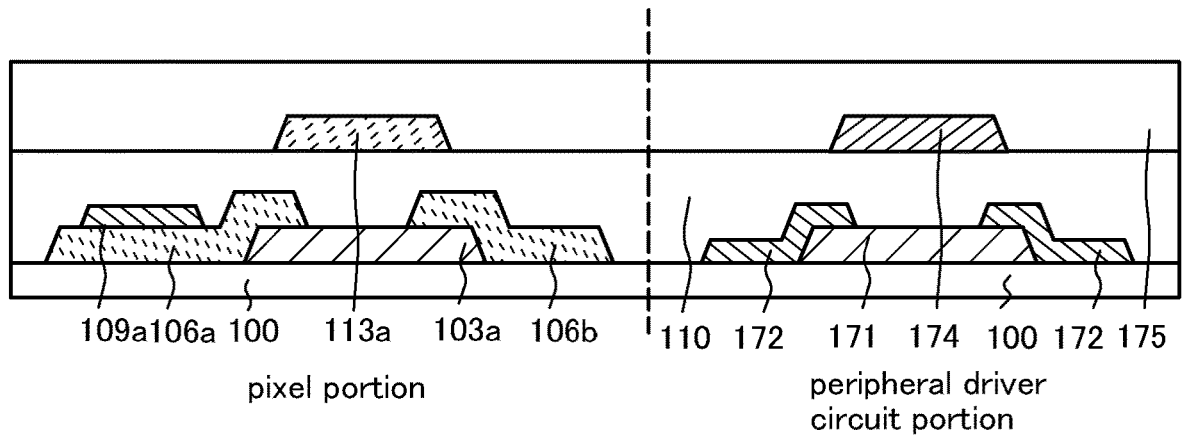
FIGS. 25A and 25B are cross-sectional views according to one embodiment of the present invention.
Figure 25B:
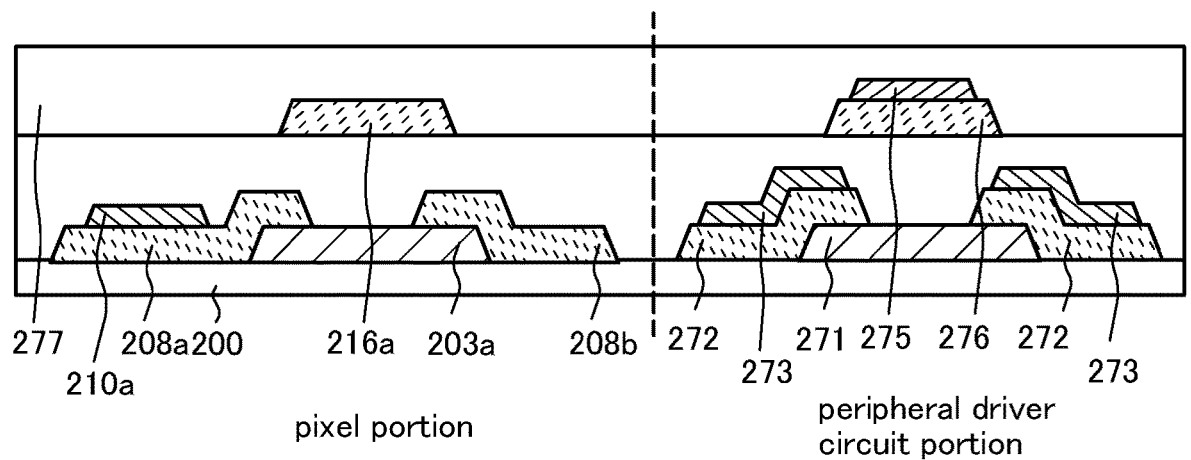

FIG. 25A illustrates the case where a thin film transistor is formed without use of a multi-tone mask, and FIG. 25B illustrates the case where a thin film transistor is formed using a multi-tone mask. The thin film transistor formed without use of a multi-tone mask includes a semiconductor layer 171 provided over the substrate 100 having an insulating surface, conductive layers 172 which are provided over the semiconductor layer 171 and function as a source electrode and a drain electrode, the gate insulating film 110 provided over the conductive layers 172, and a conductive layer 174 which is provided over the gate insulating film 110 and functions as a gate electrode. The conductive layer 174 functioning as the gate electrode and the conductive layers 172 functioning as the source electrode and the drain electrode can be formed using light-blocking conductive layers (see FIG. 25A). Further, an insulating film 175 is formed over the conductive layer 174 functioning as the gate electrode.

The thin film transistor formed using a multi-tone mask includes a semiconductor layer 271 provided over the substrate 200 having an insulating surface, conductive layers 272 and 273 which are provided over the semiconductor layer 271 and function as a source electrode and a drain electrode, a gate insulating film provided over the conductive layers 273, and conductive layers 275 and 276 which are provided over the gate insulating film and function as a gate electrode. The gate electrode, the source electrode, and the drain electrode can be each formed by stacking a light-transmitting conductive layer and a light-blocking conductive layer (see FIG. 25B). Further, an insulating film 277 is formed over the conductive layers 275 and 276 functioning as the gate electrode.

Note that it is not necessary that light be transmitted through a transistor in a protection circuit or a peripheral driver circuit portion such as a gate driver or a source driver. Therefore, for a semiconductor layer used in one embodiment of the present invention, as well as an oxide semiconductor, any of a crystalline semiconductor (a single crystal semiconductor or a polycrystalline semiconductor), an amorphous semiconductor, a microcrystalline semiconductor, an organic semiconductor, and the like may be used.

Further, the above driver circuit may be used in an electronic paper in which electronic ink is driven using an element which is electrically connected to a switching element, without limitation to a liquid crystal display device or a light-emitting display device. An example of electronic paper is an electrophoretic display device (electrophoretic display) or the like. Electronic paper has advantages of the same level of readability as plain paper, lower power consumption than other display devices, and reduction in thickness and weight.

This embodiment can be combined with any of the structures described in the other embodiments as appropriate.

Embodiment 4

Next, the structure of a display device which is one embodiment of a semiconductor device is described. In this embodiment, a light-emitting display device including a light-emitting element utilizing electroluminescence is described as a display device. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are injected from a pair of electrodes into a layer containing a light-emitting organic compound, and current flows. These carriers (electrons and holes) are recombined, so that the light-emitting organic compound is excited. The light-emitting organic compound emits light in returning to a ground state from the excited state. Due to such a mechanism, such a light-emitting element is referred to as a current-excitation light-emitting element.

Inorganic EL elements are classified according to their element structures into dispersion-type inorganic EL elements and thin-film inorganic EL elements. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is interposed between dielectric layers, which are further interposed between electrodes, and its light emission mechanism is localized type light emission which utilizes inner-shell electron transition of metal ions. Note that an organic EL element is used as a light-emitting element in this example.

Figure 26A:
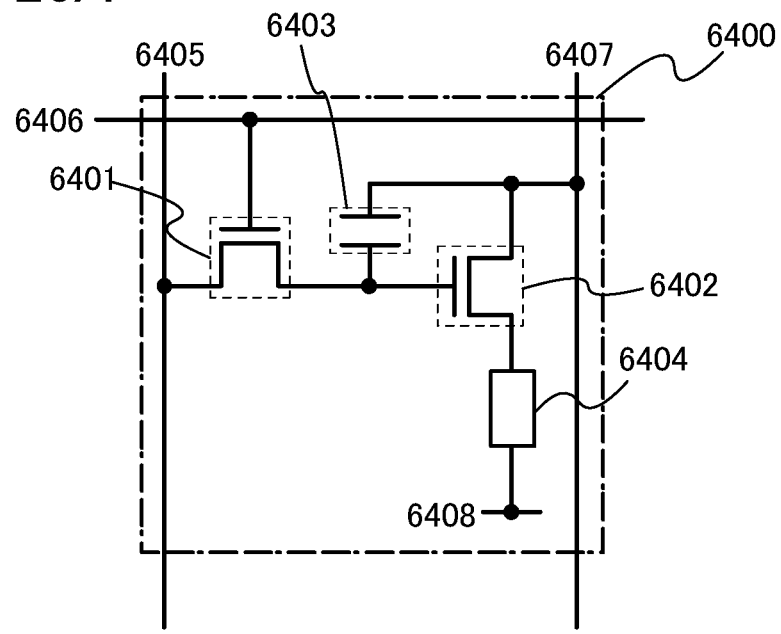
FIGS. 26A and 26B are circuit diagrams of a semiconductor device according to one embodiment of the present invention.
Figure 26B:
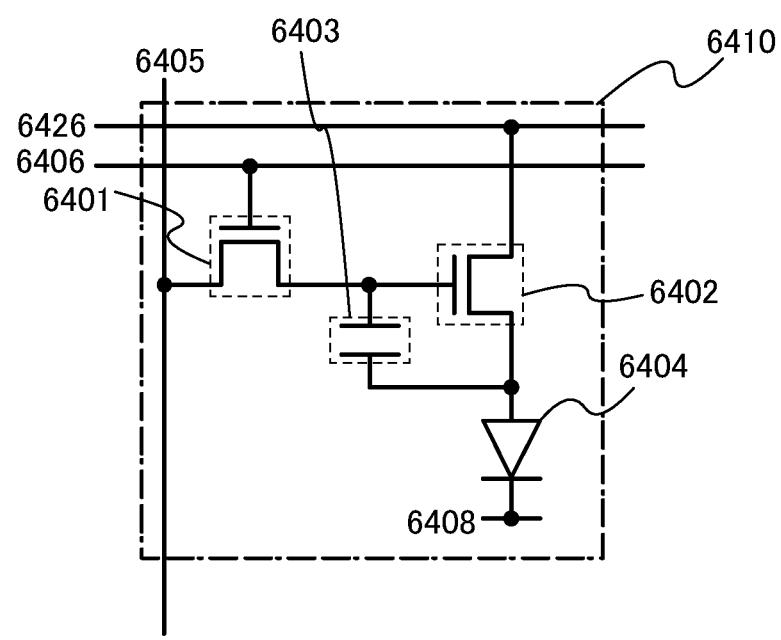

Next, a structure and operation of a pixel to which digital time ratio gray scale driving can be applied is described. FIGS. 26A and 26B illustrate examples of pixel structures to which digital time gray scale driving can be applied. Here, an example is described in which one pixel includes two n-channel transistors each having a semiconductor layer as a channel formation region.

A pixel 6400 illustrated in FIG. 26A includes a switching transistor 6401, a driving transistor 6402, a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the driving transistor 6402. The gate of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408.

Note that the second electrode (the common electrode 6408) of the light-emitting element 6404 is set to a low power supply potential. Note that the low power supply potential is a potential satisfying the low power supply potential<a high power supply potential with reference to the high power supply potential which is set to the power supply line 6407. As the low power supply potential, GND, 0 V, or the like may be employed, for example. A potential difference between the high power supply potential and the low power supply potential is applied to the light-emitting element 6404 and current flows to the light-emitting element 6404, so that the light-emitting element 6404 emits light. Here, in order to make the light-emitting element 6404 emit light, each potential is set so that the potential difference between the high power supply potential and the low power supply potential is forward threshold voltage (Vth) or higher of the light-emitting element 6404.

Note gate capacitance of the driving transistor 6402 may be used as a substitute for the capacitor 6403, so that the capacitor 6403 can be eliminated. The gate capacitance of the driving transistor 6402 may be formed between a channel region and the gate electrode.

In the case of a voltage-input voltage driving method, a video signal is input to the gate of the driving transistor 6402 so that the driving transistor 6402 is in either of two states of being sufficiently turned on or turned off. That is, the driving transistor 6402 operates in a linear region. Since the driving transistor 6402 operates in the linear region, voltage which is higher than the voltage of the power supply line 6407 is applied to the gate of the driving transistor 6402. Note that voltage which is higher than or equal to (voltage of the power supply line +Vth of the driving transistor 6402) is applied to the signal line 6405.

In the case of using an analog gray scale method instead of the digital time ratio gray scale method, the same pixel structure as in FIG. 26A can be used by changing signal input.

In the case of performing analog gray scale driving, voltage which is higher than or equal to (forward voltage of the light-emitting element 6404 and Vth of the driving transistor 6402) is applied to the gate of the driving transistor 6402. The forward voltage of the light-emitting element 6404 refers to voltage at which desired luminance is obtained and refers to at least forward threshold voltage. Note that a video signal by which the driving transistor 6402 operates in a saturation region is input, so that current can flow to the light-emitting element 6404. In order for the driving transistor 6402 to operate in the saturation region, a potential of the power supply line 6407 is set to a potential which is higher than a gate potential of the driving transistor 6402. When an analog video signal is used as a video signal, current corresponding to the video signal can flow to the light-emitting element 6404, and the analog gray scale driving can be performed.

Note that the pixel structure is not limited to the pixel structure in FIG. 26A. For example, the pixel in FIG. 26A can further include a switch, a resistor, a capacitor, a transistor, a logic circuit, or the like. For example, a pixel structure illustrated in FIG. 26B may be used. A pixel 6410 illustrated in FIG. 26B includes the switching transistor 6401, the driving transistor 6402, the light-emitting element 6404, and the capacitor 6403. The gate of the switching transistor 6401 is connected to the scan line 6406. The first electrode (the one of the source electrode and the drain electrode) of the switching transistor 6401 is connected to the signal line 6405. The second electrode (the other of the source electrode and the drain electrode) of the switching transistor 6401 is connected to the gate of the driving transistor 6402. The gate of the driving transistor 6402 is connected to the first electrode (the pixel electrode) of the light-emitting element 6404 through the capacitor 6403. The first electrode of the driving transistor 6402 is connected to the wiring 6426 for applying pulse voltage. The second electrode of the driving transistor 6402 is connected to the first electrode of the light-emitting element 6404. The second electrode of the light-emitting element 6404 corresponds to the common electrode 6408. Needless to say, a switch, a resistor, a capacitor, a transistor, a logic circuit, or the like may be added to this structure.

Next, structures of the light-emitting element are described with reference to FIGS. 27A to 27C. Here, cross-sectional structures of pixels are described by taking the case where the transistor 150 illustrated in FIGS. 10A and 10B is used as a driving TFT as an example. Driving TFTs 7001, 7011, and 7021 used in semiconductor devices illustrated in FIGS. 27A to 27C can be manufactured in a manner similar to those of the thin film transistors described in Embodiments 1 and 2 and are thin film transistors with favorable electrical characteristics each having an oxide semiconductor as a semiconductor layer.

In order to extract light emitted from the light-emitting element, at least one of an anode and a cathode may be transparent. A thin film transistor and a light-emitting element are formed over a substrate. A light-emitting element can have a top emission structure in which light is extracted through a surface which is opposite to the substrate; a bottom emission structure in which light is extracted through a surface on the substrate side; or a dual emission structure in which light is extracted through a surface which is opposite to the substrate and a surface on the substrate side. The pixel structures illustrated in FIGS. 26A and 26B can be applied to a light-emitting element having any of these emission structures.

A light-emitting element having a top emission structure is described with reference to FIG. 27A.

Figure 27A:
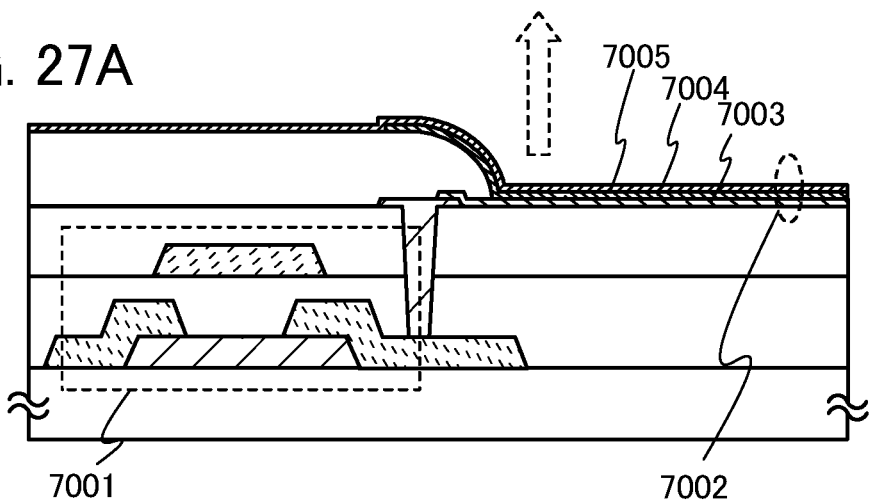
FIGS. 27A to 27C are cross-sectional views of display devices according to one embodiment of the present invention.

FIG. 27A is a cross-sectional view of a pixel in the case where the driving TFT 7001 corresponds to the transistor 150 illustrated in FIGS. 10A and 10B and light is emitted from a light-emitting element 7002 to the anode 7005 side. In FIG. 27A, a cathode 7003 of the light-emitting element 7002 and the driving TFT 7001 are electrically connected to each other, and a light-emitting layer 7004 and the anode 7005 are stacked in that order over the cathode 7003. The cathode 7003 can be formed using a variety of conductive materials as long as they have low work functions and reflect light. For example, Ca, Al, MgAg, AlLi, or the like is preferably used. The light-emitting layer 7004 may be formed using either a single layer or a plurality of layers stacked. In the case where the light-emitting layer 7004 is formed using a plurality of layers, the light-emitting layer 7004 is formed by stacking an electron injection layer, an electron transport layer, a light-emitting layer, a hole transport layer, and a hole injection layer in that order over the cathode 7003. Note that it is not necessary to provide all these layers. For example, the anode 7005 is formed using a light-transmitting conductive material such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the light-emitting layer 7004 is interposed between the cathode 7003 and the anode 7005. In the case of the pixel illustrated in FIG. 27A, light is emitted from the light-emitting element 7002 to the anode 7005 side, as indicated by an arrow.

Note that the gate electrode provided over the semiconductor layer in the driver circuit is preferably formed using the same material as the cathode 7003 because the process can be simplified. An insulating film may be formed over the anode. For example, since $SiN_x$ and $SiO_x$ have hygroscopic properties, they can prevent the EL element from deteriorating. Further, when the cathode is formed using a transflective film (having a transmittance of 30 to 80% and a reflectivity of 30 to 60%) and a micro-cavity structure (a micro resonator) is applied, color purity can be improved.

Next, a light-emitting element having a bottom emission structure is described with reference to FIG. 27B. FIG. 27B is a cross-sectional view of a pixel in the case where the driving TFT 7011 corresponds to the transistor 150 illustrated in FIGS. 10A and 10B and light is emitted from a light-emitting element 7012 to the cathode 7013 side. In FIG. 27B, the cathode 7013 of the light-emitting element 7012 is formed over a light-transmitting conductive film 7017 which is electrically connected to the driving TFT 7011, and a light-emitting layer 7014 and an anode 7015 are stacked in that order over the cathode 7013. Note that a light-blocking film 7016 for reflecting or blocking light may be formed so as to cover the anode 7015 in the case where the anode 7015 has light-transmitting properties. As in FIG. 27A, the cathode 7013 can be formed using a variety of conductive materials as long as they have low work functions. Note that the cathode 7013 is formed to a thickness that allows light transmission (preferably, approximately 5 to 30 nm). For example, a 20-nm-thick aluminum film can be used as the cathode 7013. As in FIG. 27A, the light-emitting layer 7014 may be formed using either a single layer or a plurality of layers stacked. The anode 7015 does not need to transmit light, but can be formed using a light-transmitting conductive material, as in FIG. 27A. For the light-blocking film 7016, metal or the like which reflects light can be used, for example; however, the light-blocking film 7016 is not limited to a metal film. For example, a resin to which a black pigment is added or the like can be used.

The light-emitting element 7012 corresponds to a region where the light-emitting layer 7014 is interposed between the cathode 7013 and the anode 7015. In the case of the pixel illustrated in FIG. 27B, light is emitted from the light-emitting element 7012 to the cathode 7013 side, as indicated by an arrow.

Note that the gate electrode provided over the semiconductor layer in the driver circuit is preferably formed using the same material as the cathode 7013 because the process can be simplified.

Next, a light-emitting element having a dual emission structure is described with reference to FIG. 27C. In FIG. 27C, a cathode 7023 of a light-emitting element 7022 is formed over a light-transmitting conductive layer 7027 which is electrically connected to the driving TFT 7021, and a light-emitting layer 7024 and an anode 7025 are stacked in that order over the cathode 7023. As in FIG. 27A, the cathode 7023 can be formed using a variety of conductive materials as long as they have low work functions. Note that the cathode 7023 is formed to a thickness that allows light transmission. For example, 20-nm-thick Al can be used for the cathode 7023. As in FIG. 27A, the light-emitting layer 7024 may be formed using either a single layer or a plurality of layers stacked. The anode 7025 can be formed using a light-transmitting conductive material, as in FIG. 27A.

The light-emitting element 7022 corresponds to a region where the cathode 7023, the light-emitting layer 7024, and the anode 7025 overlap with one another. In the case of the pixel illustrated in FIG. 27C, light is emitted from the light-emitting element 7022 to both the anode 7025 side and the cathode 7023 side, as indicated by arrows.

Note that the gate electrode provided over the semiconductor layer in the driver circuit is preferably formed using the same material as the conductive layer 7027 because the process can be simplified. Further, the gate electrode provided over the semiconductor layer in the driver circuit is preferably formed by stacking the material used for the conductive layer 7027 and the material used for the cathode 7023 because the process can be simplified and wiring resistance can be lowered.

Note that although the organic EL elements are described here as the light-emitting elements, an inorganic EL element can be provided as a light-emitting element. An anode may be used in common among all the pixels and a cathode may be patterned into a pixel electrode.

Note that in this embodiment, an example is described in which a thin film transistor (a driving TFT) which controls driving of a light-emitting element is electrically connected to the light-emitting element; however, a structure may be employed in which a TFT for controlling current is connected between the driving TFT and the light-emitting element.

Figure 27B:
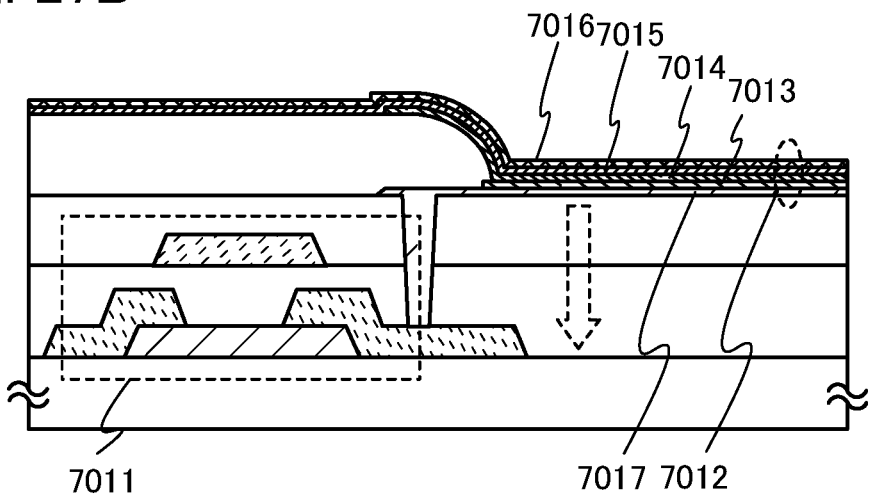
Figure 27C:
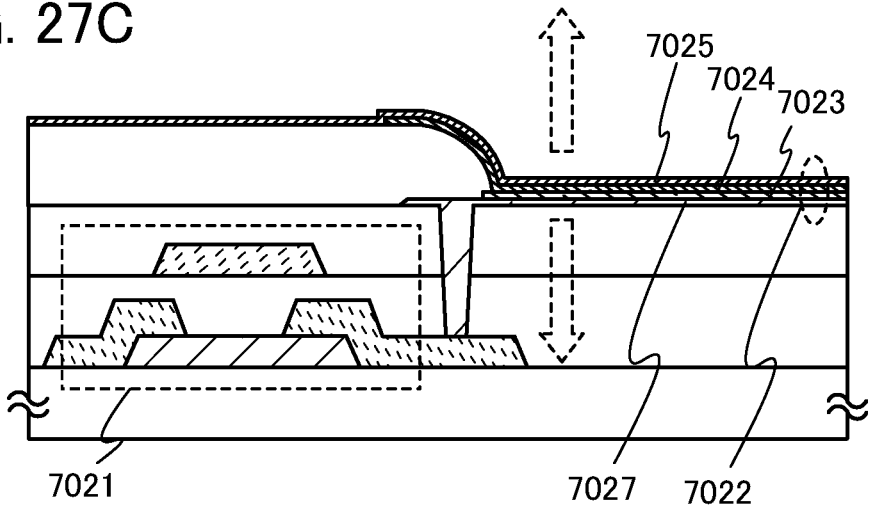

Note that the structure of a semiconductor device described in this embodiment is not limited to the structures illustrated in FIGS. 27A to 27C and can be modified in various ways on the basis of the spirit of techniques disclosed.

Figure 28A:
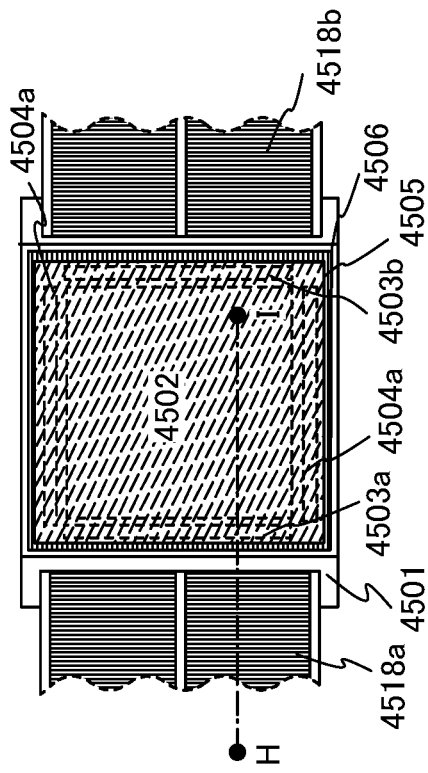
FIGS. 28A and 28B are a top view and a cross-sectional view of a display device according to one embodiment of the present invention.
Figure 28B:
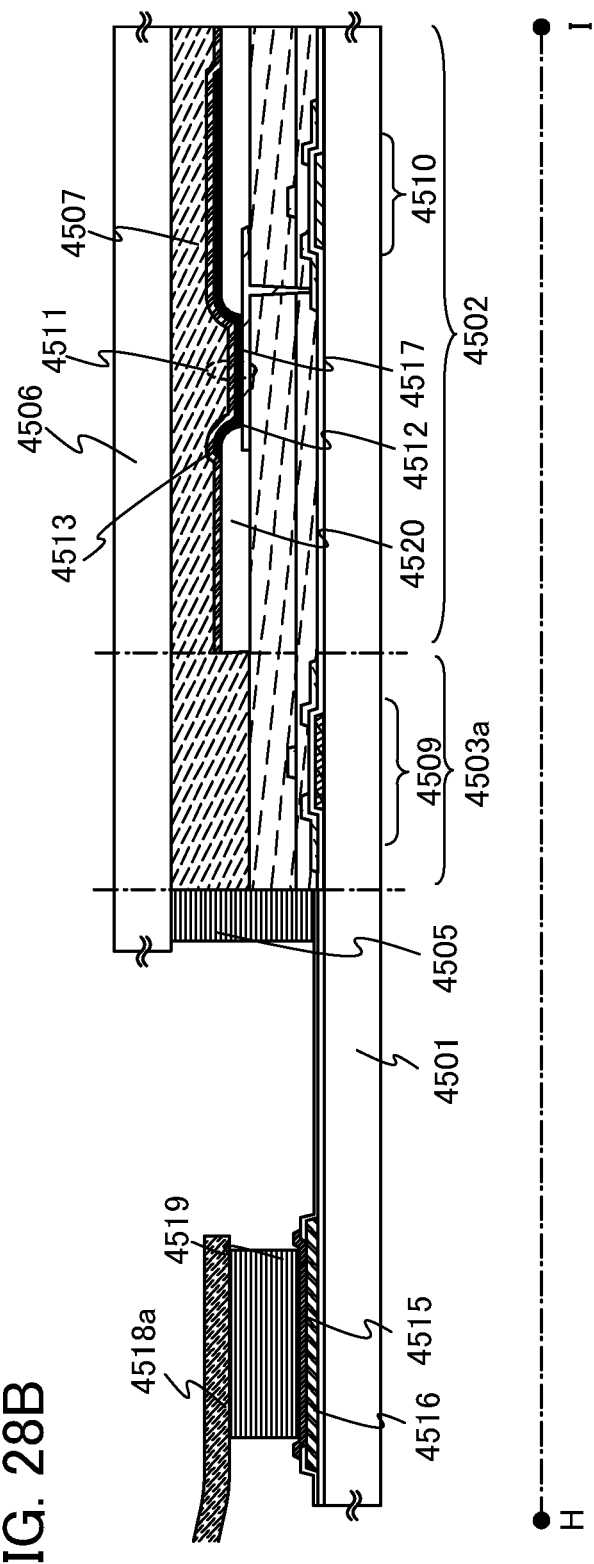

Next, a top surface and a cross section of a light-emitting display panel (also referred to as a light-emitting panel), which is one embodiment of a semiconductor device, are described with reference to FIGS. 28A and 28B. FIG. 28A is a top view of a panel in which a thin film transistor and a light-emitting element which are formed over a first substrate are sealed between the first substrate and a second substrate with a sealant. FIG. 28B is a cross-sectional view taken along line H-I in FIG. 28A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Thus, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that the panel be packaged (sealed) with a protective film (e.g., an attachment film or an ultraviolet curable resin film) or a cover material, which has high air-tightness and causes less degasification, so that the panel is not exposed to the external air, in this manner.

Further, the pixel portion 4502, the signal line driver circuits 4503a and 4503b, and the scan line driver circuits 4504a and 4504b which are provided over the first substrate 4501 each include a plurality of thin film transistors, and a thin film transistor 4510 included in the pixel portion 4502 and a thin film transistor 4509 included in the signal line driver circuit 4503a are illustrated as examples in FIG. 28B. For each of the thin film transistors 4509 and 4510, a highly reliable thin film transistor including an oxide semiconductor as its semiconductor layer as described in Embodiment 1 or 2 can be applied.

Note that it is not necessary that light be transmitted through a transistor portion in a protection circuit or a peripheral driver circuit portion such as a gate driver or a source driver. Thus, a transistor and a capacitor in the pixel portion 4502 may be formed using light-transmitting materials and a transistor in the peripheral driver circuit portion may be formed using a light-blocking material.

Further, reference numeral 4511 denotes a light-emitting element. A first electrode layer 4517 which is a pixel electrode of the light-emitting element 4511 is electrically connected to a source electrode layer or a drain electrode layer of the thin film transistor 4510. Note that although the light-emitting element 4511 has a layered structure of the first electrode layer 4517, an electroluminescent layer 4512, and a second electrode layer 4513, the structure of the light-emitting element 4511 is not limited to the structure described in this embodiment. The structure of the light-emitting element 4511 can be changed as appropriate depending on a direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed using either a single layer or a plurality of layers stacked.

A protective film may be formed over the second electrode layer 4513 and the partition 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

In addition, a variety of signals and potentials are supplied from FPCs 4518a and 4518b to the signal line driver circuits 4503a and 4503b, the scan line driver circuits 4504a and 4504b, or the pixel portion 4502.

A connection terminal electrode 4515 may be formed using the same conductive film as the first electrode layer 4517 of the light-emitting element 4511, and a terminal electrode 4516 may be formed using the same conductive film as the source electrode layers and the drain electrode layers of the thin film transistors 4509 and 4510.

The connection terminal electrode 4515 is electrically connected to a terminal of the FPC 4518a through an anisotropic conductive film 4519.

The second substrate located in the direction in which light is extracted from the light-emitting element 4511 needs to have light-transmitting properties. In this case, a light-transmitting material such as a glass plate, a plastic plate, a polyester film, or an acrylic film is used.

Further, as well as an inert gas such as nitrogen or argon, an ultraviolet curable resin or a thermosetting resin can be used as the filler 4507. PVC (polyvinyl chloride), acrylic, polyimide, an epoxy resin, a silicone resin, PVB (polyvinyl butyral), or EVA (ethylene vinyl acetate) can be used.

In addition, if needed, an optical film such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on a surface so that glare can be reduced.

The signal line driver circuits 4503a and 4503b and the scan line driver circuits 4504a and 4504b may be provided by mounting driver circuits formed using a single crystal semiconductor substrate or a single crystal semiconductor film or a polycrystalline semiconductor film over an insulating substrate separately prepared. Alternatively, only the signal line driver circuits or part thereof, or only the scan line driver circuits or part thereof may be separately formed and mounted. This embodiment is not limited to the structure illustrated in FIGS. 28A and 28B.

Through the above process, a light-emitting display device can be manufactured at lower manufacturing cost.

This embodiment can be combined with any of the structures described in the other embodiments as appropriate.

Embodiment 5

Next, a different structure of a display device which is one embodiment of a semiconductor device is described. In this embodiment, a liquid crystal display device including a liquid crystal element is described as a display device.

Figures 1, 29A:
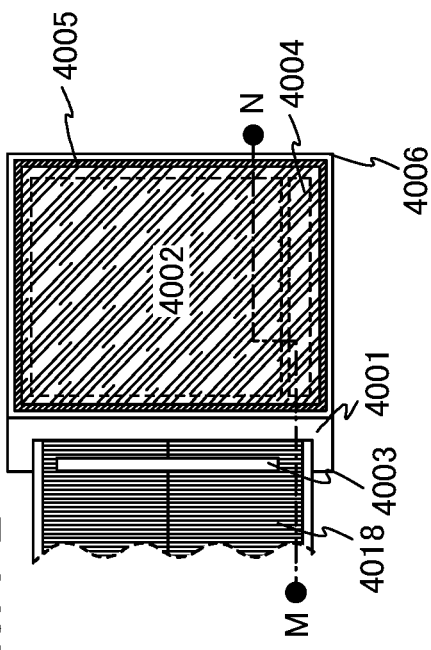
Figures 2, 29A:
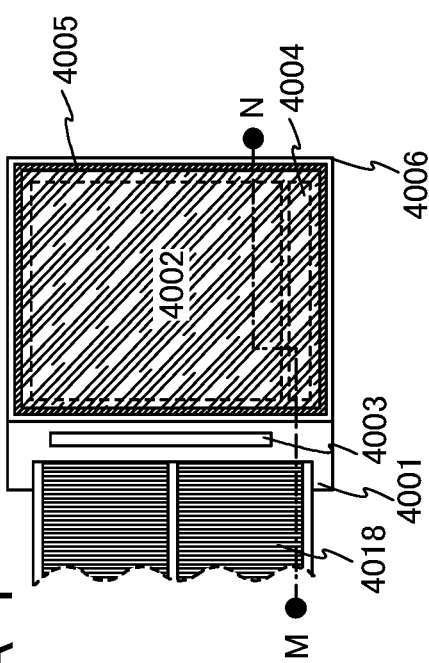
Figure 29B:
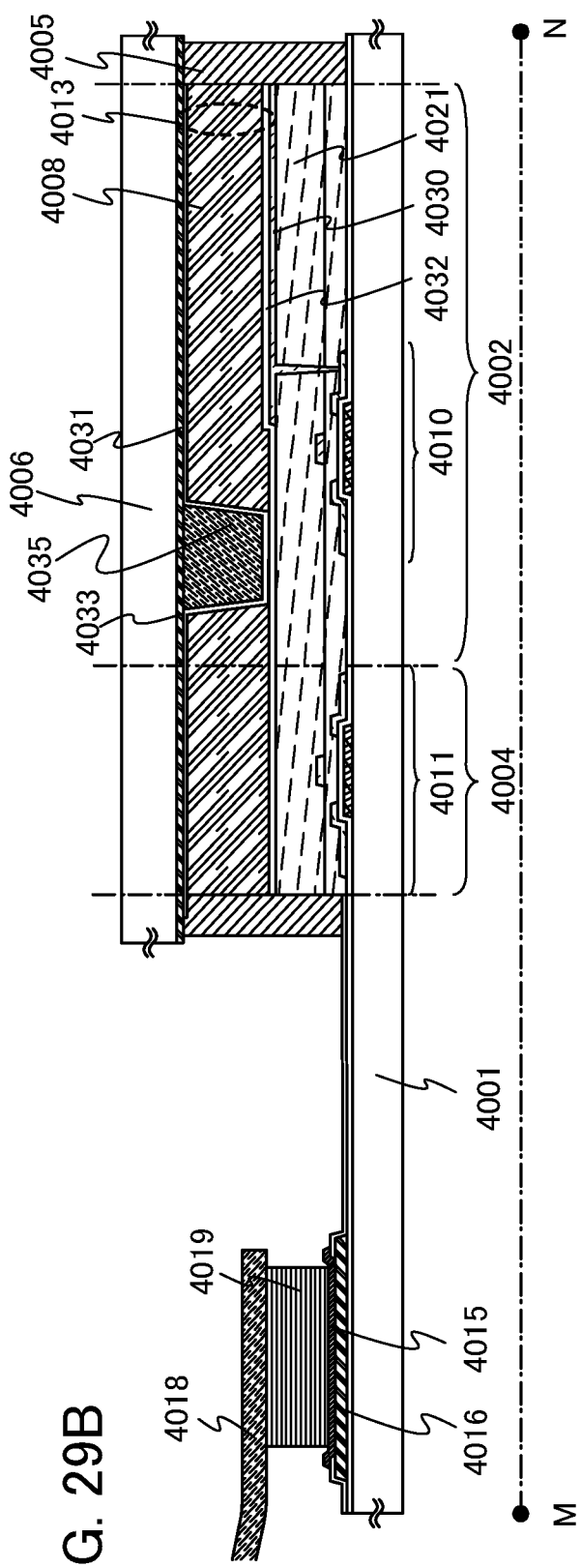

First, a top surface and a cross section of a liquid crystal display panel (also referred to as a liquid crystal panel) which is one embodiment of a liquid crystal display device are described with reference to FIGS. 29A-1, 29A-2, and 29B. FIGS. 29A-1 and 29A-2 are top views of a panel in which highly reliable thin film transistors 4010 and 4011 each including the oxide semiconductor as its semiconductor layer as described in Embodiment 1 or 2 and a liquid crystal element 4013, which are formed over a first substrate 4001, are sealed between the first substrate 4001 and a second substrate 4006 with a sealant 4005. FIG. 29B is a cross-sectional view taken along line M-N in FIGS. 29A-1 and 29A-2.

The sealant 4005 is provided so as to surround a pixel portion 4002 and a scan line driver circuit 4004 which are provided over the first substrate 4001. In addition, the second substrate 4006 is provided over the pixel portion 4002 and the scan line driver circuit 4004. Thus, the pixel portion 4002 and the scan line driver circuit 4004 are sealed together with a liquid crystal layer 4008, by the first substrate 4001, the sealant 4005, and the second substrate 4006. Further, a signal line driver circuit 4003 which is formed using a single crystal semiconductor film or a polycrystalline semiconductor film over a substrate separately prepared is mounted on a region which is different from a region surrounded by the sealant 4005 over the first substrate 4001.

Note that the connection method of a driver circuit which is separately formed is not particularly limited to a certain method, and a COG method, a wire bonding method, a TAB method, or the like can be used. FIG. 29A-1 illustrates an example of mounting the signal line driver circuit 4003 by a COG method, and FIG. 29A-2 illustrates an example of mounting the signal line driver circuit 4003 by a TAB method.

Further, the pixel portion 4002 and the scan line driver circuit 4004 which are provided over the first substrate 4001 each include a plurality of thin film transistors, and the thin film transistor 4010 included in the pixel portion 4002 and the thin film transistor 4011 included in the scan line driver circuit 4004 are illustrated as examples in FIG. 29B. Over the thin film transistors 4010 and 4011, an insulating layer 4021 is provided. For each of the thin film transistors 4010 and 4011, a highly reliable thin film transistor including an oxide semiconductor as its semiconductor layer as described in Embodiment 1 or 2 can be applied.

Note that it is not necessary that light be transmitted through a transistor portion in a protection circuit or a peripheral driver circuit portion such as a gate driver or a source driver. Thus, a transistor and a capacitor in the pixel portion 4002 may be formed using light-transmitting materials and a transistor in the peripheral driver circuit portion may be formed using a light-blocking material.

In addition, a pixel electrode 4030 of the liquid crystal element 4013 is electrically connected to the thin film transistor 4010. Further, a counter electrode layer 4031 of the liquid crystal element 4013 is provided on the second substrate 4006. A portion where the pixel electrode 4030, the counter electrode layer 4031, and the liquid crystal layer 4008 overlap with one another corresponds to the liquid crystal element 4013. Note that the pixel electrode 4030 and the counter electrode layer 4031 are provided with an insulating layer 4032 and an insulating layer 4033 each functioning as an alignment film, and hold the liquid crystal layer 4008 with the insulating layers 4032 and 4033 interposed therebetween.

In the pixel portion 4002 except a lattice-like wiring portion, light can be transmitted, so that the aperture ratio can be improved. Further, a space is needed between pixel electrodes and an electric field is not applied to a liquid crystal in the space portion. Therefore, it is preferable that light be not transmitted in the space portion. Thus, the lattice-like wiring portion can be used as a black matrix.

Note that the first substrate 4001 and the second substrate 4006 can be formed using glass, metal (typically stainless steel), ceramics, or plastics. As plastics, a fiberglass-reinforced plastic (FRP) plate, a polyvinyl fluoride (PVF) film, a polyester film, or an acrylic resin film can be used. Alternatively, a sheet with a structure in which aluminum foil is interposed between PVF films or polyester films can be used.

In addition, reference numeral 4035 denotes a columnar spacer obtained by selective etching of an insulating film and is provided for controlling the distance between the pixel electrode 4030 and the counter electrode layer 4031 (a cell gap). Note that a spherical spacer may be used. Further, the counter electrode layer 4031 is electrically connected to a common potential line provided over the same substrate as the thin film transistor 4010. With the use of a common connection portion, the counter electrode layer 4031 and the common potential line can be electrically connected to each other by conductive particles disposed between the pair of substrates. Note that the conductive particles are contained in the sealant 4005.

Alternatively, a liquid crystal exhibiting a blue phase for which an alignment film is not used may be used. A blue phase is one of liquid crystal phases, which is generated just before a cholesteric phase changes into an isotropic phase while temperature of a cholesteric liquid crystal is increased. Since the blue phase is generated within an only narrow range of temperature, a liquid crystal composition containing a chiral agent at 5 weight percent or more in order to improve the temperature range is used for the liquid crystal layer 4008. The liquid crystal composition which includes a liquid crystal exhibiting a blue phase and a chiral agent has a short response time of 10 to 100 μs, has optical isotropy, which makes alignment treatment unneeded, and has small viewing angle dependency.

Although the liquid crystal display device described in this embodiment is an example of a transmissive liquid crystal display device, the liquid crystal display device described in this embodiment can be applied to either a reflective liquid crystal display device or a transflective liquid crystal display device.

The liquid crystal display device described in this embodiment is an example in which a polarizing plate is provided on the outer surface of the substrate (on the viewer side) and a coloring layer and an electrode layer used for a display element are provided on the inner surface of the substrate in that order; however, the polarizing plate may be provided on the inner surface of the substrate. In addition, the layered structure of the polarizing plate and the coloring layer is not limited to the layered structure in this embodiment and may be set as appropriate depending on materials of the polarizing plate and the coloring layer or conditions of the manufacturing process. Further, a light-blocking film functioning as a black matrix may be provided.

In this embodiment, in order to reduce surface unevenness of the thin film transistor and to improve reliability of the thin film transistor, the thin film transistor obtained in Embodiment 1 or 2 is covered with the insulating layer 4021 functioning as a protective film or a planarizing insulating film. The insulating layer 4021 can be formed to have a single-layer structure or a layered structure of two or more layers. Note that the protective film is provided in order to prevent entry of contaminant impurities such as organic substance, metal, or moisture existing in the air and is preferably a dense film. The protective film may be formed to have a single layer or a stacked layer of a silicon oxide film, a silicon nitride film, a silicon oxynitride film, a silicon nitride oxide film, an aluminum oxide film, an aluminum nitride film, an aluminum oxynitride film, and/or an aluminum nitride oxide film by sputtering. Although this embodiment describes an example of forming the protective film by sputtering, this embodiment is not particularly limited to this method and any of a variety of methods such as plasma-enhanced CVD may be used.

An insulating layer having a layered structure can be formed for the protective film. In the case of forming an insulating layer having a layered structure, as a first layer of the protective film, for example, a silicon oxide film is formed by sputtering. When the silicon oxide film is used as the protective film, the silicon oxide film has an effect of preventing hillocks of an aluminum film used for the source electrode layer and the drain electrode layer.

Further, as a second layer of the protective film, for example, a silicon nitride film is formed by sputtering. When the silicon nitride film is used as the protective film, mobile ions of sodium or the like can be prevented from entering a semiconductor region so that the electrical characteristics of the TFT are not changed.

In addition, after the protective film is formed, the semiconductor layer may be subjected to annealing (300 to 400° C.).

The insulating layer 4021 is formed as the planarizing insulating film. For the insulating layer 4021, an organic material having heat resistance, such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

The formation method of the insulating layer 4021 is not particularly limited to a certain method, and any of the following methods can be employed depending on the material: sputtering, an SOG method, spin coating, dipping, spray coating, a droplet discharge method (e.g., an ink jet method, screen printing, or offset printing), a doctor knife, a roll coater, a curtain coater, a knife coater, and the like. In the case where the insulating layer 4021 is formed using a material solution, the semiconductor layer may be annealed (at 300 to 400° C.) at the same time as a baking step of the insulating layer 4021. The baking step of the insulating layer 4021 also serves as annealing of the semiconductor layer, so that a semiconductor device can be manufactured efficiently.

The pixel electrode 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 4030 and the counter electrode layer 4031 can be formed using a conductive composition containing a conductive high molecule (also referred to as a conductive polymer). The pixel electrode formed using the conductive composition preferably has a sheet resistance less than or equal to 10000 ohms/square and a transmittance greater than or equal to 70% at a wavelength of 550 nm. The sheet resistance of the pixel electrode is preferably lower. Further, the resistivity of the conductive high molecule contained in the conductive composition is preferably 0.1 ohm·cm or less.

As the conductive high molecule, a so-called π electron conjugated conductive high molecule can be used. For example, polyaniline or a derivative thereof, polypyrrole or a derivative thereof, polythiophene or a derivative thereof, a copolymer of two or more kinds of them, or the like can be used.

Further, a variety of signals and potentials are supplied from an FPC 4018 to the signal line driver circuit 4003 which is formed separately, the scan line driver circuit 4004, or the pixel portion 4002.

A connection terminal electrode 4015 may be formed using the same conductive film as the pixel electrode 4030 of the liquid crystal element 4013, and a terminal electrode 4016 may be formed using the same conductive film as the source electrode layers and the drain electrode layers of the thin film transistors 4010 and 4011.

The connection terminal electrode 4015 is electrically connected to a terminal of the FPC 4018 through an anisotropic conductive film 4019.

Although FIGS. 29A-1 and 29A-2 illustrate an example in which the signal line driver circuit 4003 is formed separately and mounted on the first substrate 4001, this embodiment is not limited to this structure. The scan line driver circuit may be formed separately and mounted, or only part of the signal line driver circuit or part of the scan line driver circuit may be formed separately and mounted.

Figure 30:
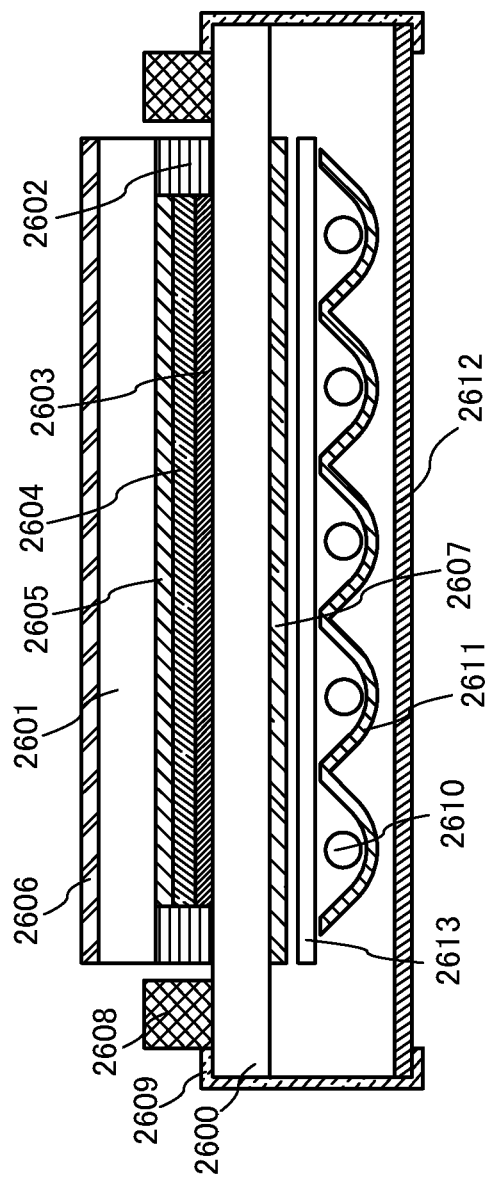
FIG. 30 is a diagram illustrating a display device according to one embodiment of the present invention.

FIG. 30 illustrates an example in which a liquid crystal display module is formed as a semiconductor device by using a TFT substrate 2600.

FIG. 30 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, a coloring layer 2605, and a polarizing plate 2606 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode fluorescent lamp 2610 and a reflector 2611, and a circuit board 2612 is connected to a wiring circuit portion 2608 of the TFT substrate 2600 by a flexible wiring board 2609 and includes an external circuit such as a control circuit or a power supply circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned microcell) mode, an OCB (optically compensated birefringence) mode, an FLC (ferroelectric liquid crystal) mode, an AFLC (anti-ferroelectric liquid crystal) mode, or the like can be used.

Through the above process, a liquid crystal display device can be manufactured at lower manufacturing cost.

This embodiment can be combined with any of the structures described in the other embodiments as appropriate.

Embodiment 6

Next, electronic paper which is one embodiment of a semiconductor device is described. Electronic paper has advantages of the same level of readability as plain paper, lower power consumption than other display devices, and reduction in thickness and weight.

Figure 31:
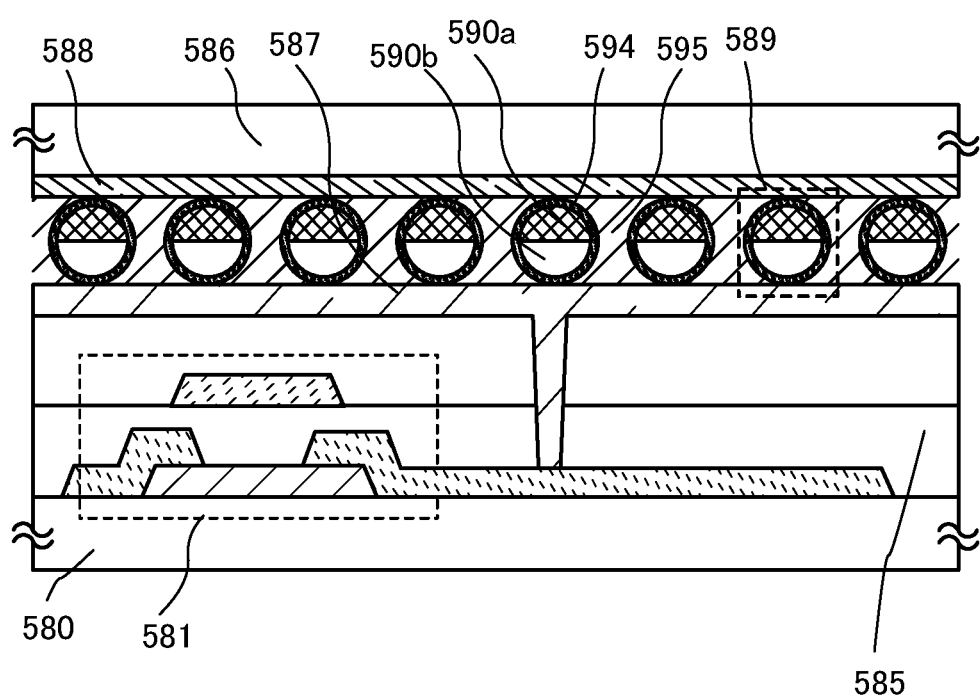
FIG. 31 is a diagram illustrating an electronic device according to one embodiment of the present invention.

FIG. 31 illustrates active matrix electronic paper as one embodiment of a semiconductor device. A thin film transistor 581 used for a pixel portion of the semiconductor device can be formed in a manner similar to that of the thin film transistor in the pixel portion described in the above embodiment and is a thin film transistor including an oxide semiconductor as a semiconductor layer.

The electronic paper in FIG. 31 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

The thin film transistor 581 formed over a substrate 580 is a top-gate thin film transistor in which a source electrode layer and a drain electrode layer are in contact with and electrically connected to a first electrode layer 587 through an opening formed in an insulating layer 585. Between the first electrode layer 587 and a second electrode layer 588 provided for a substrate 586, spherical particles 589 each having a black region 590a, a white region 590b, and a cavity 594 filled with liquid around the black region 590a and the white region 590b are provided. A space around the spherical particles 589 is filled with a filler 595 such as a resin (see FIG. 31).

Alternatively, instead of the twisting ball, an electrophoretic element can be used. A microcapsule having a diameter of approximately 10 to 200 μm, in which transparent liquid, white microparticles which are charged positively or negatively, and black microparticles which are charged to polarity different from that of the white microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element. Since the electrophoretic display element has higher reflectivity than a liquid crystal element, an auxiliary light is not needed, power consumption is low, and a display portion can be recognized in a dim place. In addition, even when power is not supplied to the display portion, an image which has been displayed once can be maintained. Accordingly, a displayed image can be maintained even when electronic paper is distanced from a power supply source (e.g., a source of radio waves).

Through the above process, electronic paper can be manufactured at lower manufacturing cost.

This embodiment can be combined with any of the structures described in the other embodiments as appropriate.

Embodiment 7

A semiconductor device of this embodiment can be used in a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large game machine such as a pinball machine, and the like.

Figure 32A:
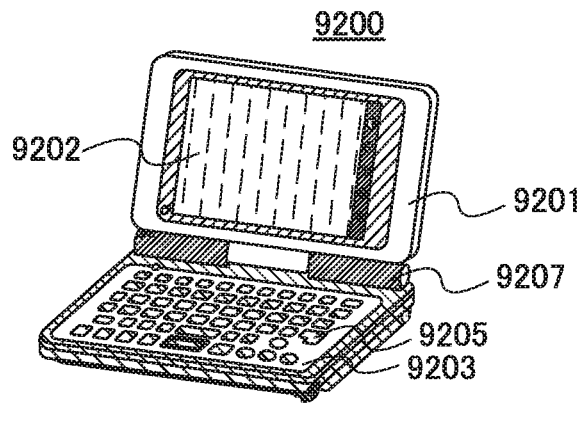
FIGS. 32A to 32D are diagrams illustrating electronic devices according to one embodiment of the present invention.

FIG. 32A illustrates an example of a portable information terminal device 9200. The portable information terminal device 9200 incorporates a computer and can perform a variety of data processings. An example of the portable information terminal device 9200 is a personal digital assistant (PDA).

The portable information terminal device 9200 includes two housings: a housing 9201 and a housing 9203. The housing 9201 and the housing 9203 are joined to each other with a joining portion 9207 so that the portable information terminal device 9200 can be foldable. A display portion 9202 is incorporated in the housing 9201, and the housing 9203 is provided with a keyboard 9205. Needless to say, the structure of the portable information terminal device 9200 is not limited to the above structure, and the structure may include at least the thin film transistor described in Embodiment 1 or 2, and an additional accessory can be provided as appropriate. A driver circuit and a pixel portion are formed over the same substrate, which leads to reduction in manufacturing cost. Thus, a portable information terminal device having a thin film transistor with favorable electrical characteristics can be realized.

Figure 32B:
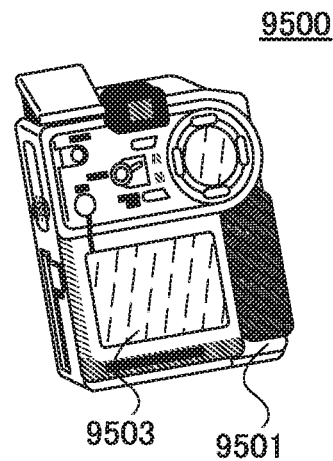

FIG. 32B illustrates an example of a digital video camera 9500. The digital video camera 9500 includes a display portion 9503 incorporated in a housing 9501 and a variety of operation portions. Note that the structure of the digital video camera 9500 is not limited to a certain structure, and the structure may include at least the thin film transistor described in Embodiment 1 or 2, and an additional accessory can be provided as appropriate. A driver circuit and a pixel portion are formed over the same substrate, which leads to reduction in manufacturing cost. Thus, a digital video camera having a thin film transistor with favorable electrical characteristics can be realized.

Figure 32C:
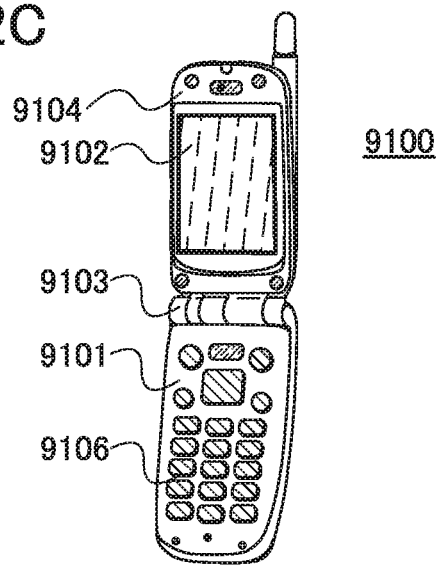

FIG. 32C illustrates an example of a mobile phone 9100. The mobile phone 9100 has two housings: a housing 9104 and a housing 9101. The housing 9104 and the housing 9101 are joined to each other with a joining portion 9103 so that the mobile phone can be foldable. A display portion 9102 is incorporated in the housing 9104, and the housing 9101 is provided with operation keys 9106. Note that the structure of the mobile phone 9100 is not limited to a certain structure, and the structure may include at least the thin film transistor described in Embodiment 1 or 2, and an additional accessory can be provided as appropriate. A driver circuit and a pixel portion are formed over the same substrate, which leads to reduction in manufacturing cost. Thus, a mobile phone having a thin film transistor with favorable electrical characteristics can be realized.

Figure 32D:
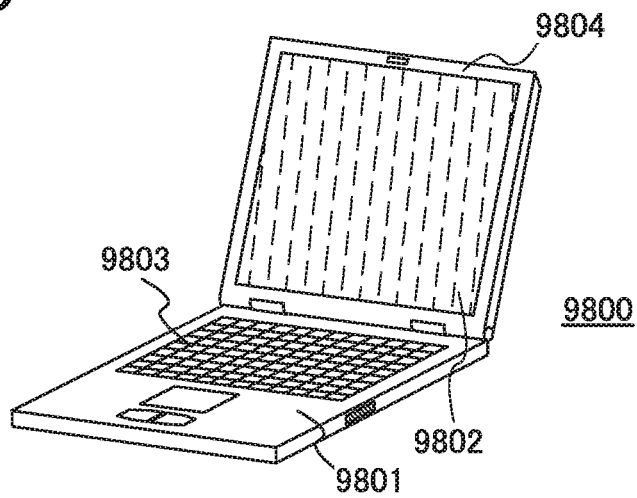

FIG. 32D illustrates an example of a portable computer 9800. The computer 9800 has a housing 9801 and a housing 9804 which are joined to each other so that the portable computer can be opened and closed. A display portion 9802 is incorporated in the housing 9804, and the housing 9801 is provided with a keyboard 9803 and the like. Note that the structure of the computer 9800 is not particularly limited to a certain structure, and the structure may include at least the thin film transistor described in Embodiment 1 or 2, and an additional accessory can be provided as appropriate. A driver circuit and a pixel portion are formed over the same substrate, which leads to reduction in manufacturing cost. Thus, a computer having a thin film transistor with favorable electrical characteristics can be realized.

Figure 33A:
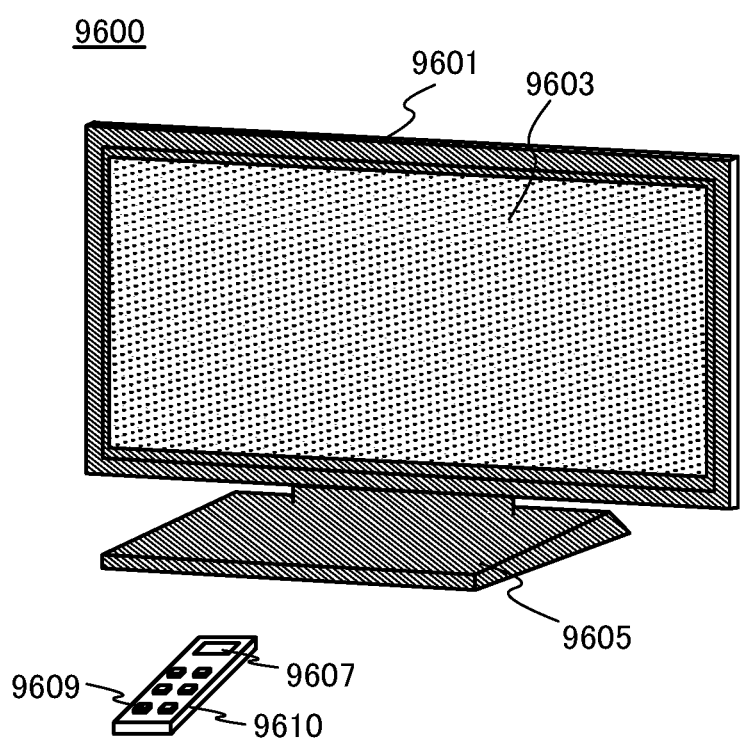
FIGS. 33A and 33B are diagrams illustrating electronic devices according to one embodiment of the present invention.

FIG. 33A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with operation keys 9609 of the remote controller 9610, so that images displayed on the display portion 9603 can be controlled. Further, the remote controller 9610 may be provided with a display portion 9607 for displaying data output from the remote controller 9610.

Note that the television set 9600 includes a receiver, a modem, and the like. With the receiver, general television broadcasting can be received. Further, when the television set is connected to wire or wireless communication network through the modem, one-way (from a transmitter to a receiver) or two-way (between a transmitter and a receiver or between receivers) data communication can be performed.

Figure 33B:
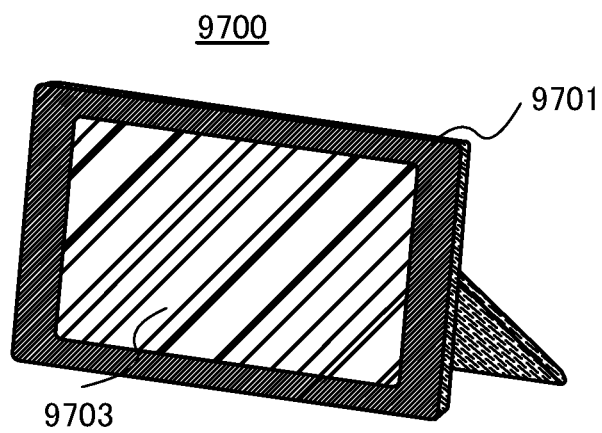

FIG. 33B illustrates an example of a digital photo frame 9700. For example, in the digital photo frame 9700, a display portion 9703 is incorporated in a housing 9701. The display portion 9703 can display a variety of images. For example, the display portion 9703 can display data of an image photographed with a digital camera or the like and can function in a manner similar to that of a normal photo frame.

Note that the digital photo frame 9700 includes an operation portion, an external connection terminal (e.g., a USB terminal or a terminal which can be connected to a variety of cables such as USB cables), a recording medium insertion portion, and the like. Although these components may be provided on a surface on which the display portion is provided, it is preferable to provide them on a side surface or a back surface because the design of the digital photo frame is improved. For example, a memory which stores data of an image photographed with a digital camera is inserted in the recording medium insertion portion of the digital photo frame, so that the image data can be transferred and displayed on the display portion 9703.

Alternatively, the digital photo frame 9700 may transmit and receive data wirelessly. Through wireless communication, desired image data can be transferred and displayed.

Figure 34A:
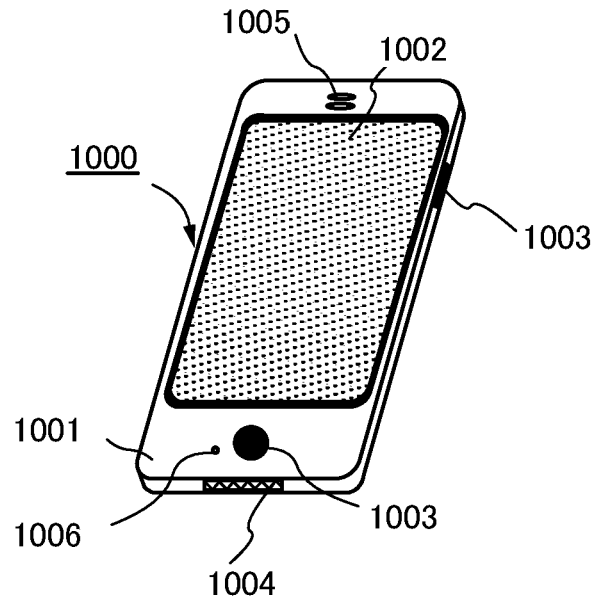
FIGS. 34A and 34B are diagrams illustrating electronic devices according to one embodiment of the present invention.

FIG. 34A illustrates an example of a mobile phone 1000 which is different from the mobile phone illustrated in FIG. 32C. The mobile phone 1000 includes a display portion 1002 incorporated in a housing 1001, an operation button 1003, an external connection port 1004, a speaker 1005, a microphone 1006, and the like.

In the mobile phone 1000 illustrated in FIG. 34A, data can be input when a person touches the display portion 1002 with his/her finger or the like. In addition, operations such as making calls and composing mails can be performed when a person touches the display portion 1002 with his/her finger or the like.

The display portion 1002 has mainly three screen modes. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In this case, it is preferable to display a keyboard or number buttons on substantially all the area of the screen of the display portion 1002.

By providing a detection device including a sensor for detecting inclination, such as a gyroscope or an acceleration sensor, inside the mobile phone 1000, display on the screen of the display portion 1002 can be automatically changed by determining the orientation of the mobile phone 1000 (whether the mobile phone 1000 is placed horizontally or vertically).

Further, the screen modes are changed by touching the display portion 1002 or operating the operation button 1003 of the housing 1001. Alternatively, the screen modes may be changed depending on the kind of an image displayed on the display portion 1002. For example, when a signal of an image displayed on the display portion is a signal of moving image data, the screen mode is changed into the display mode. When the signal is a signal of text data, the screen mode is changed into the input mode.

Further, in the input mode, when input by touching the display portion 1002 is not performed for a certain period while a signal detected by the optical sensor in the display portion 1002 is detected, the screen mode may be controlled so as to be changed from the input mode into the display mode.

The display portion 1002 can function also as an image sensor. For example, the image of a palm print, a fingerprint, or the like is taken when the display portion 1002 is touched with the palm or the finger, so that authentication can be performed. Further, by using a backlight which emits near-infrared light or a sensing light source which emits near-infrared light in the display portion, the image of a finger vein, a palm vein, or the like can be taken.

Figure 34B:
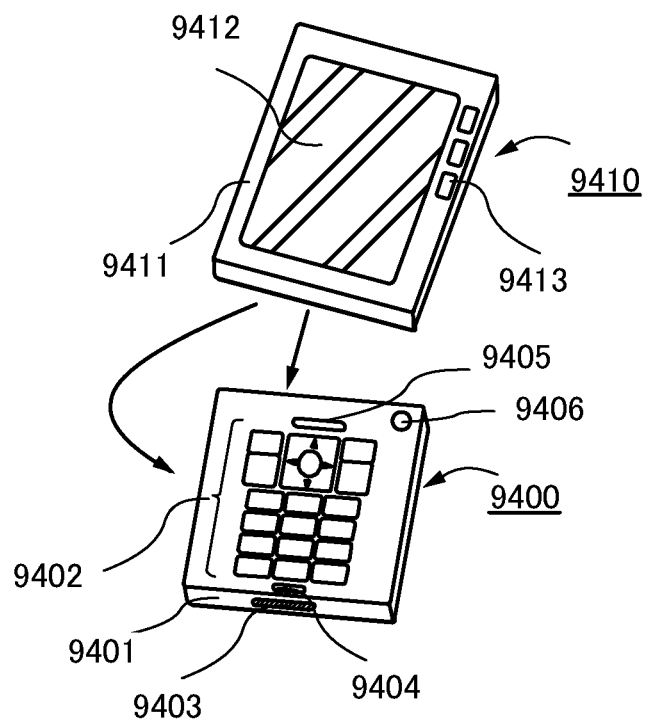

FIG. 34B illustrates an example of a mobile phone. The mobile phone in FIG. 34B includes a display device 9410 in a housing 9411, which has a display portion 9412 and operation buttons 9413, and a communication device 9400 in a housing 9401, which has operation buttons 9402, an external input terminal 9403, a microphone 9404, a speaker 9405, and a light-emitting portion 9406 which emits light when a phone call is received. The display device 9410 which has a display function can be detached from or attached to the communication device 9400 which has a phone function, in two directions represented by arrows. Thus, the display device 9410 and the communication device 9400 can be attached to each other along their short sides or long sides. Alternatively, in the case where only the display function is needed, the display device 9410 can be detached from the communication device 9400 and used alone. Images or input data can be transmitted and received by wireless or wire communication between the communication device 9400 and the display device 9410 each having a rechargeable battery.

Embodiment 8

In this embodiment, structures and operation of a pixel which can be used in a liquid crystal display device are described. Note that as the operation mode of a liquid crystal element in this embodiment, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned microcell) mode, an OCB (optically compensated birefringence) mode, an FLC (ferroelectric liquid crystal) mode, an AFLC (anti-ferroelectric liquid crystal) mode, or the like can be used.

Figure 37A:
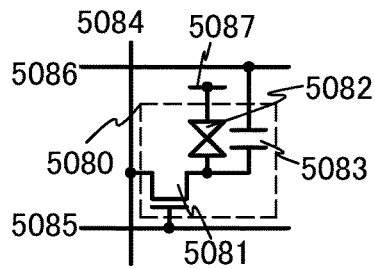
FIGS. 37A to 37G are diagrams illustrating circuits according to one embodiment of the present invention.

FIG. 37A illustrates an example of a pixel structure which can be used in the liquid crystal display device. A pixel 5080 includes a transistor 5081, a liquid crystal element 5082, and a capacitor 5083. A gate of the transistor 5081 is electrically connected to a wiring 5085. A first terminal of the transistor 5081 is electrically connected to a wiring 5084. A second terminal of the transistor 5081 is electrically connected to a first terminal of the liquid crystal element 5082. A second terminal of the liquid crystal element 5082 is electrically connected to a wiring 5087. A first terminal of the capacitor 5083 is electrically connected to the first terminal of the liquid crystal element 5082. A second terminal of the capacitor 5083 is electrically connected to a wiring 5086. Note that a first terminal of a transistor is one of a source and a drain, and a second terminal of the transistor is the other of the source and the drain. That is, when the first terminal of the transistor is the source, the second terminal of the transistor is the drain. In a similar manner, when the first terminal of the transistor is the drain, the second terminal of the transistor is the source.

The wiring 5084 can serve as a signal line. The signal line is a wiring for transmitting signal voltage, which is input from the outside of the pixel, to the pixel 5080. The wiring 5085 can serve as a scan line. The scan line is a wiring for controlling on/off of the transistor 5081. The wiring 5086 can serve as a capacitor line. The capacitor line is a wiring for applying predetermined voltage to the second terminal of the capacitor 5083. The transistor 5081 can serve as a switch. The capacitor 5083 can serve as a storage capacitor. The storage capacitor is a capacitor with which the signal voltage is continuously applied to the liquid crystal element 5082 even when the switch is off. The wiring 5087 can serve as a counter electrode. The counter electrode is a wiring for applying predetermined voltage to the second terminal of the liquid crystal element 5082. Note that the function of each wiring is not limited to this, and each wiring can have a variety of functions. For example, by changing voltage applied to the capacitor line, voltage applied to the liquid crystal element can be adjusted. Note that it is acceptable as long as the transistor 5081 serves as a switch, and the transistor 5081 may be either a p-channel transistor or an n-channel transistor.

Figure 37B:
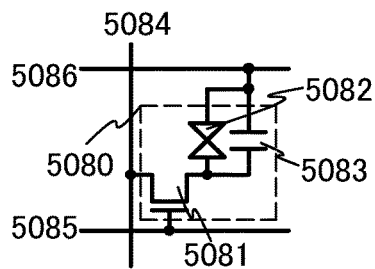

FIG. 37B illustrates an example of a pixel structure which can be used in the liquid crystal display device. The example of the pixel structure illustrated in FIG. 37B is the same as that in FIG. 37A except that the wiring 5087 is eliminated and the second terminal of the liquid crystal element 5082 and the second terminal of the capacitor 5083 are electrically connected to each other. The example of the pixel structure illustrated in FIG. 37B can be particularly used in the case of using a horizontal electric field mode (including an IPS mode and an FFS mode) liquid crystal element. This is because in the horizontal electric field mode liquid crystal element, the second terminal of the liquid crystal element 5082 and the second terminal of the capacitor 5083 can be formed over the same substrate, so that it is easy to electrically connect the second terminal of the liquid crystal element 5082 and the second terminal of the capacitor 5083 to each other. With the pixel structure as illustrated in FIG. 37B, the wiring 5087 can be eliminated, so that a manufacturing process can be simplified and manufacturing cost can be reduced.

Figure 37C:
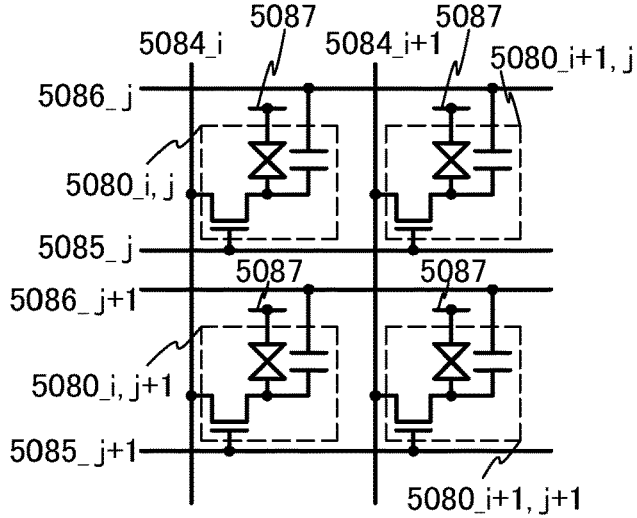

A plurality of pixel structures illustrated in FIG. 37A or FIG. 37B can be arranged in matrix. Thus, a display portion of a liquid crystal display device is formed, and a variety of images can be displayed. FIG. 37C illustrates a circuit structure in the case where a plurality of pixel structures illustrated in FIG. 37A are arranged in matrix. FIG. 37C is a circuit diagram illustrating four pixels among a plurality of pixels included in the display portion. A pixel arranged in an i-th column and a j-th row (each of i and j is a natural number) is represented as a pixel 5080_i, j, and a wiring 5084_i, a wiring 5085_j, and a wiring 5086_j are electrically connected to the pixel 5080_i, j. In a similar manner, a wiring 5084_i+1, the wiring 5085_j, and the wiring 5086_j are electrically connected to a pixel 5080_i+1, j. In a similar manner, the wiring 5084_i, a wiring 5085_j+1, and a wiring 5086_j+1 are electrically connected to a pixel 5080_i, j+1. In a similar manner, the wiring 5084_i+1, the wiring 5085_j+1, and the wiring 5086_j+1 are electrically connected to a pixel 5080_i+1, j+1. Note that each wiring can be used in common with a plurality of pixels in the same row or the same column. In the pixel structure illustrated in FIG. 37C, the wiring 5087 is a counter electrode, which is used by all the pixels in common; therefore, the wiring 5087 is not indicated by the natural number i or j. Note that since the pixel structure in FIG. 37B can also be used, the wiring 5087 is not required even in a structure where the wiring 5087 is provided and can be eliminated when another wiring serves as the wiring 5087, for example.

Figure 37D:
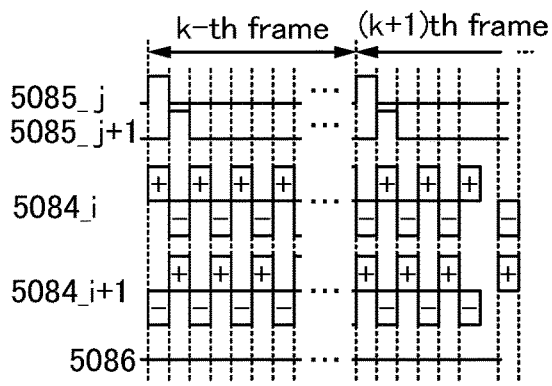

The pixel structure in FIG. 37C can be driven by a variety of methods. In particular, when the pixels are driven by a method called AC drive, deterioration (burn-in) of the liquid crystal element can be suppressed. FIG. 37D is a timing chart of voltage applied to each wiring in the pixel structure in FIG. 37C in the case where dot inversion driving, which is a kind of AC drive, is performed. By the dot inversion driving, flickers seen when the AC drive is performed can be suppressed.

In the pixel structure in FIG. 37C, a switch in a pixel electrically connected to the wiring 5085_j is selected (in an on state) in a j-th gate selection period in one frame period and is not selected (in an off state) in the other periods. Then, a (j+1)th gate selection period is provided after the j-th gate selection period. By performing sequential scanning in this manner, all the pixels are sequentially selected in one frame period. In the timing chart of FIG. 37D, the switch in the pixel is selected when the level of voltage is high (high level), and the switch is not selected when the level of the voltage is low (low level). Note that this is the case where the transistor in each pixel is an n-channel transistor. In the case of using a p-channel transistor, a relationship between voltage and a selection state is opposite to that in the case of using an n-channel transistor.

In the timing chart illustrated in FIG. 37D, in the j-th gate selection period in a k-th frame (k is a natural number), positive signal voltage is applied to the wiring 5084_i used as a signal line, and negative signal voltage is applied to the wiring 5084_i+1. Then, in the (j+1)th gate selection period in the k-th frame, negative signal voltage is applied to the wiring 5084_i, and positive signal voltage is applied to the wiring 5084_i+1. After that, signals whose polarities are inverted every gate selection period are alternately supplied to the signal line. Accordingly, in the k-th frame, the positive signal voltage is applied to the pixels 5080_i, j and 5080_i+1, j+1, and the negative signal voltage is applied to the pixels 5080_i+1, j and 5080_i,j+1. Then, in a (k+1)th frame, signal voltage whose polarity is opposite to that of the signal voltage written in the k-th frame is written to each pixel. Accordingly, in the (k+1)th frame, the positive signal voltage is applied to the pixels 5080_i+1, j and 5080_i, j+1, and the negative signal voltage is applied to the pixels 5080_i, j and 5080_i+1, j+1. In this manner, the dot inversion driving is a driving method by which signal voltage whose polarity is different between adjacent pixels is applied in the same frame and the polarity of the voltage signal for the pixel is inverted every one frame. By the dot inversion driving, flickers seen when the entire or part of an image to be displayed is uniform can be suppressed while deterioration of the liquid crystal element is suppressed. Note that voltage applied to all the wirings 5086 including the wirings 5086_j and 5086_j+1 can be fixed voltage. Note that although only the polarity of the signal voltage for the wirings 5084 is illustrated in the timing chart, the signal voltage can actually have a variety of levels in the polarity illustrated. Note that here, the case where the polarity is inverted per dot (per pixel) is described; however, this embodiment is not limited to this, and the polarity can be inverted per a plurality of pixels. For example, the polarity of signal voltage to be written is inverted per two gate selection periods, so that power consumed in writing signal voltage can be reduced. Alternatively, the polarity can be inverted per column (source line inversion) or per row (gate line inversion).

Figure 37E:
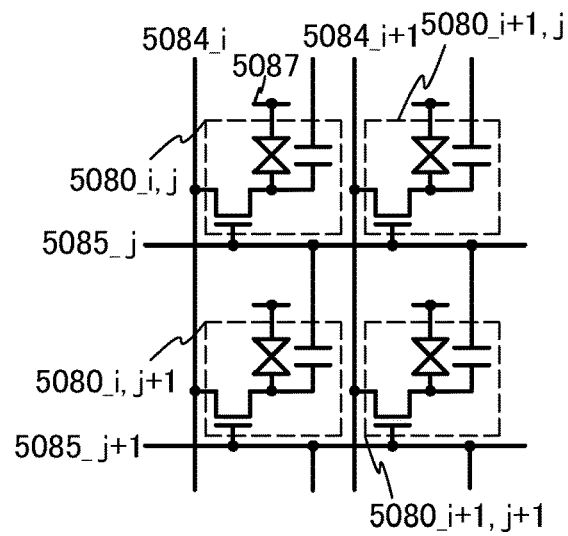

Note that fixed voltage may be applied to the second terminal of the capacitor 5083 in the pixel 5080 in one frame period. Here, since the level of voltage applied to the wiring 5085 used as a scan line is low level in most of one frame period, which means that substantially constant voltage is applied to the wiring 5085; therefore, the second terminal of the capacitor 5083 in the pixel 5080 may be connected to the wiring 5085. FIG. 37E illustrates an example of a pixel structure which can be used in the liquid crystal display device. Compared to the pixel structure in FIG. 37C, a feature of the pixel structure in FIG. 37E lies in that the wiring 5086 is eliminated and the second terminal of the capacitor 5083 in the pixel 5080 and the wiring 5085 in the previous row are electrically connected to each other. Specifically, in the range illustrated in FIG. 37E, the second terminals of the capacitors 5083 in the pixels 5080_i, j+1 and 5080_i+1, j+1 are electrically connected to the wiring 5085_j. By electrically connecting the second terminal of the capacitor 5083 in the pixel 5080 and the wiring 5085 in the previous row to each other in this manner, the wiring 5086 can be eliminated, so that the aperture ratio of the pixel can be increased. Note that the second terminal of the capacitor 5083 may be connected to the wiring 5085 in another row instead of in the previous row. Note that the pixel structure in FIG. 37E can be driven by a driving method which is similar to that in the pixel structure in FIG. 37C.

Figure 37F:
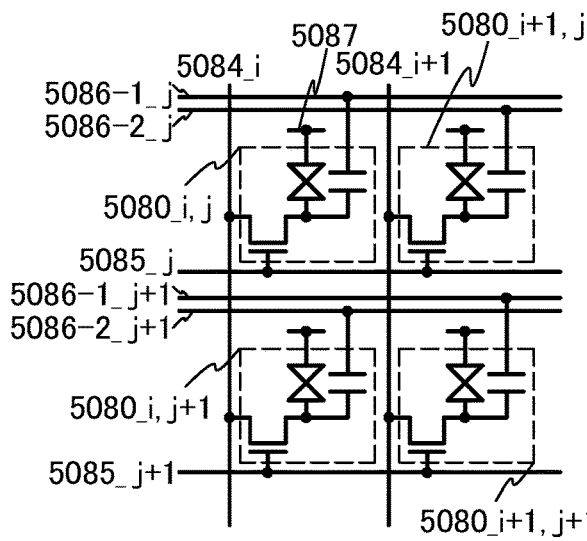
Figure 37G:
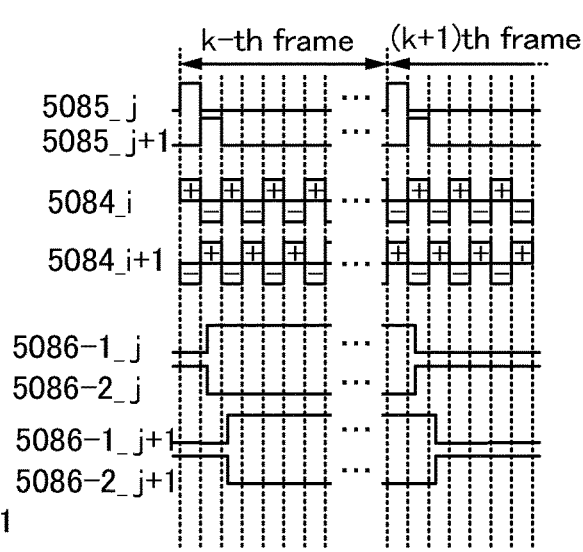

Note that voltage applied to the wiring 5084 used as a signal line can be lowered by using the capacitor 5083 and the wiring electrically connected to the second terminal of the capacitor 5083. A pixel structure and a driving method in this case are described with reference to FIGS. 37F and 37G Compared to the pixel structure in FIG. 37A, a feature of the pixel structure in FIG. 37F lies in that two wirings 5086 are provided per pixel column, and in adjacent pixels, one wiring is electrically connected to every other second terminal of the capacitors 5083 and the other wiring is electrically connected to the remaining every other second terminal of the capacitors 5083. Note that two wirings 5086 are referred to as a wiring 5086-1 and a wiring 5086-2. Specifically, in the range illustrated in FIG. 37F, the second terminal of the capacitor 5083 in the pixel 5080_$i, j$ is electrically connected to a wiring 5086-1_$j$; the second terminal of the capacitor 5083 in the pixel 5080_$i$+1, j is electrically connected to a wiring 5086-2_$j$; the second terminal of the capacitor 5083 in the pixel 5080_$i, j$+1 is electrically connected to a wiring 5086-2_$j$+1; and the second terminal of the capacitor 5083 in the pixel 5080_$i$+1, $j$+1 is electrically connected to a wiring 5086-1_$j$+1.

For example, when positive signal voltage is written to the pixel 5080_$i, j$ in the k-th frame as illustrated in FIG. 37G, the wiring 5086-1_$j$ becomes a low level, and is changed to a high level after the j-th gate selection period. Then, the wiring 5086-1_$j$ is kept at a high level in one frame period, and after negative signal voltage is written in the j-th gate selection period in the (k+1)th frame, the wiring 5086-1_$j$ is changed to a high level. In this manner, voltage of the wiring which is electrically connected to the second terminal of the capacitor 5083 is changed in a positive direction after positive signal voltage is written to the pixel, so that voltage applied to the liquid crystal element can be changed in the positive direction by a predetermined level. That is, signal voltage written to the pixel can be lowered by the predetermined level, so that power consumed in signal writing can be reduced. Note that when negative signal voltage is written in the j-th gate selection period, voltage of the wiring which is electrically connected to the second terminal of the capacitor 5083 is changed in a negative direction after negative signal voltage is written to the pixel. Thus, voltage applied to the liquid crystal element can be changed in the negative direction by a predetermined level, and the signal voltage written to the pixel can be reduced as in the case of the positive polarity. In other words, as for the wiring which is electrically connected to the second terminal of the capacitor 5083, different wirings are preferably used for a pixel to which positive signal voltage is applied and a pixel to which negative signal voltage is applied in the same row of the same frame. FIG. 37F illustrates an example in which the wiring 5086-1 is electrically connected to the pixel to which positive signal voltage is applied in the k-th frame and the wiring 5086-2 is electrically connected to the pixel to which negative signal voltage is applied in the k-th frame. Note that this is just an example, and for example, in the case of using a driving method by which pixels to which positive signal voltage is written and pixels to which negative signal voltage is written appear every two pixels, it is preferable to perform electrical connections with the wirings 5086-1 and 5086-2 alternately every two pixels. Further, in the case where signal voltage of the same polarity is written to all the pixels in one row (gate line inversion), one wiring 5086 may be provided per row. In other words, in the pixel structure in FIG. 37C, the driving method by which signal voltage written to a pixel is lowered as described with reference to FIGS. 37F and 37G can be used.

Figure 38A:
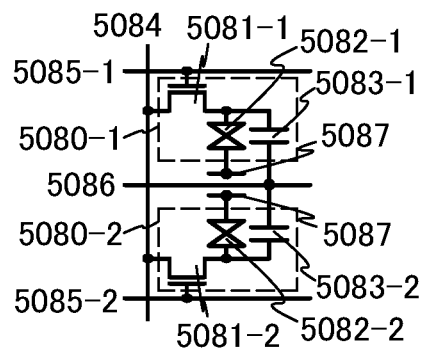
FIGS. 38A to 38D are diagrams illustrating circuits according to one embodiment of the present invention.
Figure 38B:
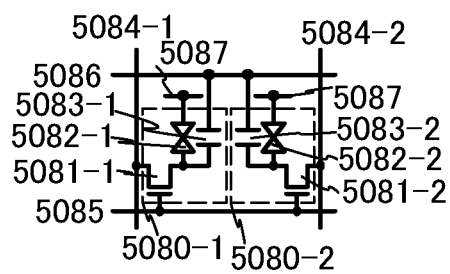

Next, a pixel structure and a driving method which are preferably used particularly in the case where the mode of a liquid crystal element is a vertical alignment (VA) mode typified by an MVA mode and a PVA mode. The VA mode has advantages such as no rubbing step in manufacture, little light leakage at the time of black display, and low driving voltage, but has a problem in that image quality is decreased (the viewing angle is narrower) when a screen is seen from an oblique angle. In order to widen the viewing angle in the VA mode, a pixel structure where one pixel includes a plurality of subpixels as illustrated in FIGS. 38A and 38B is effective. Pixel structures illustrated in FIGS. 38A and 38B are examples of the case where the pixel 5080 includes two subpixels (a subpixel 5080-1 and a subpixel 5080-2). Note that the number of subpixels in one pixel is not limited to two and can be other numbers. The viewing angle can be further widened as the number of subpixels becomes larger. A plurality of subpixels can have the same circuit structure. Here, all the subpixels have the circuit structure illustrated in FIG. 37A. Note that the first subpixel 5080-1 includes a transistor 5081-1, a liquid crystal element 5082-1, and a capacitor 5083-1. The connection relation of each element is the same as that in the circuit structure in FIG. 37A. In a similar manner, the second subpixel 5080-2 includes a transistor 5081-2, a liquid crystal element 5082-2, and a capacitor 5083-2. The connection relation of each element is the same as that in the circuit structure in FIG. 37A.

The pixel structure in FIG. 38A includes, for two subpixels included in one pixel, two wirings 5085 (a wiring 5085-1 and a wiring 5085-2) used as scan lines, one wiring 5084 used as a signal line, and one wiring 5086 used as a capacitor line. When the signal line and the capacitor line are shared between two subpixels in this manner, the aperture ratio can be improved. Further, since a signal line driver circuit can be simplified, manufacturing cost can be reduced. Furthermore, since the number of connections between a liquid crystal panel and a driver circuit IC can be reduced, yield can be improved. The pixel structure in FIG. 38B includes, for two subpixels included in one pixel, one wiring 5085 used as a scan line, two wirings 5084 (a wiring 5084-1 and a wiring 5084-2) used as signal lines, and one wiring 5086 used as a capacitor line. When the scan line and the capacitor line are shared between two subpixels in this manner, the aperture ratio can be improved. Further, since the total number of scan lines can be reduced, the length of each gate line selection period can be sufficiently increased even in a high-definition liquid crystal panel, and appropriate signal voltage can be written to each pixel.

Figure 38C:
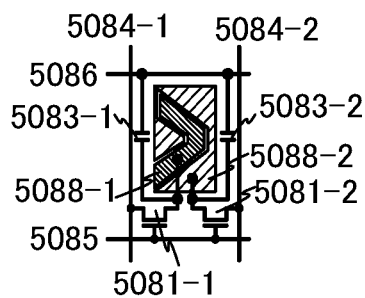
Figure 38D:
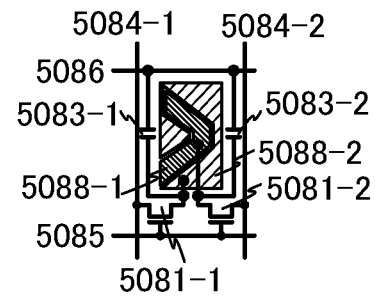

FIGS. 38C and 38D illustrate an example in which the liquid crystal element in the pixel structure in FIG. 38B is replaced with the shape of a pixel electrode and the electrical connection of each element is schematically illustrated. In FIGS. 38C and 38D, reference numeral 5088-1 denotes a first pixel electrode, and reference numeral 5088-2 denotes a second pixel electrode. In FIG. 38C, the first pixel electrode 5088-1 corresponds to a first terminal of the liquid crystal element 5082-1 in FIG. 38B, and the second pixel electrode 5088-2 corresponds to a first terminal of the liquid crystal element 5082-2 in FIG. 38B. That is, the first pixel electrode 5088-1 is electrically connected to one of a source and a drain of the transistor 5081-1, and the second pixel electrode 5088-2 is electrically connected to one of a source and a drain of the transistor 5081-2. Meanwhile, in FIG. 38D, the connection relation between the pixel electrode and the transistor is opposite to that in FIG. 38C. That is, the first pixel electrode 5088-1 is electrically connected to one of the source and the drain of the transistor 5081-2, and the second pixel electrode 5088-2 is electrically connected to one of the source and the drain of the transistor 5081-1.

Figure 39A:
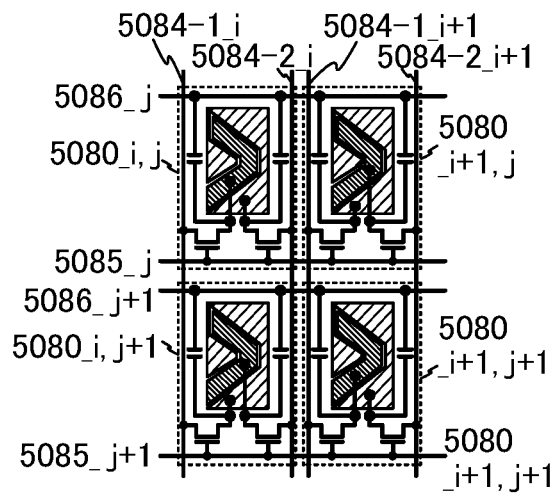
FIGS. 39A to 39D are diagrams illustrating circuits according to one embodiment of the present invention.
Figure 39B:
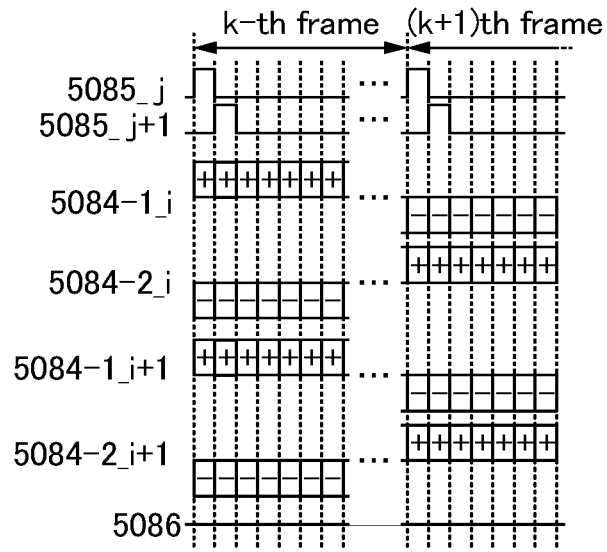

By alternately arranging a plurality of pixel structures as illustrated in FIG. 38C and FIG. 38D in matrix, special advantageous effects can be obtained. FIGS. 39A and 39B illustrate examples of the pixel structure and a driving method thereof. In the pixel structure in FIG. 39A, a portion corresponding to the pixels 5080_*i, j* and 5080_*i*+1, j+1 has the structure illustrated in FIG. 38C, and a portion corresponding to the pixels 5080_*i*+1, j and 5080_*i, j*+1 has the structure illustrated in FIG. 38D. In this structure, by performing driving as the timing chart illustrated in FIG. 39B, in the j-th gate selection period in the k-th frame, positive signal voltage is written to the first pixel electrode in the pixel 5080_*i, j* and the second pixel electrode in the pixel 5080_*i*+1, j, and negative signal voltage is written to the second pixel electrode in the pixel 5080_*i, j* and the first pixel electrode in the pixel 5080_*i*+1, j. In the (j+1)th gate selection period in the k-th frame, positive signal voltage is written to the second pixel electrode in the pixel 5080_*i, j*+1 and the first pixel electrode in the pixel 5080_*i*+1, j+1, and negative signal voltage is written to the first pixel electrode in the pixel 5080_*i, j*+1 and the second pixel electrode in the pixel 5080_*i*+1, j+1. In the (k+1)th frame, the polarity of signal voltage is inverted in each pixel. Thus, the polarity of voltage applied to the signal line can be the same in one frame period while driving corresponding to dot inversion driving is realized in the pixel structure including subpixels. Therefore, power consumed in writing signal voltage to the pixels can be drastically reduced. Note that voltage applied to all the wirings 5086 including the wirings 5086_*j* and 5086_*j*+1 can be fixed voltage.

Figure 39C:
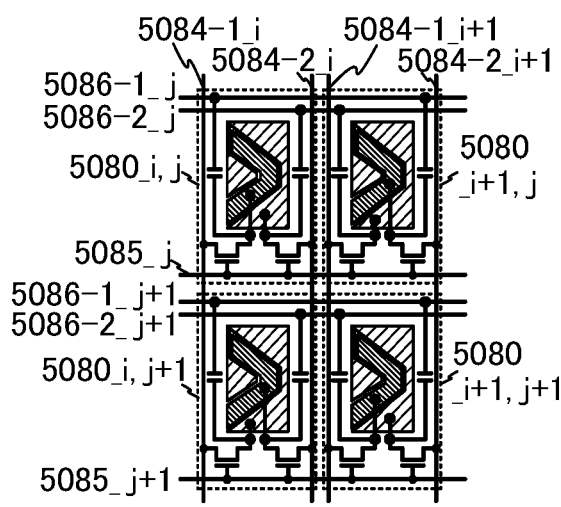
Figure 39D:
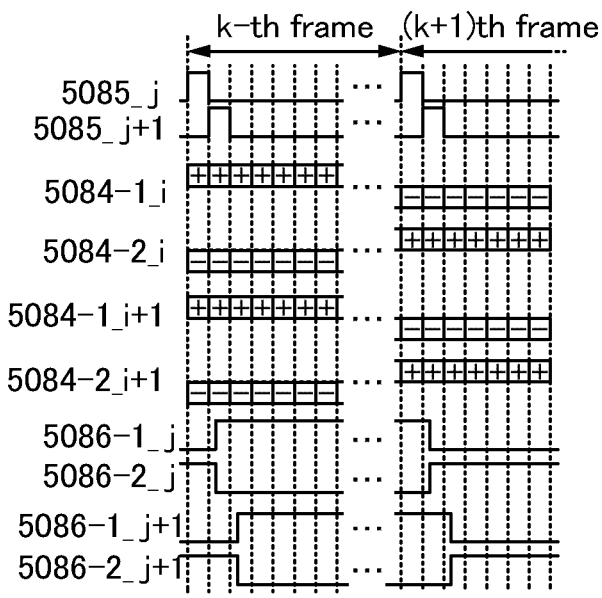

Further, by a pixel structure and a driving method illustrated in FIGS. 39C and 39D, the level of signal voltage written to a pixel can be lowered. In the structure, capacitors lines which are electrically connected to a plurality of subpixels included in each pixel are different between the subpixels. That is, by using the pixel structure and the driving method illustrated in FIGS. 39C and 39D, subpixels to which voltages having the same polarities are written in the same frame share a capacitor line in the same row, and subpixels to which voltages having different polarities are written in the same frame use different capacitor lines in the same row. Then, when writing in each row is terminated, voltage of the capacitor lines is changed to the positive direction in the subpixels to which positive signal voltage is written, and changed to the negative direction in the subpixels to which negative signal voltage is written. Thus, the level of the signal voltage written to the pixel can be lowered. Specifically, two wirings 5086 (the wirings 5086-1 and 5086-2) used as capacitor lines are provided in each row. The first pixel electrode in the pixel 5080_*i, j* and the wiring 5086-1_*j* are electrically connected to each other through the capacitor. The second pixel electrode in the pixel 5080_*i, j* and the wiring 5086-2_*j* are electrically connected to each other through the capacitor. The first pixel electrode in the pixel 5080_*i*+1, j and the wiring 5086-2_*j* are electrically connected to each other through the capacitor. The second pixel electrode in the pixel 5080_*i*+1, j and the wiring 5086-1_*j* are electrically connected to each other through the capacitor. The first pixel electrode in the pixel 5080_*i,j*+1 and the wiring 5086-2_*j*+1 are electrically connected to each other through the capacitor. The second pixel electrode in the pixel 5080_*i, j*+1 and the wiring 5086-1_*j*+1 are electrically connected to each other through the capacitor. The first pixel electrode in the pixel 5080_*i*+1, j+1 and the wiring 5086-1_*j*+1 are electrically connected to each other through the capacitor. The second pixel electrode in the pixel 5080_*i*+1, j+1 and the wiring 5086-2_*j*+1 are electrically connected to each other through the capacitor. Note that this is just an example, and for example, in the case of using a driving method by which pixels to which positive signal voltage is written and pixels to which negative signal voltage is written appear every two pixels, it is preferable to perform electrical connections with the wirings 5086-1 and 5086-2 alternately every two pixels. Further, in the case where signal voltage of the same polarity is written in all the pixels in one row (gate line inversion), one wiring 5086 may be provided per row. In other words, in the pixel structure in FIG. 39A, the driving method by which signal voltage written to a pixel is lowered as described with reference to FIGS. 39C and 39D can be used.

Embodiment 9

Next, another structure example and a driving method of a display device are described. In this embodiment, the case of using a display device including a display element whose luminance response with respect to signal writing is slow (response time is long) is described. In this embodiment, a liquid crystal element is described as an example of the display element with long response time. In this embodiment, a liquid crystal element is illustrated as an example of the display element with long response time. However, a display element in this embodiment is not limited to this, and a variety of display elements whose luminance response with respect to signal writing is slow can be used.

In a general liquid crystal display device, luminance response with respect to signal writing is slow, and it sometimes takes more than one frame period to complete the response even when signal voltage is continuously applied to a liquid crystal element. Moving images cannot be displayed precisely by such a display element. Further, in the case of active matrix driving, time for signal writing to one liquid crystal element is only a period (one scan line selection period) obtained by dividing a signal writing cycle (one frame period or one subframe period) by the number of scan lines, and the liquid crystal element cannot respond in such a short time in many cases. Therefore, most of the response of the liquid crystal element is performed in a period during which signal writing is not performed. Here, the dielectric constant of the liquid crystal element is changed in accordance with the transmittance of the liquid crystal element, and the response of the liquid crystal element in a period during which signal writing is not performed means that the dielectric constant of the liquid crystal element is changed in a state where electric charge is not exchanged with the outside of the liquid crystal element (in a constant charge state). In other words, in a formula where charge=(capacitance)·(voltage), the capacitance is changed in a state where the charge is constant. Accordingly, voltage applied to the liquid crystal element is changed from voltage in signal writing, in accordance with the response of the liquid crystal element. Therefore, in the case where the liquid crystal element whose luminance response with respect to signal writing is slow is driven by active matrix driving, voltage applied to the liquid crystal element cannot theoretically reach the voltage in signal writing.

In the display device in this embodiment, a signal level in signal writing is corrected in advance (a correction signal is used) so that a display element can reach desired luminance within a signal writing cycle. Thus, the above problem can be solved. Further, since the response time of the liquid crystal element becomes shorter as the signal level becomes higher, the response time of the liquid crystal element can also be shorter by writing a correction signal. A driving method by which such a correction signal is added is referred to as overdrive. By overdrive in this embodiment, even when a signal writing cycle is shorter than a cycle for an image signal input to the display device (an input image signal cycle $T_{in}$), the signal level is corrected in accordance with the signal writing cycle, so that the display element can reach desired luminance within the signal writing cycle. The case where the signal writing cycle is shorter than the input image signal cycle $T_{in}$ is, for example, the case where one original image is divided into a plurality of subimages and the plurality of subimages are sequentially displayed in one frame period.

Figure 40A:
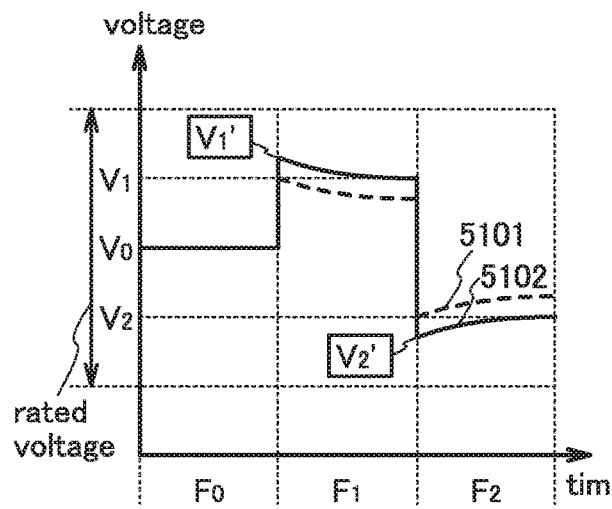
FIGS. 40A to 40F are diagrams showing potentials of a display element according to one embodiment of the present invention.
Figure 40B:
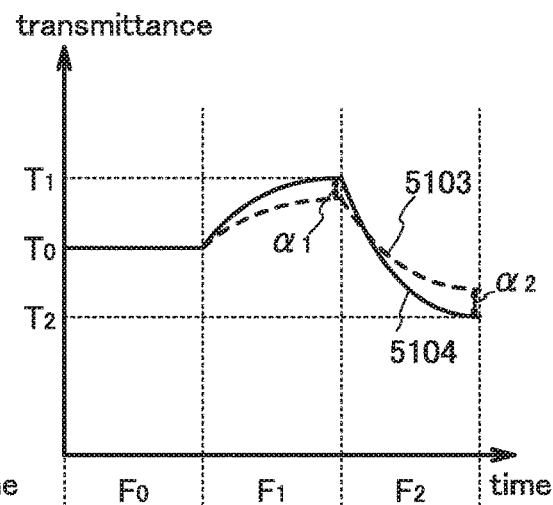

Next, an example of correcting a signal level in signal writing in a display device driven by active matrix driving is described with reference to FIGS. 40A and 40B. FIG. 40A is a graph schematically illustrating a time change in luminance of signal level in signal writing in one display element, with the time as the horizontal axis and the signal level in signal writing as the vertical axis. FIG. 40B is a graph schematically illustrating a time change in display level, with the time as the horizontal axis and the display level as the vertical axis. Note that when the display element is a liquid crystal element, the signal level in signal writing can be voltage, and the display level can be the transmittance of the liquid crystal element. In the following description, the vertical axis in FIG. 40A is regarded as the voltage, and the vertical axis in FIG. 40B is regarded as the transmittance. Note that in the overdrive in this embodiment, the signal level may be other than the voltage (may be a duty ratio or current, for example). Note that in the overdrive in this embodiment, the display level may be other than the transmittance (may be luminance or current, for example). Liquid crystal elements are classified into two modes: a normally black mode in which black is displayed when voltage is 0 (e.g., a VA mode and an IPS mode), and a normally white mode in which white is displayed when voltage is 0 (e.g., a TN mode and an OCB mode). The graph illustrated in FIG. 40B corresponds to both of the modes. The transmittance increases in the upper part of the graph in the normally black mode, and the transmittance increases in the lower part of the graph in the normally white mode. That is, a liquid crystal mode in this embodiment may be either a normally black mode or a normally white mode. Note that timing of signal writing is represented on the time axis by dotted lines, and a period after signal writing is performed until the next signal writing is performed is referred to as a retention period $F_i$. In this embodiment, i is an integer and an index for representing each retention period. In FIGS. 40A and 40B, i is 0 to 2; however, i can be an integer other than 0 to 2 (only the case where i is 0 to 2 is illustrated). Note that in the retention period $F_i$, transmittance for realizing luminance corresponding to an image signal is denoted by $T_i$, and voltage for providing the transmittance $T_i$ in a constant state is denoted by $V_i$. In FIG. 40A, a dashed line 5101 represents a time change in voltage applied to the liquid crystal element in the case where overdrive is not performed, and a solid line 5102 represents a time change in voltage applied to the liquid crystal element in the case where the overdrive in this embodiment is performed. In a similar manner, in FIG. 40B, a dashed line 5103 represents a time change in transmittance of the liquid crystal element in the case where overdrive is not performed, and a solid line 5104 represents a time change in transmittance of the liquid crystal element in the case where the overdrive in this embodiment is performed. Note that a difference between the desired transmittance $T_i$ and the actual transmittance at the end of the retention period $F_i$ is referred to as an error $\alpha_i$.

It is assumed that, in the graph illustrated in FIG. 40A, both the dashed line 5101 and the solid line 5102 represent the case where desired voltage $V_0$ is applied in a retention period $F_0$; and in the graph illustrated in FIG. 40B, both the dashed line 5103 and the solid line 5104 represent the case where desired transmittance $T_0$ is obtained. In the case where overdriving is not performed, desired voltage $V_1$ is applied at the beginning of a retention period $F_1$ as shown by the dashed line 5101. As has been described above, a period for signal writing is much shorter than a retention period, and the liquid crystal element is in a constant charge state in most of the retention period. Accordingly, voltage applied to the liquid crystal element in the retention period $F_1$ is changed along with a change in transmittance and is greatly different from the desired voltage $V_1$ at the end of the retention period $F_1$. In this case, the dashed line 5103 in the graph of FIG. 40B is greatly different from desired transmittance $T_1$. Accordingly, accurate display of an image signal cannot be performed, so that image quality is decreased. On the other hand, in the case where the overdrive in this embodiment is performed, voltage $V_1'$ which is higher than the desired voltage $V_1$ is applied to the liquid crystal element at the beginning of the retention period $F_1$ as shown by the solid line 5102. That is, the voltage $V_1'$ which is corrected from the desired voltage $V_1$ is applied to the liquid crystal element at the beginning of the retention period $F_1$ so that the voltage applied to the liquid crystal element at the end of the retention period $F_1$ is close to the desired voltage $V_1$ in anticipation of a gradual change in voltage applied to the liquid crystal element in the retention period $F_1$. Thus, the desired voltage $V_1$ can be accurately applied to the liquid crystal element. In this case, as shown by the solid line 5104 in the graph of FIG. 40B, the desired transmittance $T_1$ can be obtained at the end of the retention period $F_1$. In other words, the response of the liquid crystal element within the signal writing cycle can be realized, despite the fact that the liquid crystal element is in a constant charge state in most of the retention period. Then, in a retention period $F_2$, the case where desired voltage $V_2$ is lower than $V_1$ is described. Also in that case, as in the retention period $F_1$, voltage $V_2'$ which is corrected from the desired voltage $V_2$ may be applied to the liquid crystal element at the beginning of the retention period $F_2$ so that the voltage applied to the liquid crystal element at the end of the retention period $F_2$ is close to the desired voltage $V_2$ in anticipation of a gradual change in voltage applied to the liquid crystal element in the retention period $F_2$. Thus, as shown by the solid line 5104 in the graph of FIG. 40B, desired transmittance $T_2$ can be obtained at the end of the retention period $F_2$. Note that in the case where $V_i$ is higher than $V_{i-1}$ as in the retention period $F_1$, the corrected voltage $V_i'$ is preferably corrected so as to be higher than desired voltage $V_i$. Further, when $V_i$ is lower than $V_{i-1}$ as in the retention period $F_2$, the corrected voltage $V_i'$ is preferably corrected so as to be lower than the desired voltage $V_i$. Note that a specific correction value can be derived by measuring response characteristics of the liquid crystal element in advance. As a method of realizing overdrive in a device, a method by which a correction formula is formulated and included in a logic circuit, a method by which a correction value is stored in a memory as a look-up table and is read as necessary, or the like can be used.

Figure 40C:
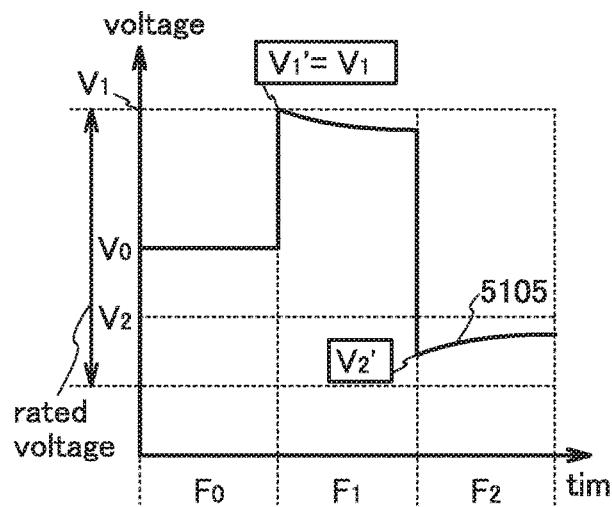
Figure 40D:
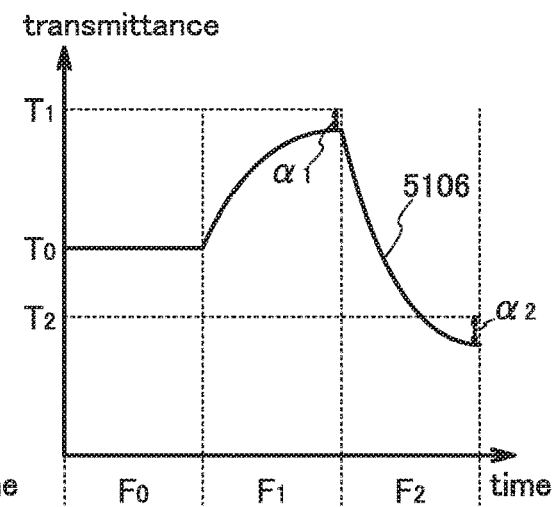
Figure 40E:
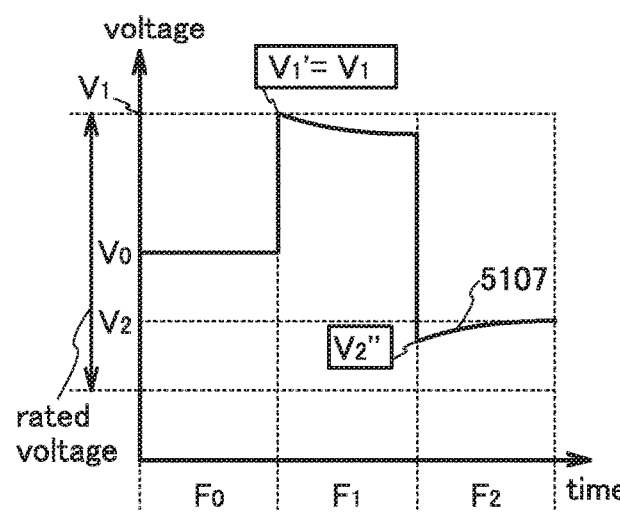
Figure 40F:
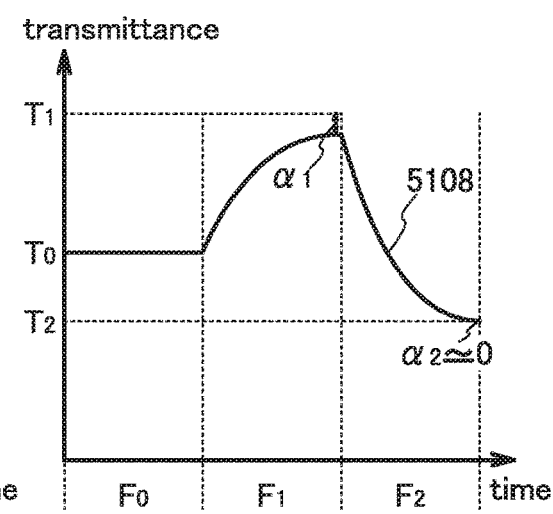

Note that there are several limitations on realization of the overdrive in this embodiment in a device. For example, voltage correction has to be performed in the range of the rated voltage of a source driver. That is, in the case where desired voltage is originally high and ideal correction voltage exceeds the rated voltage of the source driver, not all the correction can be performed. Problems in such a case are described with reference to FIGS. 40C and 40D. As in FIG. 40A, FIG. 40C is a graph in which a time change in voltage in one liquid crystal element is schematically illustrated as a solid line 5105 with the time as the horizontal axis and the voltage as the vertical axis. As in FIG. 40B, FIG. 40D is a graph in which a time change in transmittance of one liquid crystal element is schematically illustrated as a solid line 5106 with the time as the horizontal axis and the transmittance as the vertical axis. Note that since other references are similar to those in FIGS. 40A and 40B, description thereof is omitted. FIGS. 40C and 40D illustrate a state where sufficient correction cannot be performed because the correction voltage $V_1'$ for realizing the desired transmittance $T_1$ in the retention period $F_1$ exceeds the rated voltage of the source driver; thus $V_1'=V_1$ has to be given. In this case, the transmittance at the end of the retention period $F_1$ is deviated from the desired transmittance $T_1$ by the error $\alpha_1$. Note that the error $\alpha_1$ is increased only when the desired voltage is originally high; therefore, a decrease in image quality due to occurrence of the error $\alpha_1$ is in the allowable range in many cases. However, as the error $\alpha_1$ is increased, an error in algorithm for voltage correction is also increased. In other words, in the algorithm for voltage correction, when it is assumed that the desired transmittance is obtained at the end of the retention period, even though the error $\alpha_1$ is increased, voltage correction is performed on the basis that the error $\alpha_1$ is small. Accordingly, the error is included in correction in the following retention period $F_2$; thus, an error $\alpha_2$ is also increased. Further, in the case where the error $\alpha_2$ is increased, the following error $\alpha_3$ is further increased, for example, and the error is increased in a chain reaction manner, which results in a significant decrease in image quality. In the overdrive in this embodiment, in order to prevent increase of errors in such a chain reaction manner, when the correction voltage $V_i'$ exceeds the rated voltage of the source driver in the retention period $F_i$, an error $\alpha_i$ at the end of the retention period $F_i$ is estimated, and the correction voltage in a retention period $F_{i+1}$ can be adjusted in consideration of the amount of the error $\alpha_i$. Thus, even when the error $\alpha_i$ is increased, the effect of the error $\alpha_i$ on the error $\alpha_{i+1}$ can be minimized, so that increase of errors in a chain reaction manner can be prevented. An example where the error $\alpha_2$ is minimized in the overdrive in this embodiment is described with reference to FIGS. 40E and 40F. In a graph of FIG. 40E, a solid line 5107 represents a time change in voltage in the case where the correction voltage $V_2'$ in the graph of FIG. 40C is further adjusted to be correction voltage $V_2''$. A graph of FIG. 40F illustrates a time change in transmittance in the case where voltage is corrected in accordance with the graph of FIG. 40E. The solid line 5106 in the graph of FIG. 40D indicates that excessive correction is caused by the correction voltage $V_2'$. On the other hand, the solid line 5108 in the graph of FIG. 40F indicates that excessive correction is suppressed by the correction voltage $V_2''$ which is adjusted in consideration of the error $\alpha_1$ and the error $\alpha_2$ is minimized. Note that a specific correction value can be derived from measuring response characteristics of the liquid crystal element in advance. As a method of realizing overdrive in a device, a method by which a correction formula is formulated and included in a logic circuit, a method by which a correction value is stored in a memory as a look-up table and read as necessary, or the like can be used. Further, such a method can be added separately from a portion for calculating correction voltage $V_i'$ or can be included in the portion for calculating correction voltage $V_i'$. Note that the amount of correction of correction voltage $V_i''$ which is adjusted in consideration of an error $\alpha_{i-1}$ (a difference with the desired voltage $V_i$) is preferably smaller than that of $V_i'$. That is, $|V_i''-V_i|<|V_i'-V_i|$ is preferable.

Note that the error $\alpha_i$ which is caused because ideal correction voltage exceeds the rated voltage of the source driver is increased as a signal writing cycle becomes shorter. This is because the response time of the liquid crystal element needs to be shorter as the signal writing cycle becomes shorter, so that higher correction voltage is necessary. Further, as a result of an increase in correction voltage needed, the correction voltage exceeds the rated voltage of the source driver more frequently, so that the large error $\alpha_i$ occurs more frequently. Therefore, it can be said that the overdrive in this embodiment becomes more effective as the signal writing cycle becomes shorter. Specifically, the overdrive in this embodiment is significantly effective in the case of performing the following driving methods: a driving method by which one original image is divided into a plurality of subimages and the plurality of subimages are sequentially displayed in one frame period, a driving method by which motion of an image is detected from a plurality of images and an intermediate image of the plurality of images is generated and inserted between the plurality of images (so-called motion compensation frame rate doubling), and a driving method in which such driving methods are combined, for example.

Note that the rated voltage of the source driver has the lower limit in addition to the upper limit described above. An example of the lower limit is the case where voltage which is lower than the voltage 0 cannot be applied. In this case, since ideal correction voltage cannot be applied as in the case of the upper limit described above, the error $\alpha_i$ is increased. However, also in that case, the error $\alpha_i$ at the end of the retention period $F_i$ is estimated, and the correction voltage in the retention period $F_{i+1}$ can be adjusted in consideration of the amount of the error $\alpha_i$ in a manner similar to the above method. Note that in the case where voltage which is lower than the voltage 0 (negative voltage) can be applied as the rated voltage of the source driver, the negative voltage may be applied to the liquid crystal element as correction voltage. Thus, the voltage applied to the liquid crystal element at the end of retention period $F_i$ can be adjusted so as to be close to the desired voltage $V_i$ in anticipation of a change in potential due to a constant charge state.

Note that in order to suppress deterioration of the liquid crystal element, so-called inversion driving by which the polarity of voltage applied to the liquid crystal element is periodically inverted can be performed in combination with the overdrive. That is, the overdrive in this embodiment includes the case where the overdrive is performed at the same time as the inversion driving. For example, in the case where the length of the signal writing cycle is half of that of the input image signal cycle $T_{in}$, when the length of a cycle for inverting polarity is the same or substantially the same as that of the input image signal cycle $T_{in}$, two sets of writing of a positive signal and two sets of writing of a negative signal are alternately performed. The length of the cycle for inverting polarity is made larger than that of the signal writing cycle in this manner, so that the frequency of charge and discharge of a pixel can be reduced. Thus, power consumption can be reduced. Note that when the cycle for inverting polarity is made too long, a defect in which luminance difference due to the difference of polarity is recognized as a flicker occurs in some cases; therefore, it is preferable that the length of the cycle for inverting polarity be substantially the same as or smaller than that of the input image signal cycle $T_{in}$.

Embodiment 10

Next, another structure example and a driving method of a display device are described. In this embodiment, a method is described by which an image for interpolating motion of an image input from the outside of a display device (an input image) is generated inside the display device based on a plurality of input images and the generated image (the generation image) and the input image are sequentially displayed. Note that when an image for interpolating motion of an input image is a generation image, motion of moving images can be made smooth, and a decrease in quality of moving images because of afterimages or the like due to hold driving can be suppressed. Here, moving image interpolation is described below. Ideally, display of moving images is realized by controlling the luminance of each pixel in real time; however, individual control of pixels in real time has problems such as the enormous number of control circuits, space for wirings, and the enormous amount of input image data. Thus, it is difficult to realize the individual control of pixels. Therefore, for display of moving images by a display device, a plurality of still images are sequentially displayed in a certain cycle so that display appears to be moving images. The cycle (in this embodiment, referred to as an input image signal cycle and denoted by $T_{in}$) is standardized, and for example, 1/60 second in NTSC and 1/50 second in PAL. Such a cycle does not cause a problem of moving image display in a CRT, which is an impulsive display device. However, in a hold-type display device, when moving images conforming to these standards are displayed without change, a defect in which display is blurred because of afterimages or the like due to hold driving (hold blur) occurs. Since hold blur is recognized by discrepancy between unconscious motion interpolation due to human eyes tracking and hold-type display, the hold blur can be reduced by making the input image signal cycle shorter than that in conventional standards (by making the control closer to individual control of pixels in real time). However, it is difficult to reduce the length of the input image signal cycle because the standard needs to be changed and the amount of data is increased. However, an image for interpolating motion of an input image is generated inside the display device in response to a standardized input image signal, and display is performed while the generation image interpolates the input image, so that hold blur can be reduced without a change in the standard or an increase in the amount of data. Operation such that an image signal is generated inside the display device in response to an input image signal to interpolate motion of the input image is referred to as moving image interpolation.

Figure 41A:
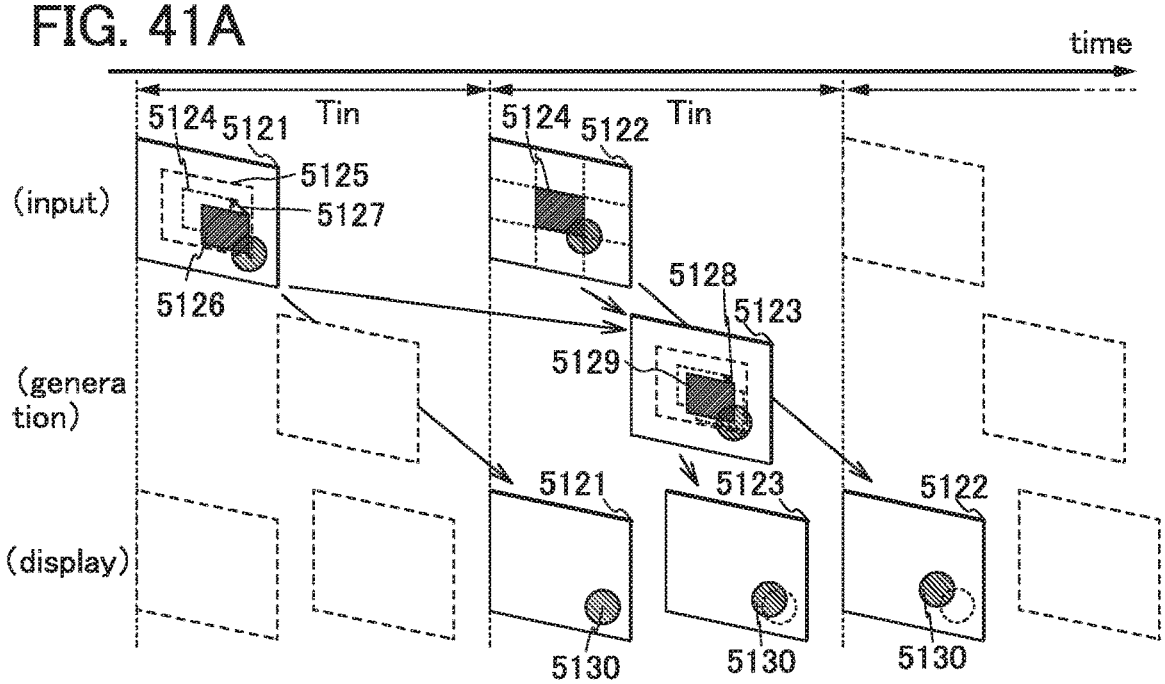
FIGS. 41A to 41C are diagrams showing display screens according to one embodiment of the present invention.
Figure 41B:
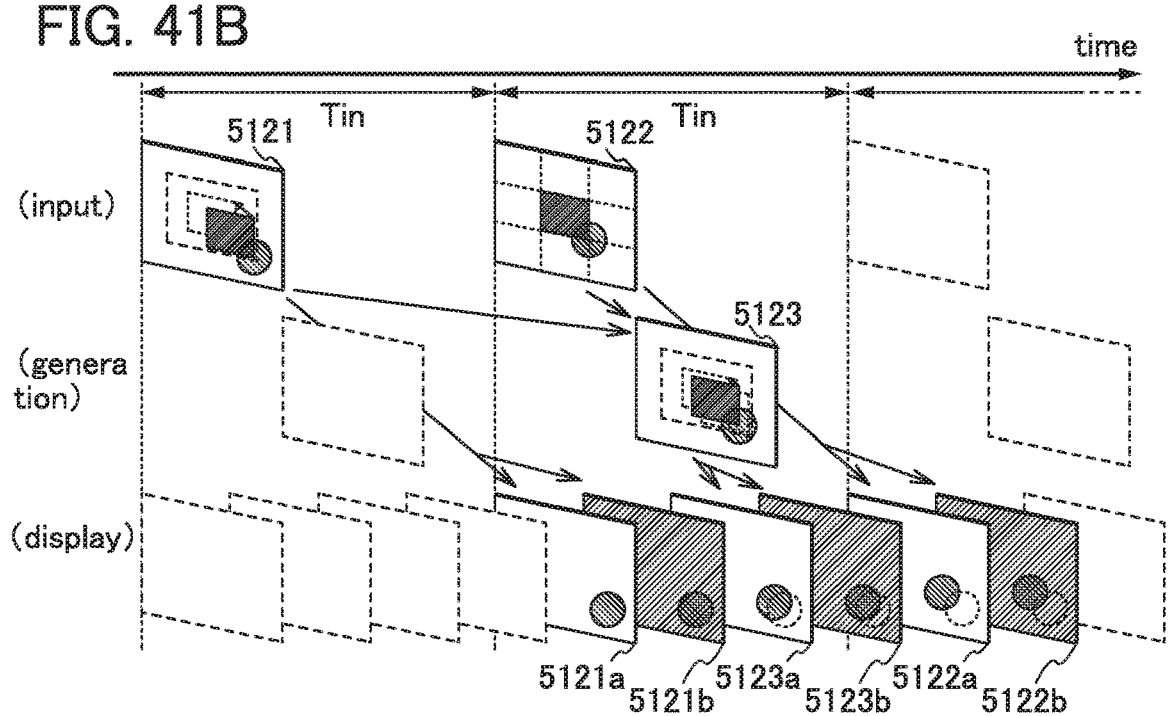

By a method for interpolating moving images in this embodiment, motion blur can be reduced. The method for interpolating moving images in this embodiment can include an image generation method and an image display method. Further, by using a different image generation method and/or a different image display method for motion with a specific pattern, motion blur can be effectively reduced. FIGS. 41A and 41B are schematic diagrams each illustrating an example of a method for interpolating moving images in this embodiment. FIGS. 41A and 41B each illustrate timing of treating each image by using the position of the horizontal direction, with the time as the horizontal axis. A portion represented as "input" indicates timing at which an input image signal is input. Here, images 5121 and 5122 are focused as two images that are temporally adjacent. An input image is input at an interval of the cycle $T_{in}$. Note that the length of one cycle $T_{in}$ is referred to as one frame or one frame period in some cases. A portion represented as "generation" indicates timing at which a new image is generated from an input image signal. Here, an image 5123 which is a generation image generated based on the images 5121 and 5122 is focused. A portion represented as "display" indicates timing at which an image is displayed in the display device. Note that images other than the focused images are only represented by dashed lines, and by treating such images in a manner similar to that of the focused images, the example of the method for interpolating moving images in this embodiment can be realized.

In the example of the method for interpolating moving images in this embodiment, as illustrated in FIG. 41A, a generation image which is generated based on two input images that are temporally adjacent is displayed in a period after one image is displayed until the other image is displayed, so that moving image interpolation can be performed. In this case, a display cycle of a display image is preferably half of an input cycle of the input image. Note that the display cycle is not limited to this and can be a variety of display cycles. For example, in the case where the length of the display cycle is shorter than half of that of the input cycle, moving images can be displayed more smoothly. Alternatively, in the case where the length of the display cycle is longer than half of that of the input cycle, power consumption can be reduced. Note that here, an image is generated based on two input images which are temporally adjacent; however, the number of input images serving as a basis is not limited to two and can be other numbers. For example, when an image is generated based on three (may be more than three) input images which are temporally adjacent, a generation image with higher accuracy can be obtained as compared to the case where an image is generated based on two input images. Note that the display timing of the image 5121 is the same as the input timing of the image 5122, that is, the display timing is one frame later than the input timing. However, display timing in the method for interpolating moving images in this embodiment is not limited to this and can be a variety of display timings. For example, the display timing can be delayed with respect to the input timing by more than one frame. Thus, the display timing of the image 5123 which is the generation image can be delayed, which allows enough time to generate the image 5123 and leads to reduction in power consumption and manufacturing cost. Note that when the display timing is delayed with respect to the input timing for a long time, a period for holding an input image becomes longer, and the memory capacity which is necessary for holding the input image is increased. Therefore, the display timing is preferably delayed with respect to the input timing by approximately one to two frames.

Here, an example of a specific generation method of the image 5123 which is generated based on the images 5121 and 5122 is described. It is necessary to detect motion of an input image in order to interpolate moving images. In this embodiment, a method called a block matching method can be used in order to detect motion of an input image. Note that this embodiment is not limited to this, and a variety of methods (e.g., a method for obtaining a difference of image data or a method of using Fourier transformation) can be used. In the block matching method, first, image data for one input image (here, image data of the image 5121) is stored in a data storage means (e.g., a memory circuit such as a semiconductor memory or a RAM). Then, an image in the next frame (here, the image 5122) is divided into a plurality of regions. Note that the divided regions can have the same rectangular shapes as illustrated in FIG. 41A; however, the divided regions are not limited to them and can have a variety of shapes (e.g., the shape or size varies depending on images). After that, in each divided region, data is compared to the image data in the previous frame (here, the image data of the image 5121), which is stored in the data storage means, so that a region where the image data is similar to each other is searched. The example of FIG. 41A illustrates that the image 5121 is searched for a region where data is similar to that of a region 5124 in the image 5122, and a region 5126 is found. Note that a search range is preferably limited when the image 5121 is searched. In the example of FIG. 41A, a region 5125 which is approximately four times larger than the region 5124 is set as the search range. By making the search range larger than this, detection accuracy can be increased even in a moving image with high-speed motion. Note that search in an excessively wide range needs an enormous amount of time, which makes it difficult to realize detection of motion. Thus, the region 5125 has preferably approximately two to six times larger than the area of the region 5124. After that, a difference of the position between the searched region 5126 and the region 5124 in the image 5122 is obtained as a motion vector 5127. The motion vector 5127 represents motion of image data in the region 5124 in one frame period. Then, in order to generate an image illustrating the intermediate state of motion, an image generation vector 5128 obtained by changing the size of the motion vector without a change in the direction thereof is generated, and image data included in the region 5126 of the image 5121 is moved in accordance with the image generation vector 5128, so that image data in a region 5129 of the image 5123 is generated. By performing a series of processings on the entire region of the image 5122, the image 5123 can be generated. Then, by sequentially displaying the input image 5121, the generated image 5123, and the input image 5122, moving images can be interpolated. Note that the position of an object 5130 in the image is different (i.e., the object is moved) between the images 5121 and 5122. In the generated image 5123, the object is located at the midpoint between the images 5121 and 5122. By displaying such images, motion of moving images can be made smooth, and blur of moving images due to afterimages or the like can be reduced.

Note that the size of the image generation vector 5128 can be determined in accordance with the display timing of the image 5123. In the example of FIG. 41A, since the display timing of the image 5123 is the midpoint (½) between the display timings of the images 5121 and 5122, the size of the image generation vector 5128 is half of that of the motion vector 5127. Alternatively, for example, when the display timing is ⅓ between the display timings of the images 5121 and 5122, the size of the image generation vector 5128 can be ⅓, and when the display timing is ⅔ between the display timings of the images 5121 and 5122, the size can be ⅔.

Note that in the case where a new image is generated by moving a plurality of regions having different motion vectors in this manner, a portion where one region has already been moved to a region that is a destination for another region or a portion to which any region is not moved is generated in some cases (i.e., overlap or blank occurs in some cases). For such portions, data can be compensated. As a method for compensating an overlap portion, a method by which overlap data is averaged; a method by which data is arranged in order of priority according to the direction of motion vectors or the like, and high-priority data is used as data in a generation image; or a method by which one of color and brightness is arranged in order of priority and the other thereof is averaged can be used, for example. As a method for compensating a blank portion, a method by which image data of the portion of the image 5121 or the image 5122 is used as data in a generation image without modification, a method by which image data of the portion of the image 5121 or the image 5122 is averaged, or the like can be used. Then, the generated image 5123 is displayed in accordance with the size of the image generation vector 5128, so that motion of moving images can be made smooth, and the decrease in quality of moving images because of afterimages or the like due to hold driving can be suppressed.

In another example of the method for interpolating moving images in this embodiment, as illustrated in FIG. 41B, when a generation image which is generated based on two input images which are temporally adjacent is displayed in a period after one image is displayed until the other image is displayed, each display image is divided into a plurality of subimages to be displayed. Thus, moving images can be interpolated. This case can have advantages of displaying a dark image at regular intervals (advantages when a display method is made closer to impulsive display) in addition to advantages of a shorter image display cycle. That is, blur of moving images due to afterimages or the like can be further reduced as compared to the case where the length of the image display cycle is just made to half of that of the image input cycle. In the example of FIG. 41B, "input" and "generation" can be similar to the processings in the example of FIG. 41A; therefore, description thereof is omitted. For "display" in the example of FIG. 41B, one input image and/or one generation image can be divided into a plurality of subimages to be displayed. Specifically, as illustrated in FIG. 41B, the image 5121 is divided into subimages 5121a and 5121b and the subimages 5121a and 5121b are sequentially displayed so as to make human eyes perceive that the image 5121 is displayed; the image 5123 is divided into subimages 5123a and 5123b and the subimages 5123a and 5123b are sequentially displayed so as to make human eyes perceive that the image 5123 is displayed; and the image 5122 is divided into subimages 5122a and 5122b and the subimages 5122a and 5122b are sequentially displayed so as to make human eyes perceive that the image 5122 is displayed. That is, the display method can be made closer to impulsive display while the image perceived by human eyes is similar to that in the example of FIG. 41A, so that blur of moving images due to afterimages or the like can be further reduced. Note that the number of division of subimages is two in FIG. 41B; however, the number of division of subimages is not limited to this and can be other numbers. Note that subimages are displayed at regular intervals (½) in FIG. 41B; however, timing of displaying subimages is not limited to this and can be a variety of timings. For example, when timing of displaying dark subimages 5121b, 5122b, and 5123b is made earlier (specifically, timing at ¼ to ½), the display method can be made much closer to impulsive display, so that blur of moving images due to afterimages or the like can be further reduced. Alternatively, when the timing of displaying dark subimages is delayed (specifically, timing at ½ to ¾), the length of a period for displaying a bright image can be increased, so that display efficiency can be increased and power consumption can be reduced.

Figure 41C:
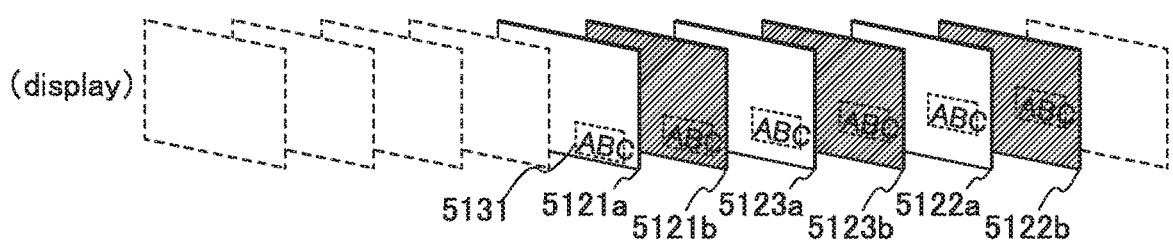

Another example of the method for interpolating moving images in this embodiment is an example in which the shape of an object which is moved in an image is detected and different processings are performed depending on the shape of the moving object. FIG. 41C illustrates display timing as in the example of FIG. 41B and the case where moving characters (also referred to as scrolling texts, subtitles, captions, or the like) are displayed. Note that since terms "input" and "generation" may be similar to those in FIG. 41B, they are not illustrated in FIG. 41C. The amount of blur of moving images by hold driving varies depending on properties of a moving object in some cases. In particular, blur is recognized remarkably when characters are moved in many cases. This is because eyes track moving characters to read the characters, so that hold blur easily occur. Further, since characters have clear outlines in many cases, blur due to hold blur is further emphasized in some cases. That is, determining whether an object which is moved in an image is a character and performing special processing when the object is the character are effective in reducing hold blur. Specifically, when edge detection, pattern detection, and/or the like are/is performed on an object which is moved in an image and the object is determined to be a character, motion compensation is performed even on subimages generated by division of one image so that an intermediate state of motion is displayed. Thus, motion can be made smooth. In the case where the object is determined not to be a character, when subimages are generated by division of one image as illustrated in FIG. 41B, the subimages can be displayed without a change in the position of the moving object. The example of FIG. 41C illustrates the case where a region 5131 determined to be characters is moved upward, and the position of the region 5131 is different between the subimages 5121*a* and 5121*b*. In a similar manner, the position of the region 5131 is different between the subimages 5123*a* and 5123*b*, and between the subimages 5122*a* and 5122*b*. Thus, motion of characters for which hold blur is particularly easily recognized can be made smoother than that by normal motion compensation frame rate doubling, so that blur of moving images due to afterimages or the like can be further reduced.

This application is based on Japanese Patent Application serial no. 2009-051899 filed with Japan Patent Office on Mar. 5, 2009, the entire contents of which are hereby incorporated by reference.

What is claimed is:
1. A semiconductor device comprising:
a pixel portion over a substrate;
a driver circuit portion over the substrate;
the pixel portion comprising:
    a first semiconductor layer comprising a channel formation region;
    a first electrode electrically connected to the first semiconductor layer;
    a first insulating film over the first semiconductor layer and the first electrode;
    a second electrode overlapping with the channel formation region with the first insulating film interposed therebetween;
    a second insulating film over the second electrode;
    a third electrode over and in contact with the second insulating film, the third electrode having a region overlapping with the channel formation region with the second electrode interposed therebetween; and
    a fourth electrode over and in contact with the second insulating film, the fourth electrode having the same material as the third electrode,
    wherein the second electrode has a region overlapped with the fourth electrode,
    wherein the third electrode is in contact with the first electrode through an opening provided in the first insulating film and the second insulating film,
    wherein the opening does not overlap with the first semiconductor layer,
    wherein each of the second electrode and the third electrode has a light-transmitting property, and
the driver circuit portion comprising:
    a second semiconductor layer comprising a channel formation region;
    the first insulating film over the second semiconductor layer;
    a fifth electrode over the first insulating film; and
    a sixth electrode in contact with the fifth electrode,
    wherein the fifth electrode has a light-transmitting property, and
    wherein the sixth electrode has a light-blocking property.

2. A semiconductor device comprising:
a pixel portion over a substrate;
a driver circuit portion over the substrate;
the pixel portion comprising:
    a first semiconductor layer comprising a channel formation region;
    a first electrode electrically connected to the first semiconductor layer;
    a first insulating film over the first semiconductor layer and the first electrode;
    a second electrode overlapping with the channel formation region with the first insulating film interposed therebetween;
    a second insulating film over the second electrode;
    a third electrode over and in contact with the second insulating film, the third electrode having a region overlapping with the entire channel formation region with the second electrode interposed therebetween; and
    a fourth electrode over and in contact with the second insulating film, the fourth electrode having the same material as the third electrode,
    wherein the second electrode has a region overlapped with the fourth electrode,
    wherein the third electrode is in contact with the first electrode through an opening provided in the first insulating film and the second insulating film,
    wherein the opening does not overlap with the first semiconductor layer,
    wherein each of the second electrode and the third electrode has a light-transmitting property, and
the driver circuit portion comprising:
    a second semiconductor layer comprising a channel formation region;
    the first insulating film over the second semiconductor layer;
    a fifth electrode over the first insulating film; and
    a sixth electrode in contact with the fifth electrode,
    wherein the fifth electrode has a light-transmitting property, and
    wherein the sixth electrode has a light-blocking property.

* * * * *